US011456703B2

(12) United States Patent
Schober et al.

(10) Patent No.: US 11,456,703 B2
(45) Date of Patent: *Sep. 27, 2022

(54) COMPLEMENTARY CURRENT FIELD-EFFECT TRANSISTOR DEVICES AND AMPLIFIERS

(71) Applicant: Circuit Seed, LLC, Newport Beach, CA (US)

(72) Inventors: Robert C. Schober, Huntington Beach, CA (US); Susan Marya Schober, Newport Beach, CA (US)

(73) Assignee: Circuit Seed, LLC, Newport Beach, CA (US)

( * ) Notice: Subject to any disclaimer, the term of this patent is extended or adjusted under 35 U.S.C. 154(b) by 92 days.

This patent is subject to a terminal disclaimer.

(21) Appl. No.: 16/916,956

(22) Filed: Jun. 30, 2020

(65) Prior Publication Data

US 2020/0336104 A1    Oct. 22, 2020

Related U.S. Application Data

(60) Continuation of application No. 16/752,454, filed on Jan. 24, 2020, now Pat. No. 10,840,854, which is a
(Continued)

(51) Int. Cl.
*H03F 1/22* (2006.01)
*H03F 1/02* (2006.01)
(Continued)

(52) U.S. Cl.
CPC ......... *H03F 1/0205* (2013.01); *H01L 27/092* (2013.01); *H01L 29/423* (2013.01);
(Continued)

(58) Field of Classification Search
CPC ....................................................... H03F 1/22
(Continued)

(56) References Cited

U.S. PATENT DOCUMENTS 3,887,878 A    6/1975  Schade, Jr.
3,986,134 A   10/1976  Yokoyama
(Continued)

FOREIGN PATENT DOCUMENTS

CN    101142686    3/2008
CN    102265403   11/2011
(Continued)

OTHER PUBLICATIONS

Razavi, B., Design of Analog CMOS Integrated Circuits, 2001, McGraw-Hill Higher Education, New York, NY.
(Continued)

*Primary Examiner* — Henry Choe
(74) *Attorney, Agent, or Firm* — Lee & Hayes, P.C.

(57) ABSTRACT

The present invention relates to a novel and inventive compound device structure, enabling a charge-based approach that takes advantage of sub-threshold operation, for designing analog CMOS circuits. In particular, the present invention relates to a solid state device based on a complementary pair of n-type and p-type current field-effect transistors, each of which has two control ports, namely a low impedance port and gate control port, while a conventional solid state device has one control port, namely gate control port. This novel solid state device provides various improvement over the conventional devices.

5 Claims, 41 Drawing Sheets

Related U.S. Application Data continuation of application No. 16/146,161, filed on Sep. 28, 2018, now Pat. No. 10,554,174, which is a division of application No. 15/748,305, filed as application No. PCT/US2015/042696 on Jul. 29, 2015, now Pat. No. 10,211,781.

(51) Int. Cl.

| | | |
|---|---|---|
| *H01L 29/423* | (2006.01) | |
| *H03K 19/0185* | (2006.01) | |
| *H01L 27/092* | (2006.01) | |
| *H01L 29/78* | (2006.01) | |
| *H03K 19/0948* | (2006.01) | |
| *H03K 19/094* | (2006.01) | |
| *H03F 3/16* | (2006.01) | |
| *H01L 21/8238* | (2006.01) | |

(52) U.S. Cl.
CPC .......... *H01L 29/4238* (2013.01); *H01L 29/78* (2013.01); *H03F 3/16* (2013.01); *H03K 19/018564* (2013.01); *H03K 19/018571* (2013.01); *H03K 19/094* (2013.01); *H03K 19/0948* (2013.01); *H01L 21/823814* (2013.01); *H03F 2200/129* (2013.01); *H03F 2200/72* (2013.01)

(58) Field of Classification Search
USPC ................................................ 330/311, 310
See application file for complete search history.

(56) References Cited

U.S. PATENT DOCUMENTS

| | | | |
|---|---|---|---|
| 4,100,502 | A | 7/1978 | Yamashiro |
| 4,247,859 | A | 1/1981 | Rai-Choudhury et al. |
| 4,282,477 | A | 8/1981 | Ahmed |
| 4,309,665 | A | 1/1982 | Yamashiro |
| 4,607,274 | A | 8/1986 | Yoshitake |
| 4,910,709 | A | 3/1990 | Dhong et al. |
| 4,927,779 | A | 5/1990 | Dhong et al. |
| 5,041,894 | A | 8/1991 | Reczek et al. |
| 5,336,937 | A | 8/1994 | Sridhar et al. |
| 5,349,311 | A | 9/1994 | Mentzer |
| 5,528,056 | A | 6/1996 | Shimada et al. |
| 6,040,610 | A | 3/2000 | Noguchi et al. |
| 6,046,638 | A | 4/2000 | Hogeboom |
| 6,081,218 | A | 6/2000 | Ju et al. |
| 6,441,663 | B1 | 8/2002 | Chuang et al. |
| 6,784,824 | B1 | 8/2004 | Quinn |
| 6,933,750 | B2 | 8/2005 | Takahashi et al. |
| 7,057,302 | B2 | 6/2006 | Matsuzawa et al. |
| 7,554,409 | B1 | 6/2009 | Zhang et al. |
| 2002/0016030 | A1 | 2/2002 | Misewich et al. |
| 2003/0049892 | A1 | 3/2003 | Yamaguchi et al. |
| 2003/0210097 | A1 | 11/2003 | Wilson et al. |
| 2003/0214361 | A1 | 11/2003 | Nishikido |
| 2004/0102170 | A1 | 5/2004 | Jensen et al. |
| 2005/0168242 | A1 | 8/2005 | Won |
| 2005/0218299 | A1 | 10/2005 | Olsen et al. |
| 2006/0001413 | A1 | 1/2006 | Marinca |
| 2006/0065927 | A1 | 3/2006 | Thean et al. |
| 2006/0139195 | A1 | 6/2006 | Casper et al. |
| 2007/0046369 | A1 | 3/2007 | Schober et al. |
| 2007/0085593 | A1 | 4/2007 | Wich et al. |
| 2007/0098041 | A1 | 5/2007 | Seo |
| 2008/0258959 | A1 | 10/2008 | Trifonov et al. |
| 2009/0160487 | A1 | 6/2009 | Hu et al. |
| 2009/0311837 | A1 | 12/2009 | Kapoor |
| 2011/0309888 | A1 | 12/2011 | Bulzacchelli et al. |
| 2012/0097965 | A1 | 4/2012 | Shin et al. |
| 2012/0098579 | A1 | 4/2012 | Schober et al. |
| 2013/0027107 | A1 | 1/2013 | Nohara |
| 2013/0177175 | A1 | 7/2013 | Ting |
| 2013/0287071 | A1 | 10/2013 | Chen et al. |
| 2014/0062550 | A1 | 3/2014 | Lee et al. |
| 2014/0111181 | A1 | 4/2014 | Nagayama et al. |
| 2014/0132435 | A1 | 5/2014 | Dempsey |
| 2014/0159168 | A1 | 6/2014 | Toh et al. |
| 2015/0030102 | A1 | 1/2015 | Hormis et al. |
| 2015/0070091 | A1 | 3/2015 | Schober et al. |
| 2015/0213873 | A1 | 7/2015 | Joo et al. |
| 2017/0040941 | A1 | 2/2017 | Chatwin |
| 2018/0219514 | A1 | 8/2018 | Schober et al. |
| 2018/0219519 | A1 | 8/2018 | Schober et al. |
| 2018/0224878 | A1 | 8/2018 | Schober et al. |
| 2018/0226930 | A1 | 8/2018 | Schober et al. |
| 2018/0308843 | A1 | 10/2018 | Schober et al. |
| 2019/0123688 | A1 | 4/2019 | Schober et al. |
| 2019/0252382 | A1 | 8/2019 | Schober et al. |
| 2019/0334491 | A1 | 10/2019 | Schober et al. |
| 2020/0014349 | A1 | 1/2020 | Schober et al. |
| 2020/0027880 | A1 | 1/2020 | Schober et al. |
| 2020/0042030 | A1 | 2/2020 | Schober et al. |
| 2020/0177193 | A1 | 6/2020 | Schober et al. |
| 2020/0186091 | A1 | 6/2020 | Schober et al. |

FOREIGN PATENT DOCUMENTS

| | | |
|---|---|---|
| CN | 104465657 | 3/2015 |
| EP | 1079294 | 9/2004 |
| JP | 2014063929 | 4/2014 |
| KR | 20050010004 | 1/2005 |
| KR | 20120003467 | 1/2012 |
| KR | 1020120043522 | 5/2012 |
| WO | WO9534913 | 12/1995 |
| WO | WO03/098693 | 11/2003 |
| WO | WO2007014053 | 2/2007 |
| WO | WO2007081634 | 7/2007 |
| WO | WO2010/110894 | 9/2010 |

OTHER PUBLICATIONS

Razavi, B., Fundamentals of Microelectronics, Wiley, 2006.
Rossi, et al., "PTAT Voltage Generator Based on an MOS Voltage Divider", 2007, Institute de Ing. Electrica, Universidad de la Republica, Montevideo, Uruguay, 4 pages.
Rossi, et al., "Ultra-low Power CMOS Cells for Temperature Sensors", SBCCI '05, Sep. 4-7, 2005, pp. 202-206.
Rossi-Aicardi, et al., "A MOSFET-only Voltage Source with Arbitrary Sign Adjustable Temperature Coefficient", IEEE 2011, pp. 366-369.
Saxena, et al., "Compensation of CMOS Op-amps Using Split-Length Transistors", IEEE 2008, pp. 109-112.
Saxena, et al., "Indirect Compensation Technique for Low-Voltage CMOS Op-amps", Jan. 18, 2016, 4 pages.
Saxena, et al., "Indirect Feedback Compensation of CMOS Op-Amps", 2006 IEEE Workshop on Microelectronics and Electron Devices, 2 pages.
Saxena, et al., "Systematic Design of Three-Stage Op-amps Using Split-Length Compensation", 2011, IEEE 54th International Midwest Symposium on Circuits and Systems (MWSCAS), pp. 1-4.
Saxena, Vishal, "Indirect Feedback Compensation Techniques for Mulit-Stage Operational Amplifiers", A Thesis submitted Oct. 2007, Boise State University, 209 pages.
Schmitt, Otto H., "A Simple Differential Amplifier", R.S.I., vol. 8, Apr. 1937, pp. 126-127.
Schmitt, Otto H., "A Thermionic Trigger", Journal of Scientific Instrumens, 1937, 3 pages.
Shinde, S.V., "PVT Insensitive Reference Current Generation", Proceedings of the International MultiConference of Engineers and Computer Scientists 2014, vol. II, Mar. 12-14, 2014, 5 pages.
Sugawara, et al., 350 V Carrier Injection Field Effect Transistor (CIFET) with Very Low On-Resistance and High Switching Speed, Proceedings of the 7th International Symposium on Power Semiconductor Devices and IC's, May 23, 1995, 5 pages.
Sun, et al., "A Low-Power Low-Voltage Bandgap Reference in CMOS", CCECE 2010 Canadian Conference, 5 pages.

(56) References Cited

OTHER PUBLICATIONS

Tzanateas et al., "A CMOS Bandgap Voltage Reference", IEEE Journal of SolidD-State Circuits, vol. SC-14, No. 3, Jun. 1979, pp. 655-657.
Vittoz, et al., "A Low-Voltage CMOS Bandgap Reference", IEEE Journal of Solid-State Circuits, Vovl. SC-14, No. 3, Jun. 1979, pp. 573-577.
Vittoz, et al., "CMOS Analog Integrated Circuits Based on Weak Inversion Operation", IEEE Journal of Solid-State Circuits, Jun. 1977, vol. SC-12, No. 3, pp. 224-231.
Yang, et al., "All-CMOS Subbandgap Reference Circuit Operating at Low Supply Voltage", IEEE 2011, pp. 893-896.
Zhang, Z., "CMOS Radio Frequency Integrated Circuit Design for Direct Conversion Receivers", A thesis submitted to the Hong Kong University of Science and Technology, Sep. 2001, 155 pages.
Office Action and English Translation thereof dated Jul. 27, 2020 in related KR Appln. No. 10-2018-7005438, 10 pages.
Aguirre, et al., "Temperature Controlled Measurement System for Precise Characterization of Electronic Circuits and Devices", IEEE Instrumentation and Measurement, 2014, 4 pages.
Ajit et al., "The Minority Carrier Injection Controlled field-Effect Transistor (MICFET): A New MOS-Gate Power Transistor Sturcture", IEEE Transactions on Electron Devices, vol. 39, No. 8, Aug. 1992, 7 pages.
Amaravati, et al., "800-nA Process-and-Voltage-Invariant 106-dB PSRR PTAT Current Reference", IEEE Transactions on Circuits and Systems-II: Express Briefs, Sep. 2013, 60(9), pp. 577-581.
Anusandhana Journal of Science, Engineering and Management, vol. 1, Issue 2, Dec. 2012, 78 pages.
Baghini, et al., "A Sub-1V 32nA Process, Voltage and Temperature Invariant Voltage Reference Circuit", 2013 26th International Conference on VLSI Design and the 12th International Conference on Embedded Systems, 2013, pp. 136-141.
Baker et al., "High Speed Op-amp Design: Compensation and Topologies for Tow and three Stage Designs", Jul. 1, 2007, retrieved Jun. 6, 2006 from <<http://cmosedu.com/jbaker/papers/talks/Multistage_Opamp_Presentation.pdf>>, 58 pages.
Baker, et al., "High Speed Op-amp Design: Compensation and Topologies for Two and Three Stage Designs", IEEE Solid-State Circuits Society, Apr. 9-10, 2015, 58 pages.
Baker, R. Jacob, "CMOS—Circuit Design, Layout, and Simulation, Third Edition", IEEE Press, 2010.
Bendali, et al., "A 1-V CMOS Current Reference With Temperature and Process Compensation", IEEE Transactions on Circuits and Systems-I: Regular Papers, vol. 54, No. 7, Jul. 2007, pp. 1424-1429.
Christoffersen, et al., "An Ultra-Low Power CMOS PTAT Current Source", IEEE-EMATA 2010, pp. 35-40.
Office Action from related Chinese Application No. 201580083441.5 dated Apr. 26, 2019, 6 pages.
Dai, et al., "Threshold Voltage Based CMOS Voltage Reference", IEE Proceedings Circuits Devices Systems, vol. 151, No. 1, Feb. 2004, pp. 58-62.
De Vita, et al., "A 300 nW, 12 ppm/C Voltage Reference in a Digital 0.35 um CMOS Process", 2006 Symposium on VLSI Circuits Digest of Technical Papers, IEEE 2006, 3 pages.
The Extended European Search Report dated Jun. 28, 2019 for European Patent Application No. 15899854.2, 7 pages.
Galeano et al., "A Very Low Power Area Efficient CMOS Only Bandgap Reference", IEEE 2012, 6 pages.
Gray, et al., "Analysis and Design of Analog Integrated Circuits", John Wiley & Sons, Inc., 2009.
Haft-Baradaran, Afshin, "Basic and Advanced Current References", University of Toronto, 2001, 16 pages.
Hirose, et al., "A CMOS Bandgap and Sub-Bandgap Voltage Reference Circuits for Nanowatt Power LSIs", IEEE Asian Solid-State Circuits Conference, Nov. 8-10, 2010, 4 pages.
Horowitz, et al., "The Art of Electronics—2nd Edition", Cambridge University Press, 1989, 1041 pages.

Huang, et al., "A 1V 16.9ppm/C 250nA Switched-Capacitor CMOS Voltage Reference", 2008, IEEE International Solid-State Circuits Conference, 4 pages.
Huang, et al., "Piecewise Linear Curvature-Compensated CMOS Bandgap Reference", IEEE, 2008, pp. 308-311.
Huffenus, et al., "A High PSRR Class-D Audio Amplifier IC Based on a Self-Adjusting Voltage Reference", European Solid State Circuits Conference, 2010, pp. 4.
PCT Search Report and Written Opinion dated Oct. 23, 2015 for PCT Applicatoin No. PCT/US2015/42696, 12 pages.
International Search Report and Written Opinion from PCT/US2016/044770, dated Nov. 10, 2016, 13 pages.
International Search Report and Written Opinion from PCT/US2016/044787, dated Nov. 8, 2016, 14 pages.
International Search Report and Written Opinion from PCT/US2016/044792, dated Oct. 20, 2016, 11 pages.
International Search Report and Written Opinion from PCT/US2016/044800 dated Mar. 13, 2017, 8 pages.
PCT Search Report and Written Opinion dated May 13, 2016 for PCT Application No. PCT/US2016/14639, 11 pages.
The PCT Search Report and Written Opinion dated Apr. 3, 2017 for PCT application No. PCT/US2016/67529, 14 pages.
Ivanov, et al., "An Ultra Low Power Bandgap Operational at Supply From 0.75 V", IEEE Journal of Solid-State Circuits, vol. 47, No. 7, Jul. 2012, pp. 1515-1523.
Le, et al., "A Design of Three-Stage CMOS Opamp Using Indirect Feedback Compensation Technique", The Solid-State Systems Symposium & VLSI and Related Technology, 4S, Aug. 2012, pp. 153-156.
Lee, et al., "A Wideband CMOS Variable Gain Amplifier With an Exponential Gain Control", IEEE Transactions on Microwave Theory and Techniques, vol. 55, No. 6, Jun. 2007, pp. 1363-1373.
Mattia, et al., "2.3 ppm/C 40 nW MOSFET-Only Voltage Reference", ISLPED' 14, Aug. 11-13, 2014, 7 pages.
Meijer, et al., "Temperature Sensors and Voltage References Implemented in CMOS Technology", IEEE Sensors Journal, vol. 1, No. 3, Oct. 2001, pp. 225-234.
Millemon Sr., B.A.., "CMOS Characterization, Modeling, and Circuit Design in the Presence of Random Local Variation", A Thesis submitted Aug. 2012, Boise State University, 88 pages.
Mok, et al., "Design Considerations of Recent Advanced Low-Voltage Low-Temperature-Coefficient CMOS Bandgap Voltage Reference", CICC, Oct. 2004, 8 pages.
Final Office Action dated Mar. 6, 2019 for U.S. Appl. No. 15/545,200 "Phase Frequency Detector and Accurate Low Jitter High Frequency Wide-Band Phase Lock Loop" Schober, 8 pages.
Office Action for U.S. Appl. No. 15/545,200, dated Oct. 1, 2018, Schober et al, "Phase Frequency Detector and Accurate Low Jitter High Frequency Wide-Band Phase Lock Loop", 6 pages.
Office Action for U.S. Appl. No. 15/748,813, dated Oct. 18, 2018, Schober et al., Low Noise Trans-Impedance Amplifiers Based on Complementary Current Field-Effect Transistor Devices, 14 pages.
Non Final Office Action dated Apr. 16, 2020 for U.S. Appl. No. 16/586,090 "Super-Saturation Current Field Effect Transistor and Trans-Impedance MOS Device" Schober, 13 pages.
Non Final Office Action dated May 18, 2020 for U.S. Appl. No. 16/752,454 "Complementary Current Field-Effect Transistor Devices and Amplifiers" Schober, 4 pages.
Office Action for U.S. Appl. No. 16/146,161, dated Aug. 12, 2019, Schober, "Complementary Current Field-Effect Transistor Devices and Amplifiers", 4 pages.
Osaki, et al., "1.2-V Supply, 100-nW, 1.09-V Bandgap and 0.7-V Supply, 52.5-nW, 0.55-V Subbandgap Reference Circuits for Nanowatt CMOS LSIs", IEEE Journal of Solid-State Circuits, vol. 48, No. 6, Jun. 2013, pp. 1530-1538.
Pain, et al., "Low-power Low-noise Analog Circuits for on-focal-plane Signal Processing of Infrared Sensors", Proceedings of the SPIE, vol. 1946, 1993, 10 pages.
Park, et al., "A 95nW Ring Oscillator-based Temperature Sensor for RFID Tags in 0.13um CMOS", IEEE 2009, pp. 1153-1156.
Paul, et al., "Design of Second-Order Sub-Bandgap Mixed-Mode Voltage Reference Circuit for Low Voltage Applications", Proceedings of the 18th Intl Conference on VLSI Design, 2005, 6 pages.

2-FINGER INVERTER

2-FINGER INVERTER SECTION A-A

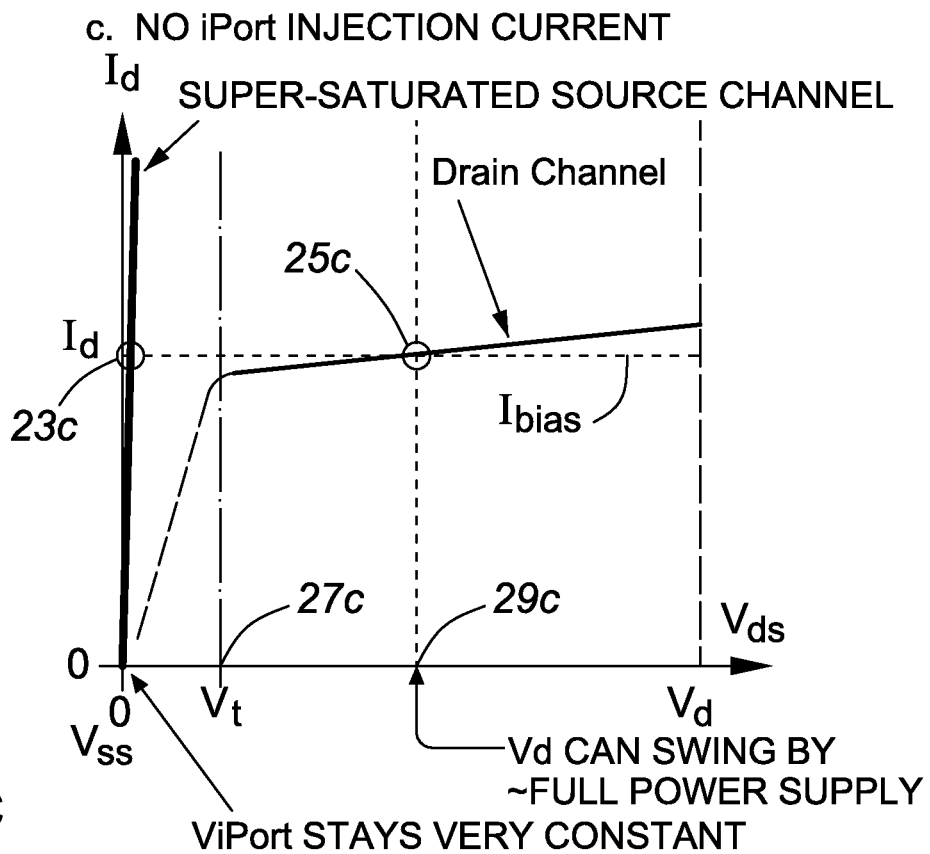

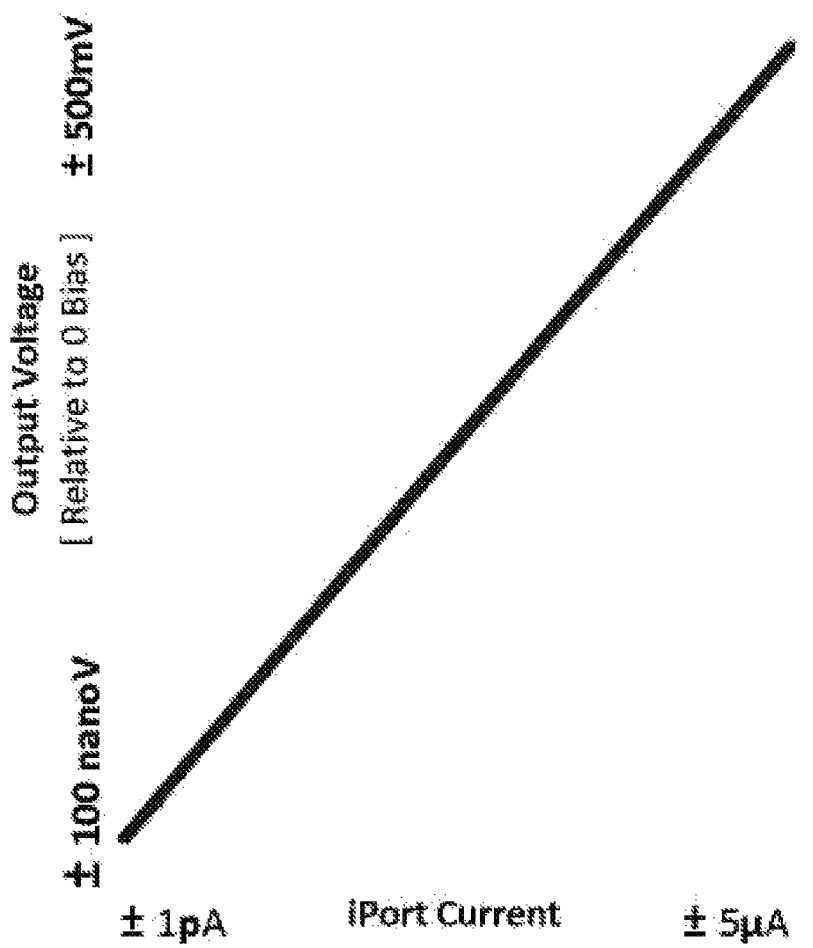
Fig.3h CiFET Transfer Properties ≡ LINEAR Trans-Resistance

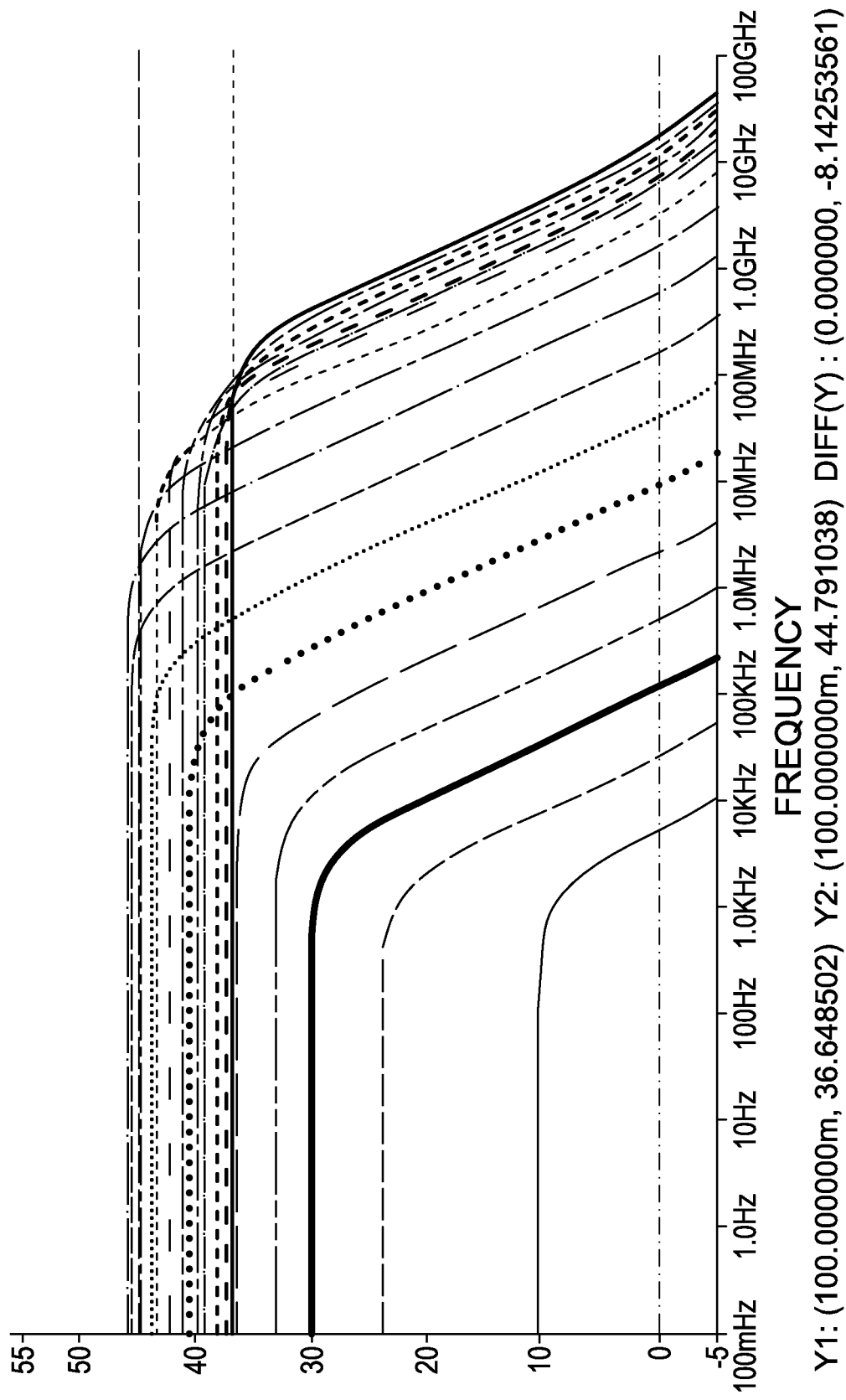

COMPLEMENTARY CURRENT FIELD-EFFECT TRANSISTOR DEVICES AND AMPLIFIERS

CROSS-REFERENCE TO RELATED APPLICATIONS

The present application is a continuation of U.S. patent application Ser. No. 16/752,454, filed on Jan. 24, 2020, entitled "COMPLEMENTARY CURRENT FIELD-EFFECT TRANSISTOR DEVICES AND AMPLIFIERS," which is a continuation of U.S. patent application Ser. No. 16/146,161, filed on Sep. 28, 2018, entitled "COMPLEMENTARY CURRENT FIELD-EFFECT TRANSISTOR DEVICES AND AMPLIFIERS," which is a divisional of U.S. patent application Ser. No. 15/748,305, filed Jan. 29, 2018, entitled "COMPLEMENTARY CURRENT FIELD-EFFECT TRANSISTOR DEVICES AND AMPLIFIERS," which is a 35 U.S.C. § 371 National Stage Entry of, and claims priority to, International Application No. PCT/US2015/042696, filed Jul. 29, 2015, entitled "COMPLEMENTARY CURRENT FIELD-EFFECT TRANSISTOR DEVICES AND AMPLIFIERS," the entire disclosures of which are incorporated herein by reference.

BACKGROUND OF THE INVENTION

Field of the Invention

The present invention relates to a novel and inventive compound device structure, enabling a charge-based approach that takes advantage of sub-threshold operation, for designing analog CMOS circuits.

Description of Related Art

The new millennium brings with it a demand for connectivity that is expanding at an extremely rapid pace. By the end of year 2015, the number of global network connections will exceed two times the world population and it is estimated that in 2020 more than 30 billion devices will be wirelessly connected to the cloud forming the Internet of Things (or "IoT"). Enabling this new era are the revolutionary developments in mobile coutputing and wireless communication that have arisen over the last two decades. Following Moore's Law, development of highly-integrated and cost-effective silicon complementary metal oxide semiconductor (CMOS) devices allowed incorporation of digital and analog system elements, such as bulky Analog-to-Digital converters or transceivers, into a more cost-effective single chip solution.

In the last few years, however, while digital circuits have largely followed the predicted path and benefited from the scaling of CMOS technology into ultra-deep submicron (sub-μm), analog circuits have not been enabled to follow the same trend, and may never be enabled without a paradigm shift in analog design. Analog and radio frequency (or "RF") designers still struggle to discover how to make high-performance integrated circuits (or "ICs") for ultra-deep sub-μm feature sizes without losing the benefits of shrinking size; including reduced power, compact footprint, and higher operational frequencies. Truly a paradigm shift is needed to break through the established science of analog design to meet the system on chip (SoC) demands of the new millennium.

PRIOR ART

The core building block of analog circuits is the amplifier. Discrete component amplifiers are free to use resistors, capacitors, inductors, transformers, and non-linear elements as well as various types of transistors. Unwanted parasitics between various components are normally negligible. However, in order to build amplifiers within an integrated circuit, the normal analog circuit components are not readily available, and often take special IC process extensions to obtain these circuit elements if at all. The parasitics on integrated circuit amplifiers are severe due to their close proximity and being coupled together through the silicon wafer they are integrated into. Moore's law IC process advancements are focused on digital, microprocessor, and memory process development. It takes a generation (~18 months) or two to extend the IC process to incorporate analog components, thus analog functionality is generally not included on the latest process single chip systems. These "mixed-mode" IC processes are less available, vender dependent, and more expensive as well as being highly subject to parametric variation. It takes substantial engineering to include sparse analog functionality on any IC which becomes specific to its IC vender and process node. Because analog circuitry is carefully and specifically designed or arranged for each process node, such analog circuitry is highly non-portable. Eliminating this limitation, analog circuit design engineers are becoming scarce and are slowly retiring without adequate replacements.

Operational Amplifiers (or OpAmps) are the fundamental IC analog gain block necessary to process analog information. OpAmps make use of a very highly matched pair of transistors to form a differential pair of transistors at the voltage inputs. Matching is a parameter that is readily available on an integrated circuit, but to approach the required level of matching, many considerations are used: like centroid layout, multiple large devices, well isolation, and physical layout techniques among many other considerations. Large area matched sets of transistors are also used for current mirrors and load devices. OpAmps require current sources for biasing. OpAmps further require resistor and capacitor (or RC) compensation poles to prevent oscillation. Resistors are essential for the "R" and the value of the RC time constant is relatively precise. Too big value for a resistor would make the amplifier too slow and too small results in oscillation. Constant "bias" currents add to the power consumed. In general, these bias currents want to be larger than the peak currents required during full signal operation.

As IC processes are shrunk, the threshold voltages remain somewhat constant. This is because the metal-oxide-semiconductor (or MOS) threshold cutoff curve does not change with shrinking of the IC processes and the total chip OFF leakage current must be kept small enough to not impact the full-chip power supply leakage. The threshold and saturation voltage tends to take up the entire power supply voltage, not leaving enough room for analog voltage swings. To accommodate this lack of signal swing voltage, OpAmps were given multiple sets of current mirrors, further complicating their design, while consuming more power and using additional physical layout area. This patent introduces amplifier designs that operate even better as power supply voltages are shrunk far below 1 volt.

Prior art CMOS integrated circuit amplifiers are based on several analog or mixed-mode IC process extensions which are not available on all-digital IC processes. Primarily matched pairs of transistors are used as a differential inputs and current mirrors. These analog FET transistors must be long, as depicted in FIG. 1o, to provide the necessary high output resistance, and also must be wide in order to support the necessary current that is mirrored between them. For example, conduction channel 13q which is operable by the gate terminal 17q must have a sufficient length or distance between the source terminal 14q and the drain terminal 19q on the body/substrate 16q. Bias currents, which are normally larger than the peak analog signal currents, must be generated and maintained. Resistors and large area capacitors are normally required to create references and stabilize the amplifiers. Because of parametric sensitivity, these designs are not very portable between IC processes or venders. They are redesigned for each IC process node and are very specifically tailored to their various applications. Due to their bulkiness amplifiers are normally the limiting speed element of an IC system. What is needed is a scalable design that uses logic-only IC processes components, is process parameter tolerant, consumes a small area, uses relatively low power, and operates at voltages significantly below 1 volt. This is the subject of the present invention.

The conventional MOS amplifier gain formation is an input voltage driving a trans-conductance ($g_m$) which converts the input voltage into an output current. This output current then drives an output load which is normally the output of a current source for the purpose of establishing a high load resistance. This high resistance load converts the output current back into an output voltage. The resulting amplifier voltage gain is $g_m*R_{load}$. The equivalent output load resistance is actually the parallel combination of the load current source transistor and the amplifier output transistors. In order to keep this equivalent load resistance high, and the voltage gain high, these parallel transistors must be very long, but to drive enough current, these transistors must be very wide to carry sufficient current also, thus very large transistors are necessary. It also might be noted that the load resistance the amplifier output drives is also an additional parallel resistance that reduces the voltage gain. It should also be noted that a load capacitance interacts with the amplifiers output resistance, modifying the AC performance characteristics. What is actually needed is exactly the opposite of the present analog amplifier operating principles of very small voltage-input to high-impedance current-output ($g_m$); which the present invention is about: very small current-input to low-impedance voltage-output ($r_m$). FIG. 1a is a transistor level schematic diagram of a high-quality MOS IC OpAmp as a baseline reference (Gray, Paul R. et al., "Analysis and Design of Analog Integrated Circuits," 5$^{th}$ edition, John Wiley & Son Ltd, at pg. 484) which is used for comparison in the description of the amplifiers illustrated herein.

The baseline comparisons are (all made in a 180 nm IC process) in the form of performance plots as in: a Bode Gain-Phase plot FIG. 1b, when $V_{dd}$=1.8 Volts and $R_{cmp}$=700 ohms. Wherever possible all the axis scales for each of these three comparison plots are kept the same. A 180 nm process was selected for comparison of all the comparative examples in this specification because conventional prior art amplifiers work best and have had the most usage to mature the analog mixed-mode IC process extensions offered as required for conventional analog. Also as the IC process is shrunk and the power supply voltage is decreased, this is where the implementations of the present invention become highly beneficial.

Normally MOS amplifiers operate within a square-law form due to the strong-inversion MOS transistor square-law characteristics; these are not very well defined or predictably stable to the degree that analog circuits need. Exponential-law operation, like bipolar transistors operation is higher gain, stable, and well defined. At very weak operating conditions, MOS transistors convert to exponential operation, but they are too slow to be of very much use. Furthermore, the "moderate-inversion" transition between these two operating modes provides non-linarites that lower the quality of analog MOS circuits. At the threshold voltage, where MOS transistors operate around, is where 50% of the current is square-law and the other 50% is exponential. This is the definition of threshold voltage in the latest MOS simulation equations. Full exponential MOS operation at high speed would provide higher gain that is predictable, stable, and well defined. This patent is about fast amplifiers that operate in the exponential mode but not in weak-inversion; instead a super-saturated mode is introduced.

To understand the prior art, let's begin with a discussion of weak vs. strong-inversion (Enz, Christian C. et al., "Charge-based MOS Transistor Modeling—The EKV model for low-power and RF IC Design, John Wiley & Son Ltd., 2006). Referring to FIGS. 1e and 1f, weak-inversion is the range where most designers would consider the transistor to be OFF:

Weak conduction channel inversion 13e occurs when the Gate 17e on the body/substrate 16e is operated below its threshold voltage $V_{threshold}$ 17f in FIG. 1f with channel ionization 13e characterized by a thin surface layer;

Source 14e to Drain 19e voltage 19f is small (typically less than 100 mV);

For weak-inversion, the gate G 17e is typically operated by gate voltage supply 12e at a low potential (~300 mV);

This creates a channel surface conduction layer 13e, of uniform depth from source S 14e to drain D 19e;

Since there is essentially zero voltage gradient along the channel 13e (~no electric field), any current between drain D 19e and source S 14e is primarily supported by diffusion;

Increased gate voltage Vgs 12e at the gate G 17e increases the thickness of the conduction layer 13e below the gate 17e, thus allowing more charge to diffuse along the channel 13e;

The conductivity of this surface layer is exponentially related to the gate voltage Vgs 12e at the gate G 17e;

This exponential relationship holds over as many as 6 decades of dynamic analog signal range for the drain channel current;

The channel appears as a moderately high value resistor for its channel current (many 100$^+$s of K-Ohms);

The resulting uniform conduction channel depth promotes higher exponential gain but at a severe speed penalty due to low current density; and This weak-inversion conduction is reflected in a near zero operating point 13f in FIG. 1f.

Strong conduction channel inversion occurs when the gate voltage Vgs 12g at the Gate 17g on the body/substrate 16g is operated above its threshold voltage 17h (referring to FIGS. 1g and 1h) with channel ionization characterized by a graduated conduction channel, deeper near the Source 14g and shallow near at the Drain 19g:

Strong conduction channel inversion 15g and 15h occurs when the Drain 19g to Source 14g voltage 19h is larger than the threshold $V_{threshold}$ 17h in FIG. 1h (typically in excess of 400 mV);

The Gate 17g is operated above its threshold voltage $V_{threshold}$ 17h in FIG. 1h;

In strong-inversion 18g, the Drain 19g voltage is typically operated above the Gate 17g voltage which results in a pinched-off conduction channel 15g near the Drain 19g;

This pinched-off channel at 15g gives rise to high output impedance at the Drain 19g and can be observed as the thick flat part 18h of the operating characteristic plot FIG. 1h;

As the Drain 19g voltage $V_d$ is changed, the pinched-off region 15g changes length, but its thin conduction layer is retained, keeping the output impedance high;

Due to the Gate 17g to channel 15g voltage and the electric field along the conduction channel path (Drain 19g to Source 14g), the conduction channel 15g is forced deeper at the Source 14g and tapers to near pinch-off at the Drain 19g;

The resulting conduction layer behaves with a Square-law response to the gate voltage at the Gate 17g;

In strong-inversion, dynamic range of channel current is limited to about 2 or 3 decades; the channel must drop into weak-inversion for additional dynamic range;

This strong-inversion conduction channel 15g appears as an adjustable current source (high value resistor); and The wedge shape of the conduction channel 15g provides high speed from high current density, but requires the carriers to transit the channel and velocity saturation is reached limiting the speed or cutoff frequency of the transistor; and This is reflected as the operating point 15h in FIG. 1h which is along its bolded line 18h.

FIG. 1e, shows the channel development under weak-inversion conditions. The conduction channel has a relatively even distribution of carriers over its entire length and width. Note that the conduction 13e depth of the entire channel is the same as the pinch-off area 15g on the right channel side (or near the drain 19g) of FIG. 1g. The output drain voltage Vd loaded on the drain D 19e by bias current, $I_{bias}$ Ld19e. This thin conduction layer 13e contributes a significant amount of noise because the channel current travels along the surface where defect traps are concentrated. The Gate 17e to channel voltage $V_g$ in FIG. 1e has a strong (exponential) effect on the density of carriers in this conduction layer 13e.

FIG. 1f shows a plot which has an exponential relationship of drain current $I_d$ to drain voltage $V_{ds}$ using a fixed gate voltage $V_g$. It is to be noted that the drain voltage $V_{ds}$ must be limited to a small value (on the order of 100 mV) in order to stay in weak-inversion.

FIG. 1g shows channel 15g ionization under strong-inversion conditions. In strong-inversion, there is an output drain voltage Vd loaded on the Drain 19g by an output load: $I_{bias}$ Ld19g. This load presents a lower potential difference between Gate 17g and Drain 19g end of the conduction channel 15g than the potential difference between the Gate 17g and Source 14g end of the conduction channel, resulting in a tapered conduction channel 15g. The conduction channel thins down to a minimum as it approaches the drain provide a high output resistance. This output resistance is primarily defined by the thin channel cross-sectional area. As the drain voltage is varied, this thin pinched-off length of the channel changes, but not so much its cross-sectional area. This leads to a high output resistance, in that Drain 19g output resistance variation with drain voltage is relatively small, yielding a high output resistance. This high resistance is required in conventional $g_m$ analog MOS circuit design. In this pinched-off channel region, the carriers approach their velocity saturation, thus limiting their transit time along the channel. This is called "channel length modulation" (the flat part of the channel 15g), resulting in pinch-off near the drain diffusion where the channel reaches a thin layer at 15g. The pinch-off region, where the carriers are forced to the top of the channel, imparts significant noise by means of surface defect carrier traps. The higher the drain voltage $V_d$, the longer the pinch-off region and thus the higher the contributed noise (Rahul, Sarpeshkar, "Ultra Low Power Bioelectronics-Fundamentals, Biomedical Applications, and Bio Inspired Systems", ISBN9780521857277, and Lee, Thomas "The Design of CMOS Radio-Frequency Integrated Circuits", 2nd Ed, Cambridge ISBN-13 978-0521835398), thus is desired to keep this voltage low for low noise contribution to the channel current. Other effects such as velocity saturation and hot electron jumping over to the gate oxide are noted around this thin saturated region, thus it would be highly desirable to minimize this region by lower voltage and semiconductor doping profiles.

FIG. 1h shows a characteristic plot which approaches a "constant current" relationship between drain current $I_d$ and drain voltage $V_{ds}$ with a fixed Gate voltage $V_g$ on the gate G. It is to be noted that the drain voltage $V_{ds}$ spans a much larger range of nearly the power supply voltage $V_{dd}$, while maintaining the same current.

A two-finger CMOS inverter is illustrated in FIGS. 1i, 1j, 1k, 1L, and 1m. A logic inverter possesses several desirable properties:

They exist in all logic IC processes
are the most common and fundamental building block
highly scalable
process parameter drift tolerant
small
high speed
high output drive for varying capacitive loads
arguably the highest gain of a complementary pair of MOS transistors
low power
easily used A basic two finger inverter schematic of the prior art is depicted in FIG. 1i. For example, Vin 10i of the basis two finger inverter 100 is connected to the gate terminals of NFET 101 and PFET 102. The source terminal of NFET 101 is connected to negative power voltage, and the source terminal of PFET 102 is connected to positive power voltage. The drains of NFET 101 and PFET 102 are connected together to form an output 19i. A generic physical layout is illustrated in FIG. 1k in parallel with another inverter schematic diagram in FIG. 1j which has been stretched out and aligned alongside the physical layout to correlate the inverter schematic FIG. 1j to the physical layout structure FIG. 1k. Artistic liberty was used to clearly relate these two figures. Actual physical layout would be in accordance of the design rules and practices of the IC process it is designed for. FIG. 1L is a 3-D sketch of the physical layout. FIG. 1m shows a cross-section view of the physical layout as indicated Section AA in FIG. 1L. The two finger inverter 100 includes a common gate terminal 10j/10k/10m/10n, and output 19j/19k/19m/19n connected to drain terminal D− 11j/11k/11m/11n and D+ 12j/12k/12m/12n. As can be seen in FIGS. 1k to 1m, the drain D− 11k/11m/11n is displaced between the source terminals, S− s13k/s13m/s13n and s15k/s15m/s15n, while the drain D+ 12k/12m/12n is displaced between the source terminals, S+ s16k/s16m/s16n and s14k/s14m/s14n. The pull down transistor channel 13k/13m/13n is in parallel with 15k/15m/15n, while the other pull down transistor channel 14k/14m/14n is in parallel with 16k/16m/16n. The poly transistor control gate 17k/17m/17n is in communication with the gate terminal 10k/10m/10n. Drain diffusions 12n are shown in FIG. 1m. The charge distribution in the drain channels 13n, 15n, 14n, and 16n are shown in FIG. 1m. This charge distribution is illustrated for the voltage where the logic is in the middle or most active part of its state change. This charge distribution is an extension of the charge distribution in FIG. 1g. These inverter figures are closely related to the present invention as the basis for making minor alterations that do not require any IC process modification as will be developed below.

FIG. 1n illustrates a prior art MOS structure that turns out to actually emulate a combination of both modes of operation; strong-inversion FIG. 1g, 1h with enhanced weak-inversion-like properties of FIG. 1e, 1f. This structure is inherent in a 2-finger inverter as shown twice in the FIG. 1k physical layout abstraction. For reasons that will be developed, this structure will be named an iFET (MOSFET with a current input terminal=i) where the MOS structure is employed for the present invention.

Although similar MOS structures appear in prior art, no significant exploitation of many of its unique properties are known or published. In addition, proper biasing remains as a problem(s) for its operation(s). A deeper understanding of the internal mechanisms resulted in discovery of many desirable applications (enabling superior operation at deep-sub-micron scale), including an approach to proper biasing that takes advantage of natural equilibrium. This natural equilibrium is the result of a "PTAT"/"CTAT" (proportional to absolute temperature/complement to absolute temperature) known as a "Band-Gap" voltage reference mechanism, again functional at deep-sub-micron scale.

Some references show a MOS field effect device includes a body/substrate 16p, the source terminal 14p and drain terminal 19p on the body 16p. The gate terminal 17p is placed between the source terminal 14p and the drain terminal 19p for controlling conductivity therebetween. The device further includes two identical regions 13p and 15p of like "conductivity type" separated by a diffusion region 11p (designated as Z for Low Impedance in the prior art) as shown in FIG. 1n. Non-patent literature, Pain, Bedabrata et al., "Low-power low-noise analog circuits for on-focal-plane signal processing of infrared sensors", the Jet Propulsion Laboratory, California Institute of Technology, and the Defense Advanced Research Projects Agency and the National Aeronautics and Space Administration; and Baker, Jacob et al., "High Speed Op-amp Design: Compensation and Topologies for Two and Three Stage Design", Boise State University, for example, shows such a structure. However, these references do not exploit any opportunities as shown in this present invention, especially when complementary devices like this are combined into a single composite device structure as will be explained in this invention. Such configurations have been called self-cascading or split-length devices. The two conduction regions of such a configuration are arranged between source and a drain diffusions and have both a high impedance common gate connection and a low impedance Z connection to the mid channel region. This low impedance mid channel control input/output Z, when exploited as outlined in this document, enables an entirely new set of analog design methods and capabilities.

Although a cascode amplifier can be found in prior art, the prior art does not contain a complementary pair of cascode transistors connected as a totem-pole. With this simple compound device structure, feedback from the output to the input can be used to self-bias the resulting inverter into its linear mode. As mentioned above in association with FIG. 1a, the biasing of an amplifier by means of current mirrors has always been problematic; however, the novel and inventive self-biasing structure of the present invention addresses such an issue. Advantages of the configuration of the present invention (referred to as a complementary iFET or CiFET) are many, including, but not limited to:

Gain of the single stage is maximum when the output is at the midpoint (self-bias point);

The gain of a single CiFET stage is high (typically approaching 100), therefore, while the final output may swing close to the rails, its input remains near the midpoint where the gain is high.

When used in a series chain of CiFET devices, all earlier stages operate with their inputs and outputs near the mid-point ("sweet-spot") where the gain is maximized;

Slew rate and symmetry are maximized where the channel current is highest (near the mid-point);

Noise is minimized where the channel current is highest (near the mid-point); and Parasitic effects are negligible where the voltage swing is small.

When the gate input signal moves in one direction, the output moves in the inverse direction. For example; a positive input yields a negative output, not so much because the N-channel device is turned on harder, but rather because the P-channel device is being turned off. A Thevenin/Norton analysis perspective shows that the current through the P and N devices must be exactly the same, because there is nowhere else for drain current in one transistor to go except through the drain of the complementary transistor; however the voltage drop across those devices does not have to be equal, but must sum to the power supply voltage. Due to the super-saturated source channel, these voltages are tied together exponentially. This is even more evident at low power supply voltages where the voltage gain peaks due to the conduction channels being forced into a diffusion mode of operation similar to weak-inversion. This means that the gate-to-source voltage is precisely defined by the same and only drain current going through both transistors. Exponentials have the unique transparent physical property like as with a time constant, or "half-life;" It does not matter where a value is at a given point of time, a time constant later the value will be a fixed percentage closer to the final value. This is a "minds-eye" illustration of the primary contributor to output movement in response to input change. This same current balance of gate-to-source operating voltages also indicates why the "sweet-spot" in the self-biased amplifier is so repeatable. In effect it is used as a differential pair-like reference point to the amplifier input signal.

Briefly stated, the operation of the conventional CMOS amplifier of FIG. 1a is as follows:

In operation, differential analog input voltages are applied to Input+10a and Input−11a of a precisely matched pair of transistors Q1a and Q2a respectively. Any mismatch in these two transistors appears as a DC voltage added to the differential input. If there is 1 millivolt of mismatch, which is very hard to meet in CMOS, and the amplifier has a gain of 1000, the output voltage error will be 1 volt. In newer IC process nodes, power supplies are already limited to less than a volt. Exotic double centroid physical layout with multiple identical transistors arranged in diametrical opposition and everything else possible symmetrically possible are needed in the physical layout of the differential pair to minimize the offset voltage.

These amplifiers function by steering and mirroring bias currents from a current source 12a between their transistors. All the bias currents have to be larger than the peak signal deviations and these currents always flow. These currents also have to be large enough to drive the internal capacitive load of the amplifier's internal transistors plus interconnect, not to mention the output drive current which comprises the capacitive load at the maximum bandwidth frequency or slew rate.

The first bias current mirror input transistor is a transistor Q8a which is "diode connected" in that its gate and drain are tied together and bias at a threshold voltage below the top power supply rail. This bias voltage is applied to the gates of two transistors Q5a, Q7a additional positive rail based current mirrors that have to be matched to a lesser degree. In order to progressively increase the mirrored currents from the bias current mirror input transistor Q8a to the differential current feed transistor Q5a to the output pull-up current transistor Q7a, the transistors Q5a and Q7a are actually multiple instances connected in parallel. A double for the transistor Q5a and an eight (8) times for the transistor Q7a are typical choices for these multiples.

The differential pair of the transistors Q1a, Q2a is used to split the bias current to the transistor Q5a equally at the zero differential voltage input where the amplifier strives for. To achieve a voltage gain in analog designs, a positive drive current is balanced against a negative drive current. The differential pair of transistors Q1a, Q2a achieves this by mirroring transistor Q3a of the outputs back to the other leg of transistor Q4a, making current opposition with the transistor Q2a. Voltage gain is $g_m*R_L$ where $R_L$ is the parallel combination of the output impedance of the transistors Q4a and Q2a. For analog MOSFET transistors to present a high impedance on their output, they need to be very long because the depilation width due to drain voltage modifies the conduction channel length near the drain terminal. This is called "channel length modulation" which is similar to the bipolar "Early voltage" named by Jim Early of Fairchild Semiconductor during the early bipolar days. For this high output impedance requirement, the transistor Q4a must be long, and it also must be equally wide to preserve its gain setting the basic transistor sizing of the amplifier. This size must be set equal for the transistors Q3a and Q6a, except the transistor Q6a must also include the multiple used for the transistors Q5a to Q7a along with a factor of two to make up for the split of current by the differential pair. In equilibrium, the gate voltage on the transistor Q6a wants to be the same as the gate voltage on the transistors Q3a, Q4a looking like a pseudo-current mirror arrangement at the bottom power supply rail.

There are still many other linear amplifier circuit design considerations beyond these basic principles like stability considerations by compensation resistance or $R_{comp}$ 15a and compensation capacitance or $C_{comp}$ 16a and power supply noise rejection. As can easily be envisioned, the design of analog circuits in an IC is quite involved, process parameter dependent, and not very portable between IC processes.

The resulting linearity of these amplifiers are also limited due to different non-linear characteristics between the gain device and the load device (pull-up and pull-down) which cannot cancel each other out. The CiFET device structure, which is the present invention to be explained later in this specification, loads itself with the same device structure, except that the combination obtains its complementary nature through the use of opposite semiconductor diffusion types which inherently and precisely mimic any non-linear characteristics with the opposite sign to cancel each other's linearity deviations out. CMOS inverters get their opposing drive through the opposite semiconductor diffusion type, thus are a good foundation to base linearity on. This is because the same current is carried through one transistor is also passed through the complementary device. Inversion is obtained through opposite diffusions.

It is to be noted that during the transition from vacuum tubes to bipolar transistors the industry underwent a major paradigm shift, learning to think in terms of current rather than voltage. With the advent of FETs & MOSFETs the pendulum swing is back toward thinking in terms of voltage, but much knowledge has been lost or forgotten. Herein is contained the rediscovery of some old ideas as well as some new ones, all applied to the up-coming "current" state of the art. It is believed that the inherent simplicity of the present invention speaks to their applicability and completeness.

A first issue may be that there is always a need for a little analog functionality, yet nearly all analog performance metrics of a MOS transistor are remarkably poor as compared to that of a Bipolar transistor. The industry has made MOS devices serve by employing extensive "work-arounds." Conventional analog design is constrained by one or more of the followings:

Power supply voltages sufficient to bias the stacked thresholds, and transistors large enough to supply the necessary low output impedance, or high output impedance for gain and linearity.

Process extensions (unavailable at deep sub-μm scale) to function at all, let alone with the enhanced performance, demonstrated herein.

Resistors, inductors, and large capacitors are mostly non-existent for analog designs in newer IC processes.

In contrast, bipolar transistors can be made to have high gain (β), wider bandwidth, wider dynamic range (many decades, from near the rails down to the noise floor), better matching (required in differential pairs), and band-gap references. Junction FETs, which operate with sub-surface channel conduction below the surface defects, have lower noise than bipolar transistors. Likewise the iFET super-saturated source channel operates primarily below the defects at the channel surface underneath the gate oxide.

MOS designs are poorer in the above areas but have their own extreme advantages, including, but not limited to:

MOS devices are small highly scalable high speed low power ultra-dense/high functionality systems on a chip, where Bipolar designs cannot go (deep sub-μm scale).

Accordingly, building analog circuits on an IC has always been problematic. Engineering around poorly performing analog components has been the overriding objective for analog IC designers since analog circuits have been integrated. This drove the need for digital signal processing with algorithm development yielding digital magic.

Today the real-world of analog circuit design signals still needs to be converted, on both the front and back end of signal processing systems. This need has become a roadblock at deep sub-μm scale.

Another problem may be that solid-state amplifiers have been notoriously non-linear since their inception. To make them linear, increased open loop gain (with levels significantly higher than is ultimately needed) is traded for control over actual circuit gain and linearity through the use of a closed loop (feedback). A closed loop amplifier requires negative feedback. Most amplifier stages are inverting, providing the necessary negative feedback. A single stage, with a closed loop, is stable (does not oscillate). Increased loop gain requires that stages be added such that there are always an odd number of stages (sign is negative), to provide the necessary negative feedback. While a single stage amplifier is inherently stable, three stages and most definitely five stages are unstable (they always oscillate).

The problem then is how to properly compensate a multi-stage closed loop amplifier while maintaining a reasonable gain-bandwidth product. This is particularly difficult at deep-sub-micron scale where circuit stages must be simple in their design. The severely limited power supply voltages preclude the use of conventional analog design approaches. Additionally, it is desirable to avoid reliance upon analog extensions but rather to accomplish the necessary analog functions using all digital parts, to improve yields and decrease costs. Using all digital parts allows analog functions at process nodes that do not yet have analog extensions, and may never have them.

There is a long felt needs for low-cost/high-performance systems on a single chip to realize, affordable high-volume devices such as the Internet of things, smart-sensors, and other ubiquitous devices.

SUMMARY OF THE INVENTION

The present invention relates to a novel and inventive compound device structure, enabling a charge-based approach that takes advantage of exponential relationships of a super-saturated source channel described in relation to FIGS. 2a, 2b and 2e to 2m below which possesses sub-threshold like operation when used for analog CMOS circuit designs. The sub-threshold like operation offers current input to voltage output trans-impedance functionality with interesting properties.

Through incorporating this compound device structure 200 as shown in FIG. 2m into an inverter, the present invention is an evolution of an ordinary CMOS inverter. It provides extremely high precision, speed, linearity, low voltage operation, low noise, and a compact physical layout, using an all-digital IC process that naturally extends into deep sub-μm IC process nodes. In addition to the expected digital inverter function, several classes of analog circuits are facilitated: a voltage input to voltage output amplifier, a current input to voltage output amplifier, an analog adder, an analog multiplier, a spectrally-pure sine-wave multi-phase oscillator controlled through an adjustable delay circuit, and a Voltage or Current reference source which includes temperature measurement or temperature independence. It is envisioned that the present invention may open up the possibility of integrated analog signal processing at logic speed, thus enabling the continuation of microprocessor capability according to Moore's law. Take special note that analog functionality is realized, in a digital IC process, using a single optimized digital logic circuit cell.

A preferred embodiment of the present invention 300 provides for a stacked pair of transistors with a common gate 301, mirrored with a complementary pair of stacked transistors 302 FIGS. 3a, 3b, 3c, 3d, 3e (like a digital inverter 100 in FIGS. 1i, 1j, 1k, 1L, 1m), with feedback from its own output to establish an optimum bias point. This configuration offers additional trans-impedance control inputs that respond to current rather than voltage and so provides an ideal connection for symmetrical roll-off compensation in a multi-stage amplifier. This embodiment also provides extreme linearity as well as a low impedance voltage output that is essentially insensitive to capacitive loading. Drawing inspiration from the past, concepts developed for the chopper stabilized amplifier are rediscovered and may be applied to lend an element of gain, accuracy, and stability uncommon in the industry.

According to one aspect of the present invention, a CiFET amplifier is provided, which is a basic Analog-in-DIGITAL building block. It is impractical to try to construct analog systems at small scale using the same system design techniques that have been previously applied at larger scales. The power supply voltage is too low to provide a dynamic range needed to swing analog voltages, and the required analog IC process extensions are not available. In the newest ultra-deep sub-μm processes, long and wide transistors are not available, often all the all the individual transistors must be identical in size. The solution is to convert analog signals to digital as early as possible and take advantage of digital signal processing techniques that are available today. To accomplish this it is necessary to have a reliable, precision front-end and that requires a high-precision amplifier. The techniques in this specification point to such a solution.

According to another aspect of the present invention, it takes advantage of the Doping Profile and Ratioing. Not everything in optimizing a circuit has to do with the circuits' electrical configuration. Proper device sizing and especially coarsely adjusting the size relationship between complementary transistors provides considerable performance benefits. As will be developed in this specification, the CiFET, being a compound device structure, offers extensive opportunity to establish impedance matching and gain control through proper ratio of the physical device parameters. Other important characteristics, like noise, speed, and power, can be tailored through careful specification of the physical construction and doping of the transistors, rather than relying solely on circuit configuration.

According to yet another aspect of the present invention, certain noise advantages are provided. In the end, it comes down to signal-to-noise ratio. Low power supply voltage requirements in ultra-deep-sub-μm IC processes limit the maximum signal swing to a much smaller number than most analog designers are used to. So with a smaller signal, the low-noise techniques embodied herein must be employed in order to maintain the desired signal to noise ratio or perhaps even improve the ratio.

Simply stated, the CiFET device starts with a common 2-finger inverter and re-wires the inverter's parallel transistor connections to series, making these intermediate series transistor connections available to spawn a supplementary pair of input/output terminals. These new terminals (referred to as iPorts) are observed to be particularly sensitive to charge transfer (or current) and exhibit ultra-linear analog trans-impedance (input current to output voltage) response, among many other interesting analog properties observed. In a manner similar to an inverter, the output can handle varying high capacitive loads with minor degradation—highly desirable for analog portability. The sizing and rationing of the individual transistor conductance can be roughly optimized to enhance various analog performance metrics.

Traditionally analog MOS circuits convert input voltage to output current ($g_m$), which is then turned back into a voltage by means of an opposing high impedance load; high impedance is needed in order to obtain voltage gain. This results in vastly different gain path verses load path which is made up of nonlinear structures. Thus, a mismatch in output pull-down and pull-up signals come from fundamentally different circuits in order to obtain the signal polarity inversion needed to drive the output up or down. This not only restricts the linearity of the amplification, but the dynamic output swing, and takes appreciable power causing substantial design effort to create at best with poor portable and flawed performance among many other things.

On the other hand, as in a CMOS inverter, the CiFET derives its opposing load by means of opposite diffusion types, not different types of circuits. Both the pull-up and the pull-down circuits are not only the equivalent, but they pass the same current when equilibrium is reached, thus matched circuits passing the same current cancel out nonlinearities leading to minimum distortion over extreme ranges of operation. As in CMOS logic, opposing signals come from opposite diffusion types. In addition the CiFET operates with opposing exponential equalities that enable interesting mathematical operations that are valid over an exciting wide range.

BRIEF DESCRIPTION OF FIGURES

FIGS. 1b to 1d are a baseline set of representative performance plots illustrating frequency domain performance and power supply dependency of the prior art OpAmp of FIG. 1a;

FIG. 2c shows a graph of drain voltage $V_{ds}$ and drain current $I_d$ when there is no iPort injection current, while FIG. 2d shows another graph when max iPort injection current is provided;

FIGS. 3b and 3c illustrate a physical layout abstraction of the complementary iFET (or CiFET) compound device shown in FIG. 3a;

FIG. 3d shows a three (3) dimensional perspective view of the CiFET compound device shown in FIG. 3a;

FIGS. 3h to 3k illustrate various CiFET compound device transfer characteristics and properties of the present invention.

FIGS. 3n, 3o, 3p, 3q, 3r, 3s, 3t, 3u and 3v are representative performance plots of the CiFET compound device illustrations of the present invention.

DETAILED DESCRIPTION OF THE INVENTION

A MOS structure referred to herein as an iFET, where the letter "i" refers to a current and "FET" refers to a Field Effect Transistor, is the enabling element of several high performance and novel designs of the present invention. The present invention is based on the addition of a direct connection to a mid-point in a Field Effect Transistor (or FET) channel and the realization that this is a low impedance port (current port, or herein referred to as "iPort") having trans-impedance current input to voltage output gain properties realized by providing a bidirectional current sink/source mid-channel with a very low input impedance at a low saturation voltage, and additionally connecting reciprocal iFETs pairs of opposite "conductivity type" or polarity type (P-type & N-type) interconnected to take advantage of their complementary nature to operate as a team and with symmetry to self-bias near the midpoint between power supplies. In addition, the relative conductance of the first and second channels of the iFETs can be adjusted (threshold choice, relative sizing, and doping profiles) to tailor the gain, speed, quiescent current and input impedance of such an complementary iFET (or CiFET) compound device of the present invention.

The iFET, with its iPort provides an uncommon and unexpected solution to the compensation problem, and then continues to provide new or alternative solutions to other old problems, exceeding industry expectations. The advantages of operating circuits in "weak-inversion" have long been known but, so also have the problems. The CiFET enables circuits to exploit the high gain and wider dynamic range available in "weak-inversion," without sacrificing superior speed performance. The CiFET compound device provides a standard active IC gain device that is superior to ordinary analog MOSETs making digital ICs host analog functionality. It is not a tradeoff.

The following is a list of some of the unusual aspects of a CiFET based circuit, including, but not limited to:
   Operates at low power supply voltage;
   High gain;
   Extremely linear;
   Very high speed (wide band);
   Self-Biasing;
   Low noise;
   Quick recovery (DC);
   Uses all digital parts and processes;
   iPorts respond to charge (things in nature are charge based) rather than Volts across a Resistance; and
   iPort has wide dynamic range with constant gain in an open loop.

Figure 2A:
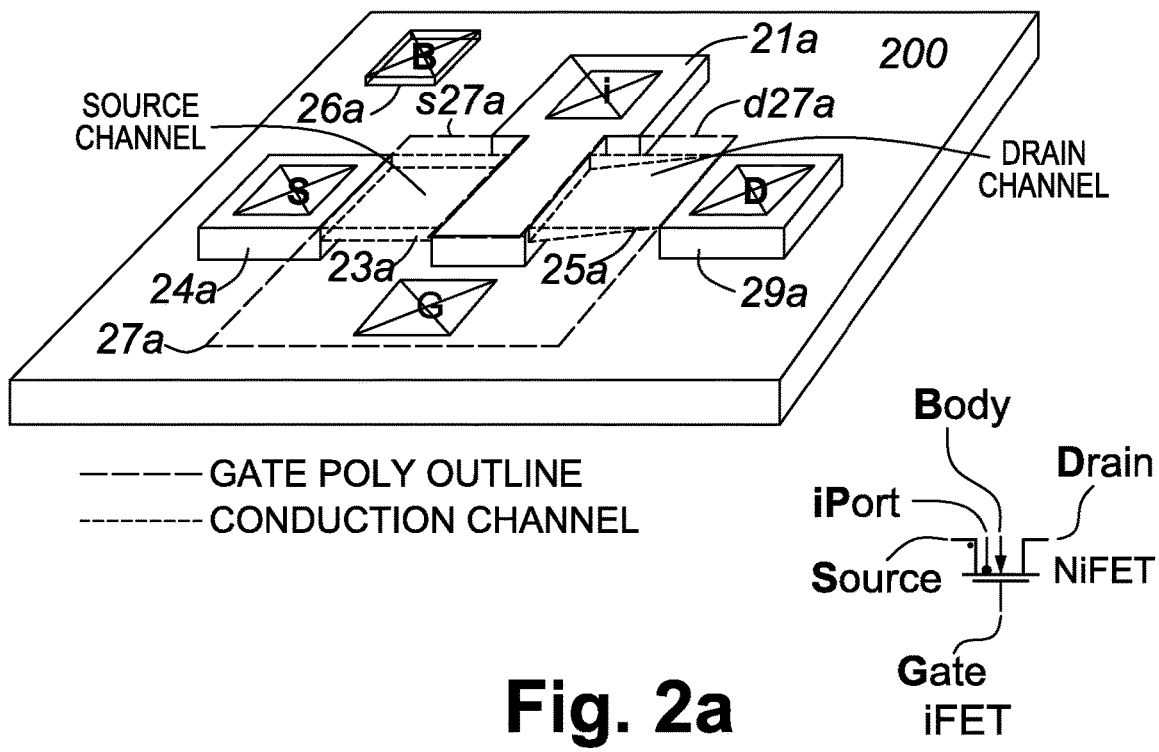
FIG. 2a illustrates a three (3) dimensional prospective view of a MOS field-effect transistor (or iFET) with a new mid-channel bi-directional current port (iPort) of the present invention.
Figure 2B:
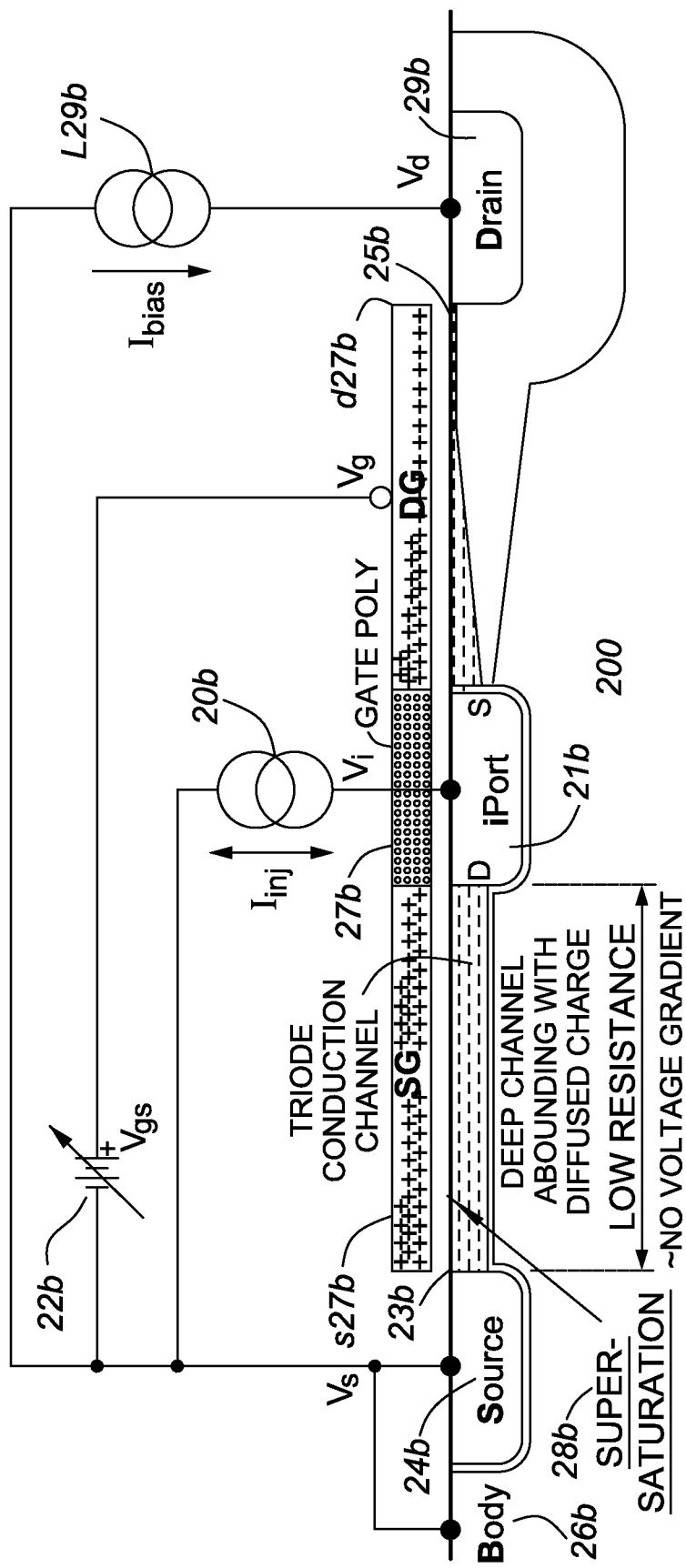
FIG. 2b illustrates a cross-sectional view of iFET of the present invention with visualized channel charge distributions.

Referring to FIGS. 2a and 2b, according to a preferred embodiment of the present invention, an iFET 200, is shown which is comprised of substrate 26a or 26b, source terminal 24a or 24b, and drain terminal 29a or 29b, defining therebetween two channels 23a and 25a, or 23b and 25b on the substrate 26a or 26b, respectively. Typically the first (source channel 23a, or 23b) is connected to the power supply (not shown) while the second (drain channel 25a, or 25b) connects to the load (not shown in FIG. 2a). The substrate 26a or 26b is N- or P-type. The two channels, source and drain channels 23a and 25a, or 23b and 25b, respectively, are connected to each other as shown in FIGS. 2a, and 2b, at the iPort control terminal 21a or 21b, and the channels 23a and 25a, or 23b and 25b, share a common gate control terminal 27a or 27b, respectively. The source channel portion of the gate control terminal s27a/s27b is capacitively coupled to the source channel 23a/23b; while the drain channel portion of the gate control terminal d27a/d27b is capacitively coupled to the drain channel 25a/25b. This configuration means that the iFET 200 has more than one control input terminal.

The gate control terminal 27a or 27b operates like a conventional MOSFET insulated gate, with its high input impedance and a characteristic trans-conductance ($g_m$) transfer function. Typical values of ($g_m$) for a small-signal MOSFET transistor are 1 to 30 millisiemens (1 millisiemen=1/1K-ohm) each, a measure of trans-conductance.

The iPort control terminal 21a or 21b is low impedance with respect to the source terminal 24a or 24b, and has a transfer function that looks more like beta ($\beta$) of a bipolar transistor, but is actually trans-resistance (or $r_m$), or more generally, especially at high frequencies, trans-impedance, measured in K-ohms, where the output voltage is a consequence of an input current. Typical resistance values (or values of $r_m$) for a small-signal iFET transistor 200 are 50K$\Omega$ to 1M$\Omega$, a measure of trans-resistance. Current input to voltage output (trans-impedance) is the basis for the assertion that 1 uA in will yield an output of 100 mV (or a gain of 100,000:1) at a large signal level, or 1 pA in will yield an output of 100 nanoV (or a gain of 100,000:1) in an LNA (both results from the same circuit).

These values have been shown to remain true for a single minimum sized CiFET, with inputs from 1 pico-ampere to 10 micro-amperes, using the same circuit in simulation and limited device measurements. In 180 nm CMOS construction the noise floor limits measurements below about 10 pico amps. iFETS can be constructed with different length to width proportions with very predictably differing results.

High gain, uncharacteristic or surprising results differing from the state of the art designs, is the result of the "weak-inversion" like exponential characteristics of the source channel 23b of the iFET 200 operating in a highly ionized super-saturation mode 28b.

Speed in this super-saturated source channel 23b is not limited by the transit time of carriers along the source channel 23b, but the high concentration of ionized charge carriers in the active channel only have to push the surrounding charge a little as charge is either added or removed from the source channel 23b by means of the iPort control terminal 21b, resulting in a diffusion current which is defined by exponential relationship as has been realized when a MOSFET is operated in weak-inversion. This is in contrast to an electric field causing the charge to transit the channel, which is a square-law function of the gate control voltage. In this configuration, speed is faster than logic built from the same fundamental transistors and unhampered by the "weak-inversion" stage that has higher gains like bipolar transistors. As opposed to bipolar transistors, control current can go either in or out of the iPort control terminal 21b as well as operate with no iPort current, which is useful for creating a self-bias operating point.

In a self-biased CiFET all of the channels are operated with a higher than normal gate to channel voltage and a lower than normal voltage gradient along the channel. This provides lower noise which is facilitated by the self-biasing approach. The potential at drain terminal 29a or 29b is the same as potential at the gate control terminal 27a or 27b, greatly reducing the pinch-off effect found in conventional analog circuit designs.

Figure 1A:
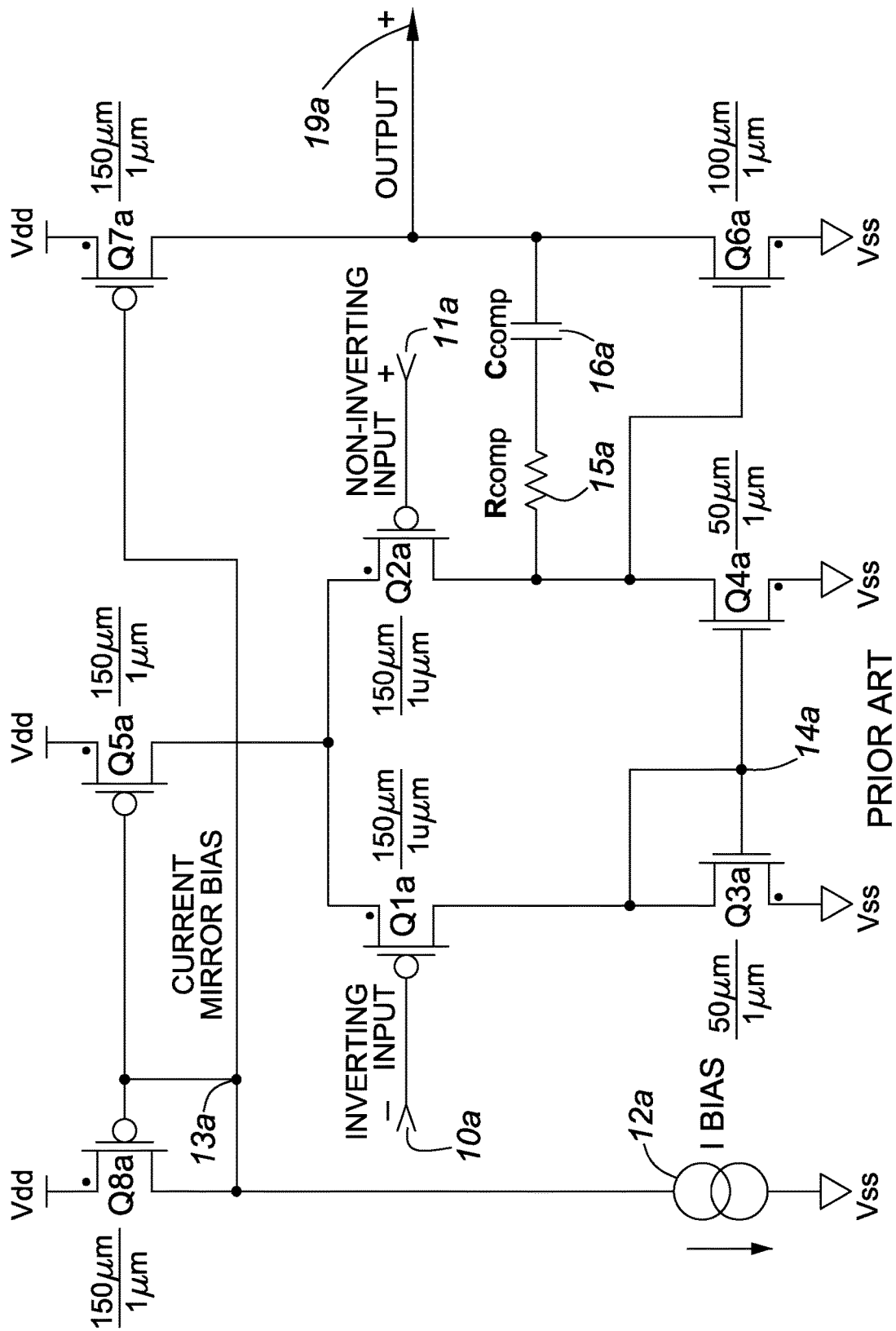
FIG. 1a illustrates a high quality CMOS OpAmp prior art transistor schematic from a prominent textbook "Analysis and Design of Analog Integrated Circuits," 5$^{th}$ Ed, by Gray, Hurst Lewis and Meyer, p 484 as a prior art amplifier for comparison.
Figure 1B:
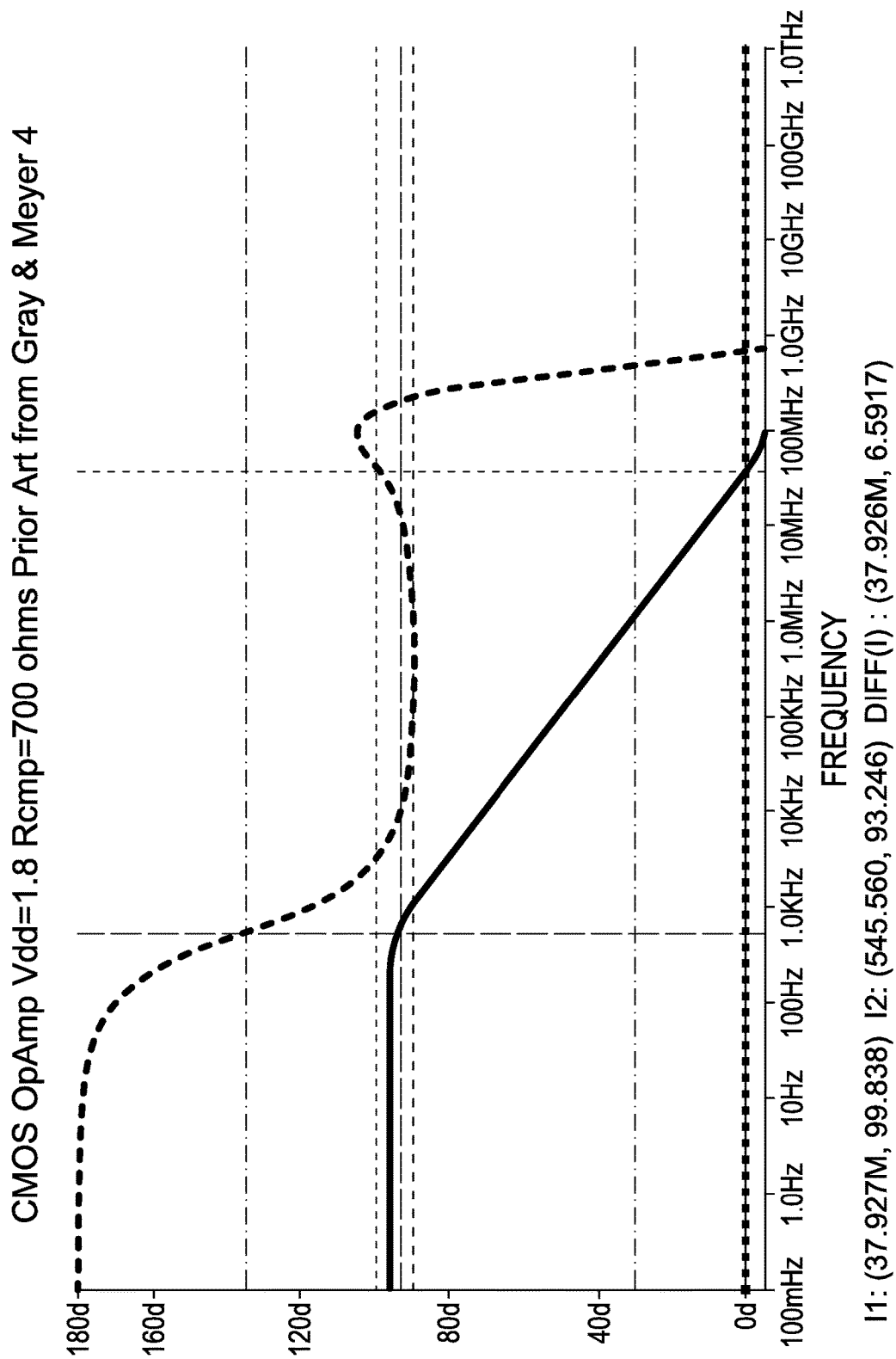
Figure 1C:
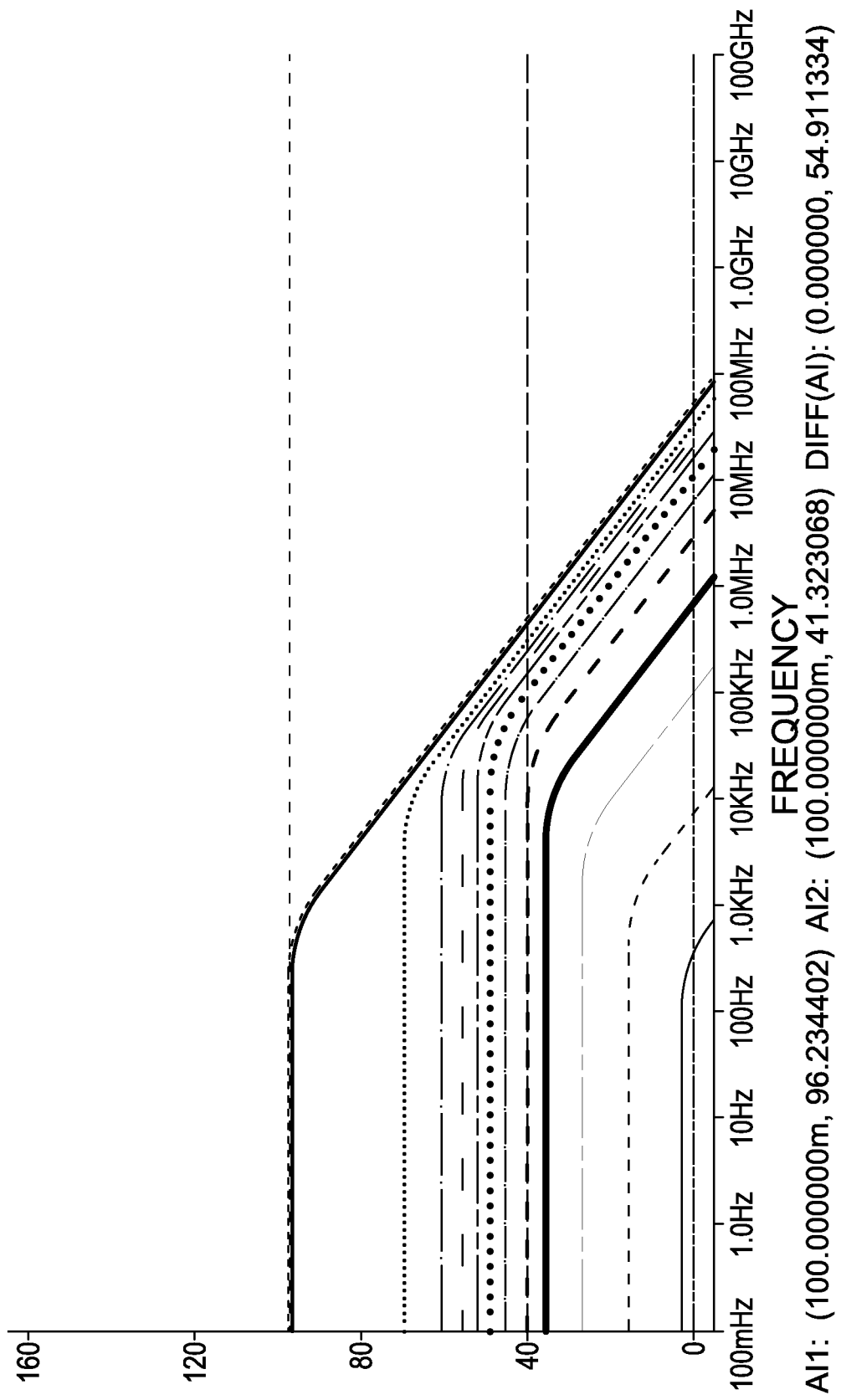
Figure 1D:
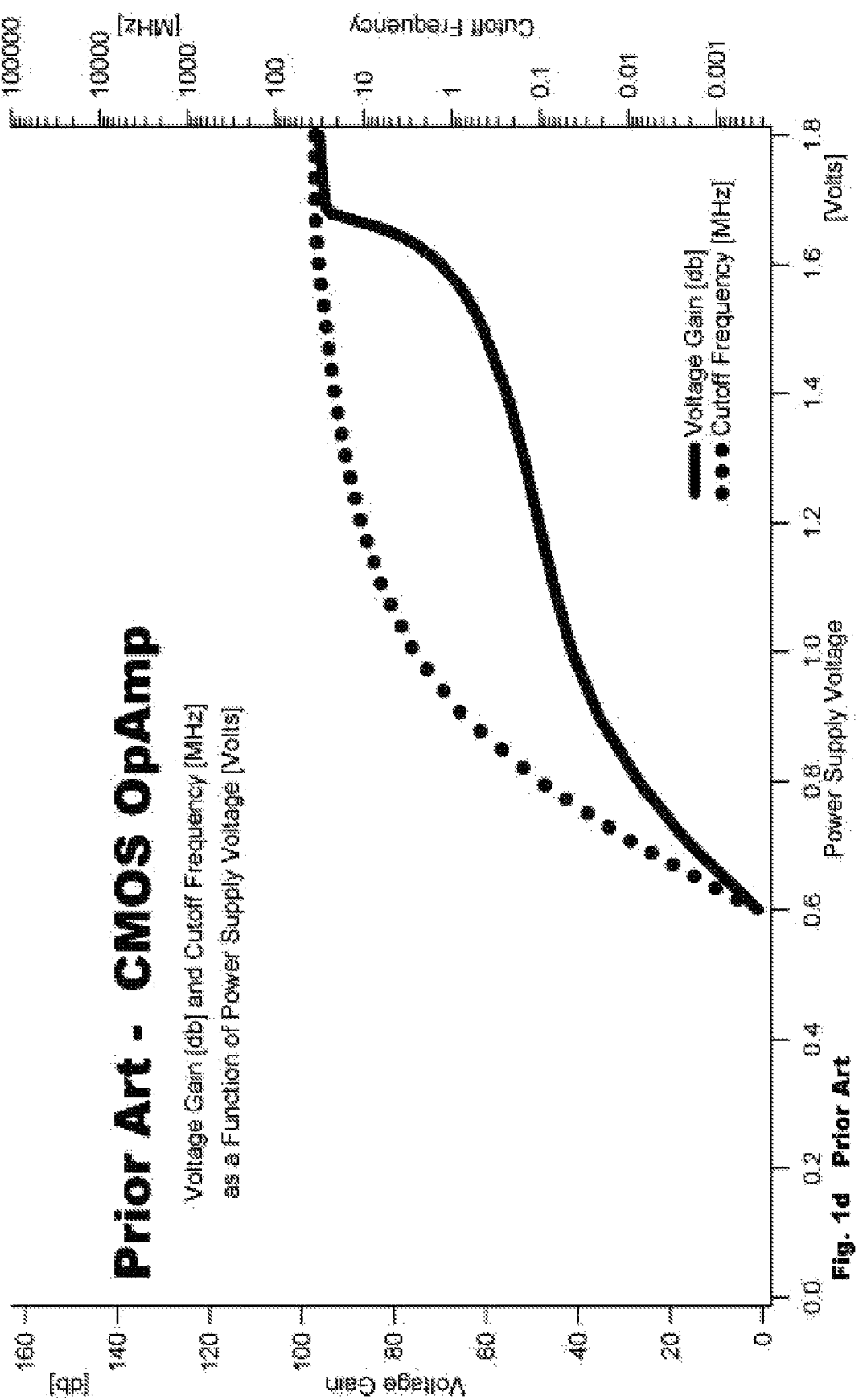
Figure 1E:
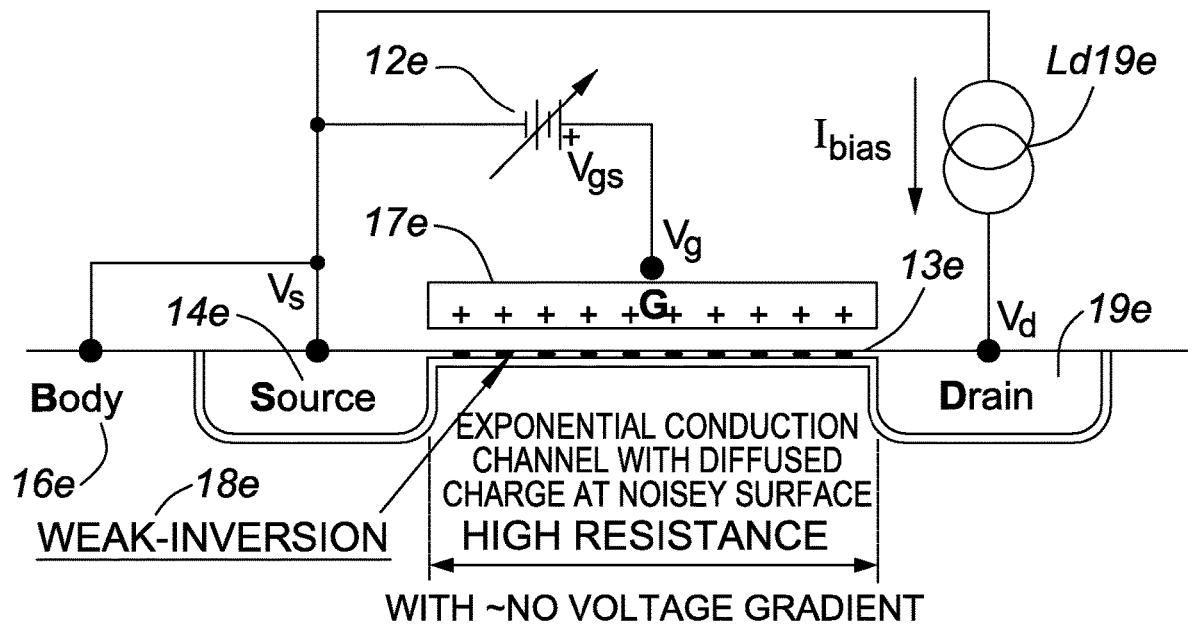
FIGS. 1e and 1g show cross-sectional views of prior art MOSFET channel construction weak-inversion and strong-inversion, respectively.
Figure 1F:
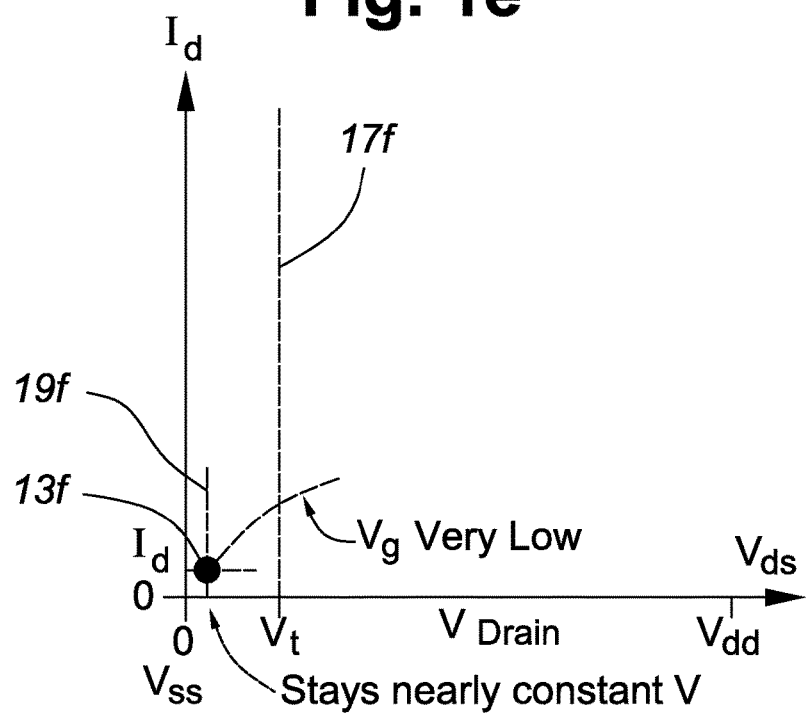
FIGS. 1f and 1h show plots showing exponential relationship between drain current and drain voltage when weak-inversion and when strong-inversion, respectively.

The iFET 200, because of the common gate connection over the source channel 23a/23b and drain channel 25a/25b, a higher than conventionally applied voltage is placed on the source channel gate control terminal s27a/s27b (or SG) with respect to the source terminal 24a/24b and source channel 23a/23b when compared to the gate voltage 17e used for weak-inversion 13e of FIGS. 1e and 1f. This higher than expected voltage 22b FIG. 2b is responsible for a much thicker (lower resistance highly ionized) conduction layer 28b, allowing the mainstream of carriers to avoid the traps in the surface of the crystal lattice just under the gate s27b, hence—much lower noise similar to the manner in which a junction field effect transistor (or j-FET) conduction channel is located below the surface.

Trans-resistance ($r_m$) is the "dual" of trans-conductance ($g_m$). When looking up trans-resistance, most of the references are to inductors and capacitors, suggesting that the iFET may be useful in synthesizing inductors. Thus ultrapure sine-wave oscillators can be made from CiFET stages that do not use inductors.

The iFET works in the following ways: A low noise amplifier requires a low impedance channel. A low impedance channel is low in voltage gain but high in current gain. To establish voltage gain, a second stage, operating as a current to voltage converter, is required. A cascoded pair (one on top of the other) of transistors provides such a configuration. Biasing requirements for a cascoded pair preclude its use at low voltage unless a convenient solution for the biasing problem is found. The CiFET device structure provides the solution to this problem through self-biasing of a complementary pair. The impedance of the source channel 23b can be designed to accommodate the impedance of the particular signal source driving it (see later section on ratio).

Regarding FETs in general, carriers are attracted to the surface by the gate field, a low gate voltage creates a thin surface-layer on the channel (where the conductivity takes place) while a higher gate voltage creates a thicker underlayer. The thin layer of carriers is impeded by the non-uniform surface defects resulting in electrical noise, while a thicker layer of carriers finds a smoother path below the surface, thus reducing total electrical noise. This indicates that higher gate voltage translates to lower noise.

Referring to FIG. 2b, in the iFET 200 the electric field created by the gate voltage Vg 22b on the gate control terminal 27b causes carriers to rise from the substrate 26b into the source channel 23b region converting the semiconductor material to an ionized conductor with a relatively large number of carriers per volume which is identified as "super-saturation" 28b, thus establishing a high level of conductivity.

Injection current 20b introduced into the iPort control terminal 21b increases the diffused charge density (number of carriers per volume) throughout the source channel 23b, thus making the source channel 23b even more conductive. The rate of conductivity change is exponential, similar to that found in "weak-inversion." This exponential rate of conductivity change is due to the low voltage gradient along the source channel 23b (source terminal 24b to iPort control terminal 21b voltage gradient).

The iFET exponential relationship between source channel 23b charge 28b and gate voltage 25b provides access to exponential/logarithmic functionality, where the addition of two logarithmic functions is equivalent to multiplication when an antilog is applied. A reversing antilog or exponential operation recovers the analog output through the opposing complementary CiFET loading device structure. This complement is obtained through opposing diffusion types, similar to CMOS logic, instead of some other transistor linear circuit configuration. Such exponential relationship may be used for various low noise amplifier applications as well as many analog mathematical operations. The exponential relationship is also responsible for the wider dynamic range of these CiFET circuits.

Again, referring to the source region in FIG. 2b, removing charge from the gate control terminal 27b or/and iPort control terminal 21b (number of carriers per volume) results in reduced conductivity of the semiconductor material in the source channel 23b. In this respect, the iPort control terminal 21b-to-source terminal 24b connection operates in a manner similar to the base-region of a bipolar transistor (which is exponential): the more control current to the iPort control terminal 21b, the more the device conductivity ($g_m$ or $1/r_m$). In addition to the base current operation of a bipolar transistor, the iPort works symmetrically around zero injection current in either direction, thus it possesses true bidirectional operation for four quadrant operations.

Figure 3A:
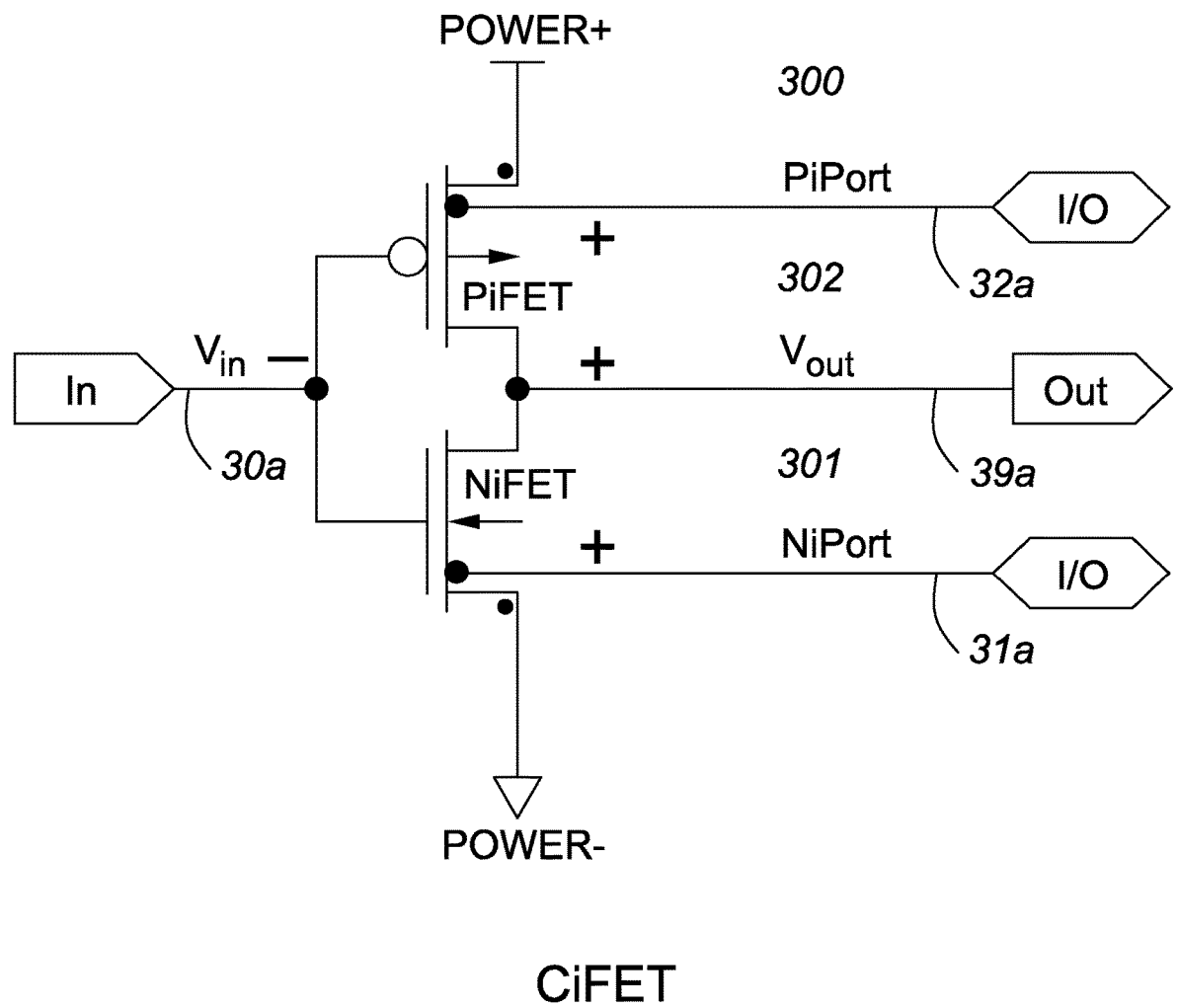
FIG. 3a illustrates a schematic diagram of complimentary pair of iFETs of the present invention.

The drain channel 25b of the iFET 200 operates more like a conventional FET, in that the thickness of the drain channel 25b is greater near the iPort control terminal 21b (same thickness as the source channel 23b) and tapers as it reaches its diffusion region around the drain terminal 29b (the decreasing voltage differential between drain channel 25b and gate control terminal 27b diminishes the gate 27b to channel 25b field) establishing the output resistance of the transistor as set by the gate voltage $V_g$. The tapered decreasing channel 25b depth near the drain 29b is from the lower gate 27b to drain 29b voltage which decreases the number of carriers that are ionized up from the semiconductor body 26b below into the conduction channel 25b. When loaded with a complementary iFET, the resulting CiFET device FIG. 3e is biased at a lower gate 27b to drain 29b voltage (close to the voltage found on the gate), decreases the drain channel output resistance (thicker channel 25b at the drain diffusion). This lower drain channel resistance results in lower noise and a high output drive capability to establish the desired drain voltage at the drain 29b regardless of the capacitive load.

A thick source conduction channel 23b within the iFET 200, operating at a low voltage gradient along this channel, has a low voltage gain but it has a high power gain as a result of the low input impedance which efficiently accepts input signal energy from the iPort in the form of input current. This source channel also contributes a very minimal noise.

The conduction region 25b around the drain terminal 29b, operating at a higher voltage along its conduction channel 25b, provides the desired voltage gain with a minimal noise contribution when operated with the drain voltage being the same as the gate voltage $V_g$ 27b. This voltage equality is contributed by a unique biasing construct of the CiFET FIG. 3e, to be explained hereinafter.

FIG. 2b further shows iFET channel charge distributions, according to the present invention, with their operating points 23c, 25c, and 23d, 25d graphed for a zero iPort injection current FIG. 2c and for a maximum positive iPort injection current FIG. 2d respectively. Vertical lines from $V_t$ at 27c/27d represent threshold voltage in FIGS. 2c and 2d. This threshold voltage is the dividing line between weak inversion and strong inversion. At threshold voltage 50% of the channel current is diffusion driven and 50% is driven by the electric field along the channel, thus below threshold voltage 27c/27d the channel current is becoming predominately diffusion driven which possesses exponential characteristics. In super-saturation, the channel is essentially all diffusion driven, thus exponential characteristics define the channel carrier conduction or channel conductance. With zero iPort injection current at 20b in FIG. 2b, as shown in FIG. 2c, bias current at $I_d$ produces the bias point output at 25c with voltage Vd 29c as it is measured at the drain terminal 29b, along with an iPort 21b voltage at its bias current $I_d$ point 23c.

FIG. 2d illustrates how a small amount of iPort current 20d impressively changes the drain channel output voltage to a point at 25d: With a maximum positive iPort 20b injection current, the $\Delta I_d$ bias current from 23d to 20d produces the Vd output voltage at 29d (seen at the drain terminal 29b), along with an essentially constant iPort 21b voltage at its bias point 23d. The iPort voltage remained basically constant while the drain voltage changed by nearly half of the power supply voltage, thus input current changes the output voltage, demonstrating a trans-impedance transfer function. This trans-impedance output voltage 29b, 29c, 29d changes as if the input current is flowing through the trans-impedance $r_m$ resistance, while it is actually flowing into the super-saturated source channel, which has an input resistance that is much lower. The source channel is a current to exponential voltage (at the iPort) converter and the drain channel provides the anti-log conversion back to form the output drain voltage, while providing all the drive required for various capacitive loads.

Figure 2E:
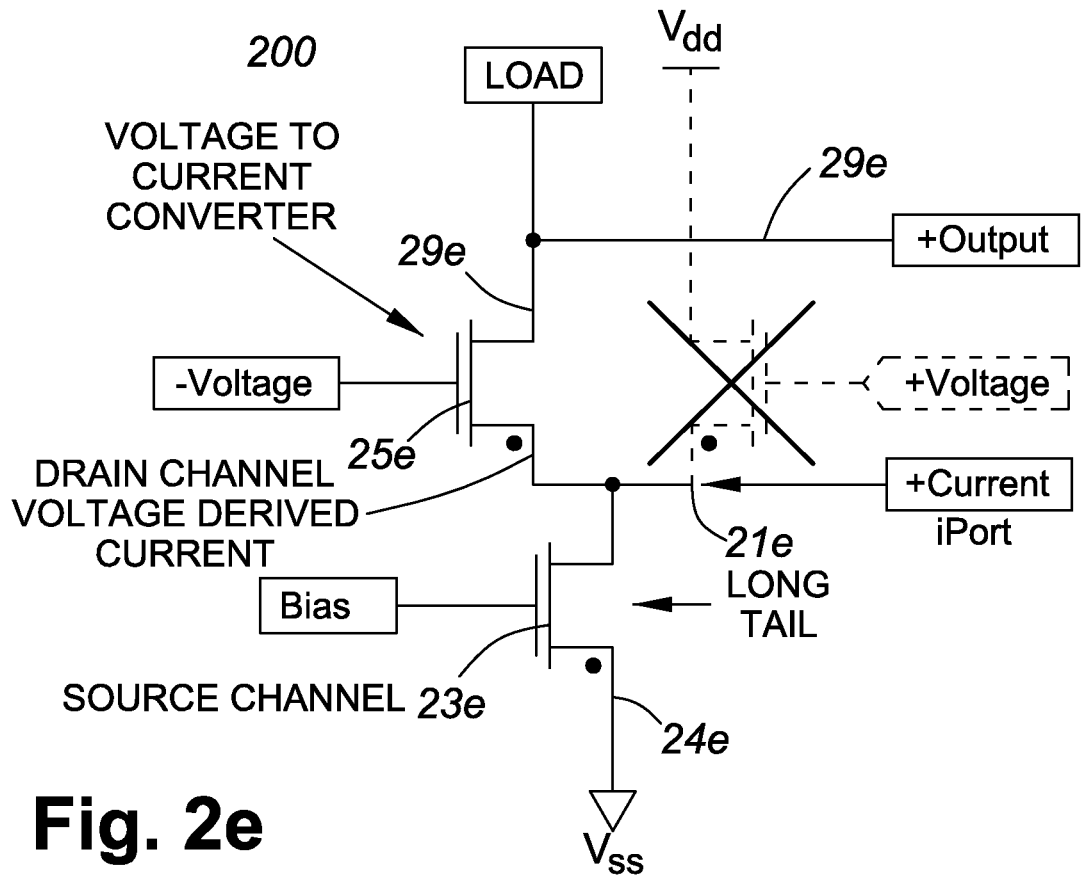
FIG. 2e illustrates how the new iPort current terminal replaces half of a differential pair in an iFET amplifier of the present invention.
Figures 2F, 2G:
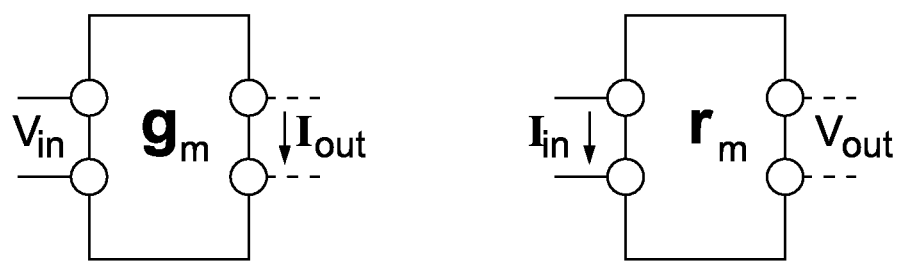
FIGS. 2f to 2L illustrate channel ionization and trans-impedance characterization of the iFET along with suggested schematic symbols.

The iFET 200 of the present invention can be viewed as a differential amplifier (or long tailed pair), as shown in FIG. 2e, where drain channel 25e converts the "−Voltage" input to the "Voltage Derived Current" and the iPort "+Current" input is a current (rather than a voltage). The source channel 23e converse "Bias" from negative power voltage Vss 24e. A balance is still required between the current input 21e and the voltage derived current from the drain channel 25e, with the difference being presented as a voltage change on the output terminal 29e. While this output suffers from some non-linear transfer characteristics, the use of an adaptive load with a complementary non-linearity compensates, resulting in an ultra-linear transfer function and can be viewed as a "black box" as shown in FIG. 2g.

Figure 2H:
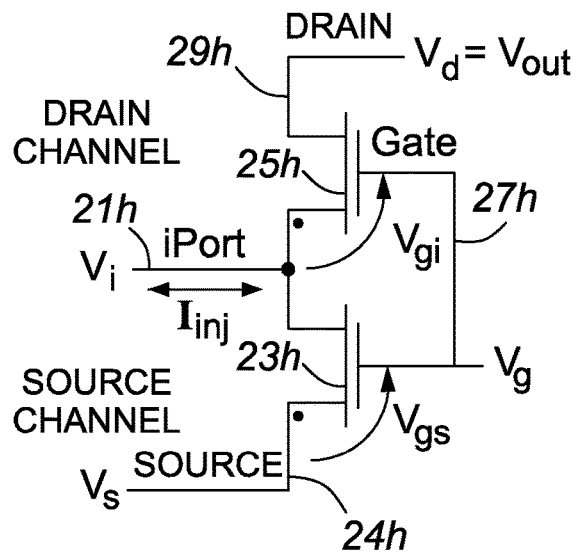

FIG. 2h shows series transistor channel arrangement in the iFET, illustrating the current-voltage arrangements of the two channels 23h and 25h which corresponds to 23b and 25b of FIG. 2b, produces voltage $V_{out}$ at 29h. With zero iPort 21h injection current, the current through the drain channel 25h is constrained to be the exact same current that passes through the source channel 23h. Without leakages or an iPort current, there is nowhere else for the current to go except through the series path of these two channels. If the two series transistors in FIG. 2h are sized equally, their gate to channel control voltages want to be the same. That is $V_{gi}$ 27h wants to be the same as $V_{gs}$ in FIG. 2h, thus forcing the iPort voltage $V_i$ at iPort 21h to be the same voltage as the source voltage $V_s$ at the source 24h. This restraint ideally forces low impedance at the iPort input terminated with zero volts to the source. By altering the relative conductance ratio of these two channels, the input impedance and termination voltage can be set. Since both transistor channels are made together and adjacent to each other, the input impedance and termination voltage are a very fixed and consistent pair of parameters, similar to matching of a differential pair of transistors. Their bandgap relationship configuration is a PTAT for the N channel iFET (Vittoz, Eric A. et al., "A Low-Voltage CMOS Bandgap Reference", IEEE Journal of Solid-State Circuits, Vol. SC-14, No. 3, June 1979, at page 573 to 577) and a CTAT reference for a P channel iFET (Anvesha A, et al., "A Sub-1V 32 nA Process, Voltage and Temperature Invariant Voltage Reference Circuit", 2013 26$^{th}$ International Conference on VLSI Design and the 12$^{th}$ International Conference on Embedded Systems, IEEE Computer Society, 2013).

Figure 2I:
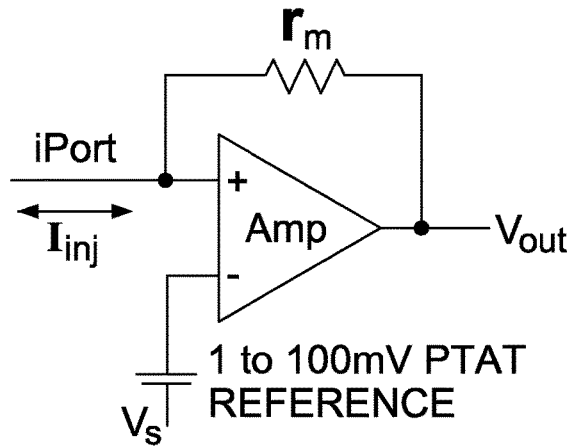

FIG. 2i illustrates a slightly higher level circuit prospective of the iFET operation, which exemplifies a trans-resistance transfer function. Here an input current to a virtual PTAT reference voltage provides an output voltage change that is multiplied by the trans-resistance $r_m$ and strongly buffered. This trans-resistance $r_m$ gain ratio is typically in the range of 50K to 2 Meg.

Figure 2J:
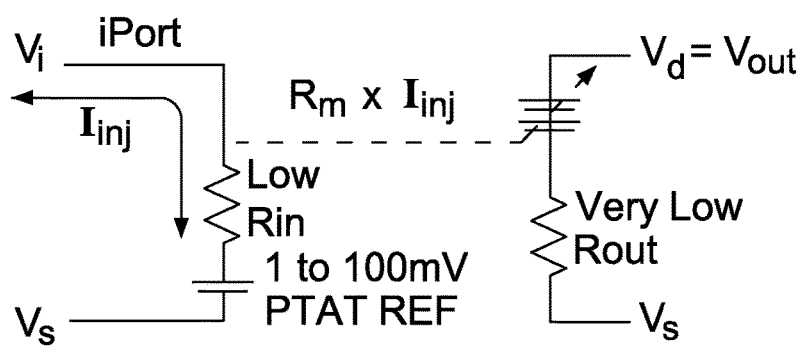

FIG. 2j is a behavioral schematic of the iFET operational model which illustrates the iFET behavioral relationship in a more detailed schematic. The current $I_{inj}$ the iPort sees a low $R_{in}$ to a PTAT voltage above $V_s$ at the iPort input. At the output this $I_{inj}$ current input becomes a voltage that has a magnitude that looks like it went through a high resistor $r_m$, but is sourced at the output $V_{out}$ with a low impedance variable output voltage source. This low impedance can equally drive highly varying capacitive loads as normally encountered in integrated circuit instantiations. This functionality is depicted with FIG. 2g at the "black box" level where a current input produces an $r_m$ times higher $V_{out}$. This black box depiction of a trans-resistance amplifier is the dual of the normal MOS amplifier depicted in FIG. 2f where an input voltage produces an output current that is the input voltage multiplied by $g_m$. It is highly desirable to provide a voltage output instead of a current output that must be turned back into a voltage by running this current into a load resistance. The load significantly effects the voltage in the $g_m$ amplification black box while it does not in the $r_m$ black box amplifier.

Figure 2K:
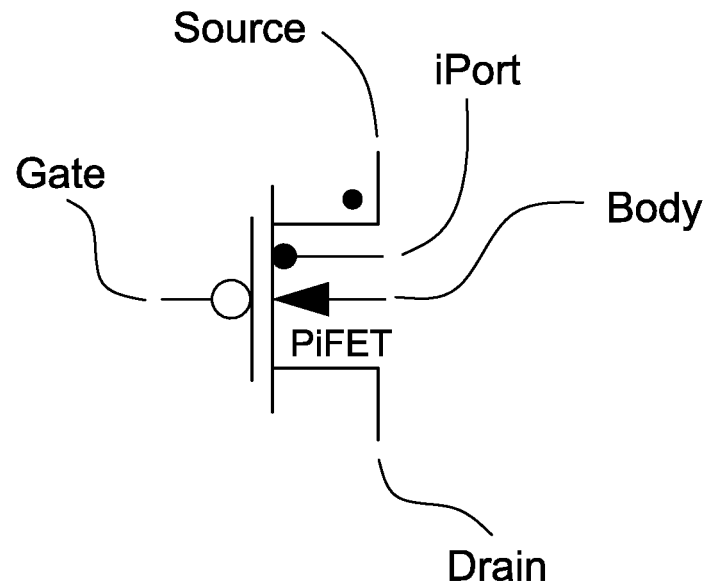
Figure 2L:
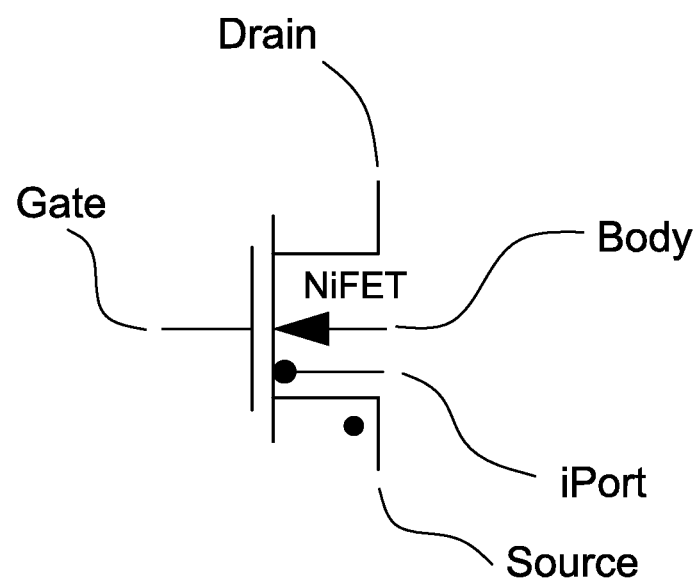

FIGS. 2k and 2L are suggested schematic symbol for the iFET device.

Figure 2M:
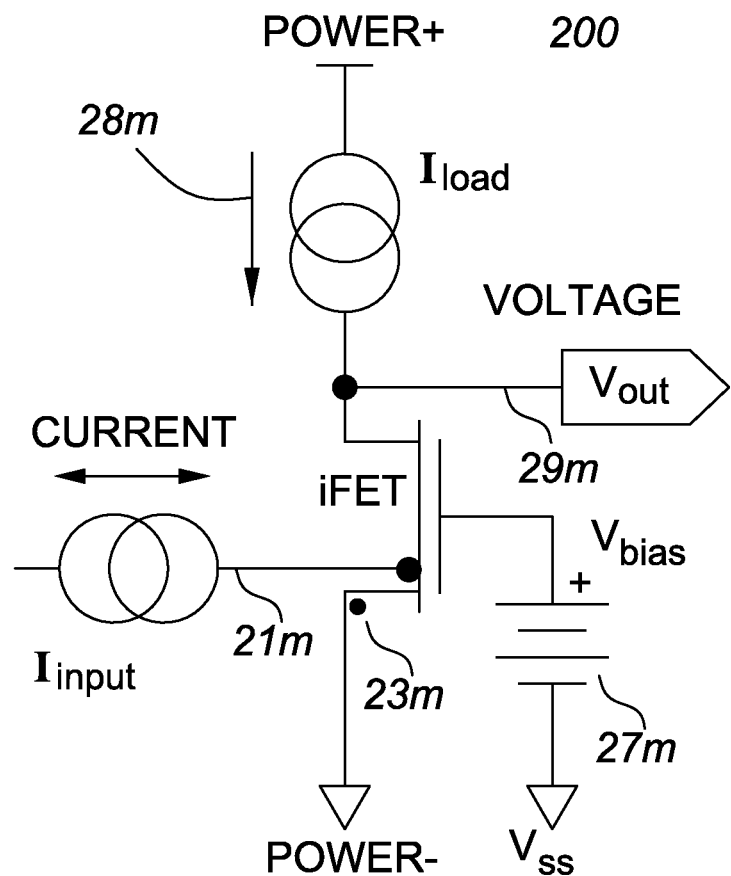
FIG. 2m illustrates a schematic diagram of a trans-impedance iFET amplifier of the present invention.

FIG. 2m captures yet another application of the iFET 200, which provides a methodology of obtaining a voltage output from a bi-directional current input on the iPort. This follows a trans-impedance $r_m$ transfer-function which is precisely defined over an extremely wide dynamic range FIG. 3h. At this iPort terminal 21m, a bi-directional input current into an iFET 23m provides a proportionally large voltage change on the output 29m which is biased with a load current 28m. This operates through the weak-inversion like exponential characteristic of the iFET source channel 23b as shown in FIG. 2b by altering the amount of charge in the super-saturated 28b source channel of the iFET 200. The gate is provided with bias voltage, $V_{bias}$ 27m. This trans-impedance $r_m$ transfer-function is set by the relative conductance ratio of the iFET source channel 23b to drain channel 25b as plotted in FIG. 3i. Here the conductance ratio is plotted along the-axis and the trans-resistance $r_m$ or more generally, the trans-impedance is plotted up the right axis. This plot 3i also plots the directly related iPort input resistance on the left axis.

Non-Inverting Nature

Regarding the iPort control terminal 21b as shown in FIG. 2b, in the case of an N-channel device, a positive current 20b on the iPort control terminal 21b, such an input displaces the current coming in through the upper channel 25b, causing the drain (output) connection 29b to move in a positive direction—thus the non-Inverting nature of the iPort 21b input.

Interestingly, unlike other semiconductor devices, a negative current 20b can be extracted from the iPort 21b, causing a drain (output) 29b shift in the negative direction.

Proper Bias

An iFET 200 (as shown in FIGS. 2a, 2b) has both gates 27a, 27b connected together and requires a proper bias voltage 22b on the gate 27a, 27b to establish the desired operating point.

Symmetry

A P-channel device can be constructed and behaves in a similar fashion to its N-channel counterpart.

It should be emphasized that while the gate input 27a, 27b is inverted with respect to the drain, the iPort 21a, 21b is NOT inverted in EITHER the PiFET or NiFET devices diffusion types with respect to their output drains.

The "Rule-of-Thumb" View:

Referring to FIG. 2d or 2j, the operation of the iFET transistor is extremely simple to think about; not much more than Ohm's law is needed, and it can be seen as followings:

A small + or − current input on the iPort results in a voltage out that is "K" times larger, but with the same sign as the input.
1. "K" does not change over an enormous dynamic range of operation.
2. "K" is on the order of 100,000, defined as trans-resistance ($r_m$) and can be viewed as a simple functional block shown in FIG. 2g. $r_m$ units are ohms which is $V_{out}/I_{in}$. $r_m$ of FIG. 2g represents the transfer function of the iPort control terminal of an iFET in accordance with the present invention.
3. The $r_m$ block in FIG. 2g is the "dual" of the $g_m$ block in FIG. 2f, which defines the normal MOSFET transfer function. Accordingly, current and voltage have been interchanged, and thus $r_m$ as shown in FIG. 2g can be viewed as a simple resistance in ohms, while $g_m$ as shown in FIG. 2f is conductance in units of 1/ohms.

The $r_m$ circuit of FIG. 2g has low impedance on both the input and output while the $g_m$ circuit of FIG. 2f has high impedance on both the input and output. The benefits of the $r_m$ iFET circuit of FIG. 2g are essentially zero voltage swing at the input and all the output current drive required to establish the output voltage, yielding parasitic capacitance insensitivity on both the input and output, thus very high speed. The resulting $r_m$ circuit of FIG. 2g through 2j is essentially constant with frequency and operates with much lower power supply voltages than the $g_m$ circuit of FIG. 2f, in that the trans-impedance $r_m$ iFET device's operation is basically not threshold voltage limited. The power supply voltage does not stop at the sum of threshold voltages or a threshold voltage and a saturation voltage as in prior art analog circuits, but functions well below 600 mv and operates usefully down to a millivolt of power supply voltage. Gain typically hits its maximum in the range of 600 mv to 1.0 volt of power supply voltage. Clearly not threshold voltage limited. Many of the iFET benefits are worth the trouble of re-thinking the approach to analog MOS circuit design.

The useful power gain is partially realized as current gain. Although MOS circuits are perceived as voltage mode circuits, analog MOS circuits work much better as current or charge controlled circuits. After all MOS transistors operate on the instantaneous charge in their channels and do so with great precision as seen throughout this specification.

The iPort input terminates in a non-varying, low value resistance (typically 50Ω-50 kΩ depending on design). The circuit allows matching an antenna impedance for maximum power transfer into the iPort input.

The output is a voltage source with a low driving impedance, providing the load with whatever current is required to establish the desired voltage with precision.

Additional iFET observations of the present invention are as follows:

$r_m$ does not change over the entire operating range from near clipping, all the way down to the noise floor. AC performance of an iFET is FLAT from DC to faster than logic speed. Analog voltages only move a little while logic has to get unstuck from one rail and go all the way to the other power supply rail.

The iPort control terminal, being a current input, is free of voltage derived parasitic effects because the iPort control terminal has very minimal voltage change.

Figure 3B:
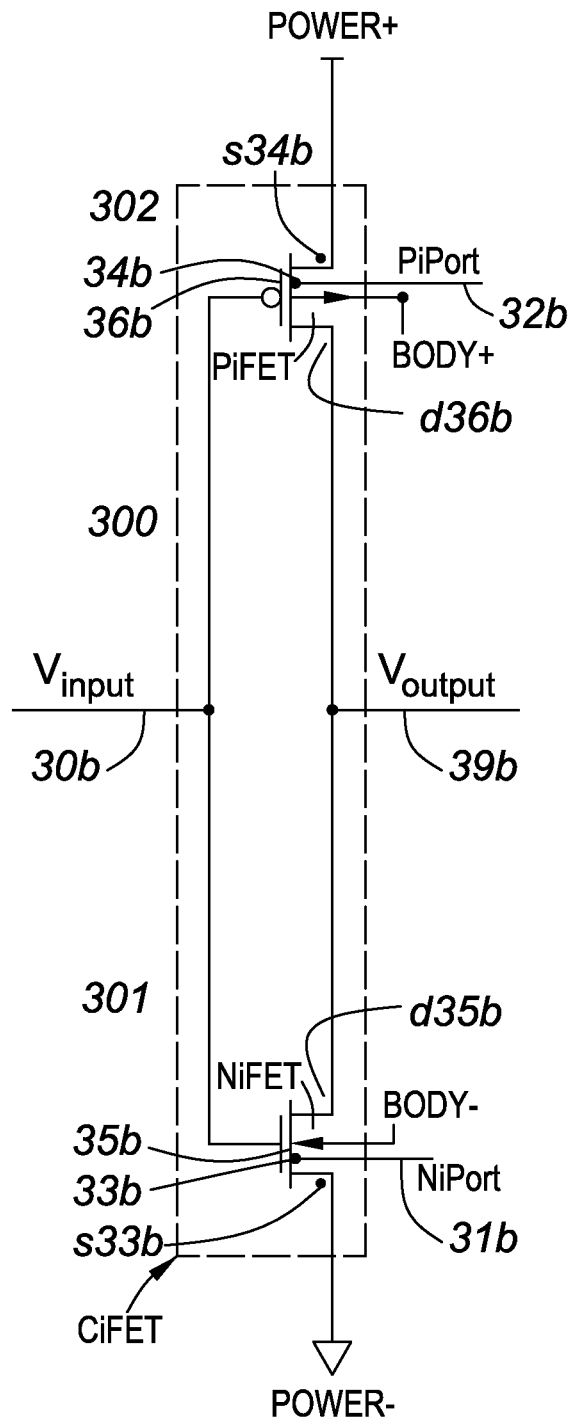
Figure 3C:
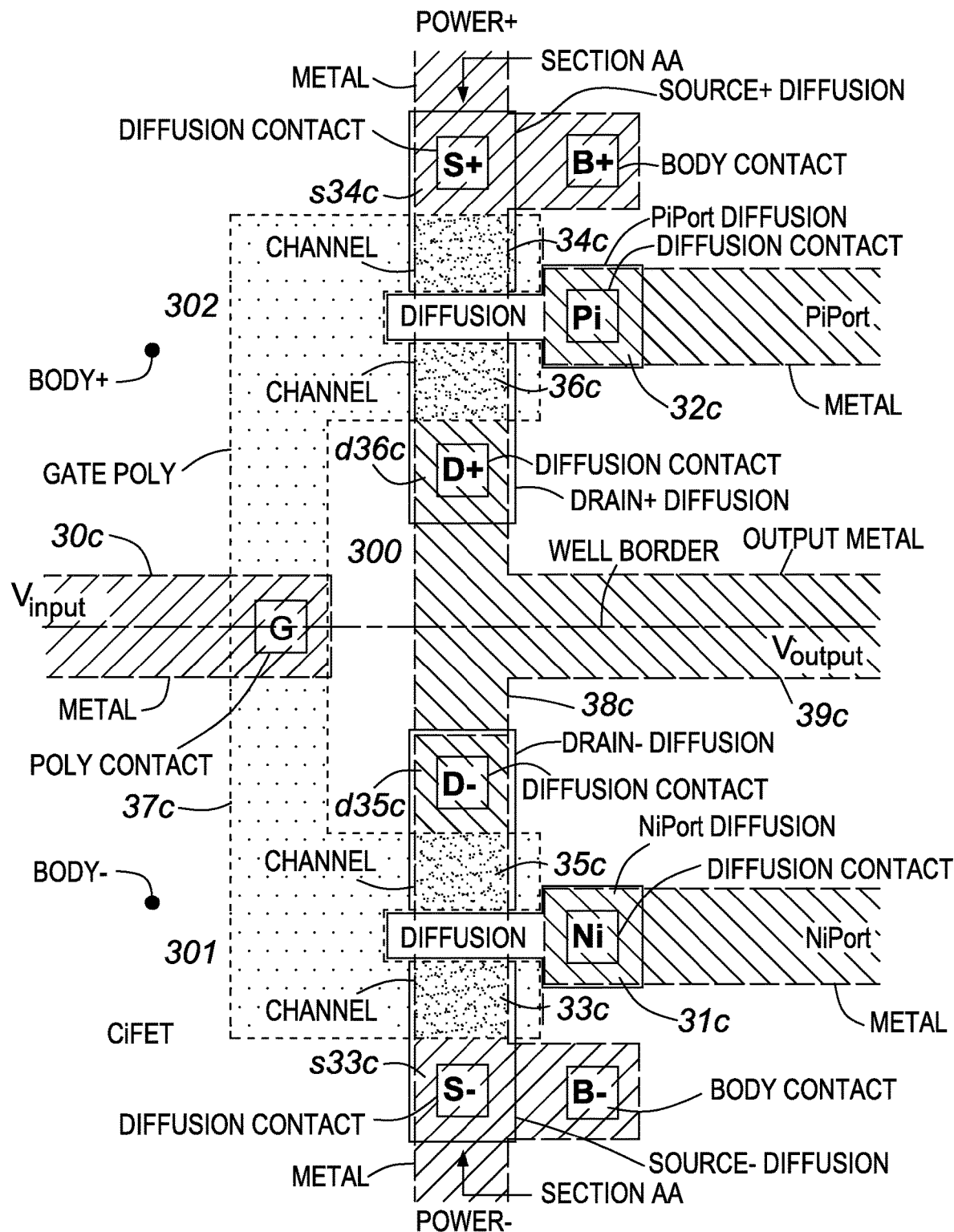
Figure 3D:
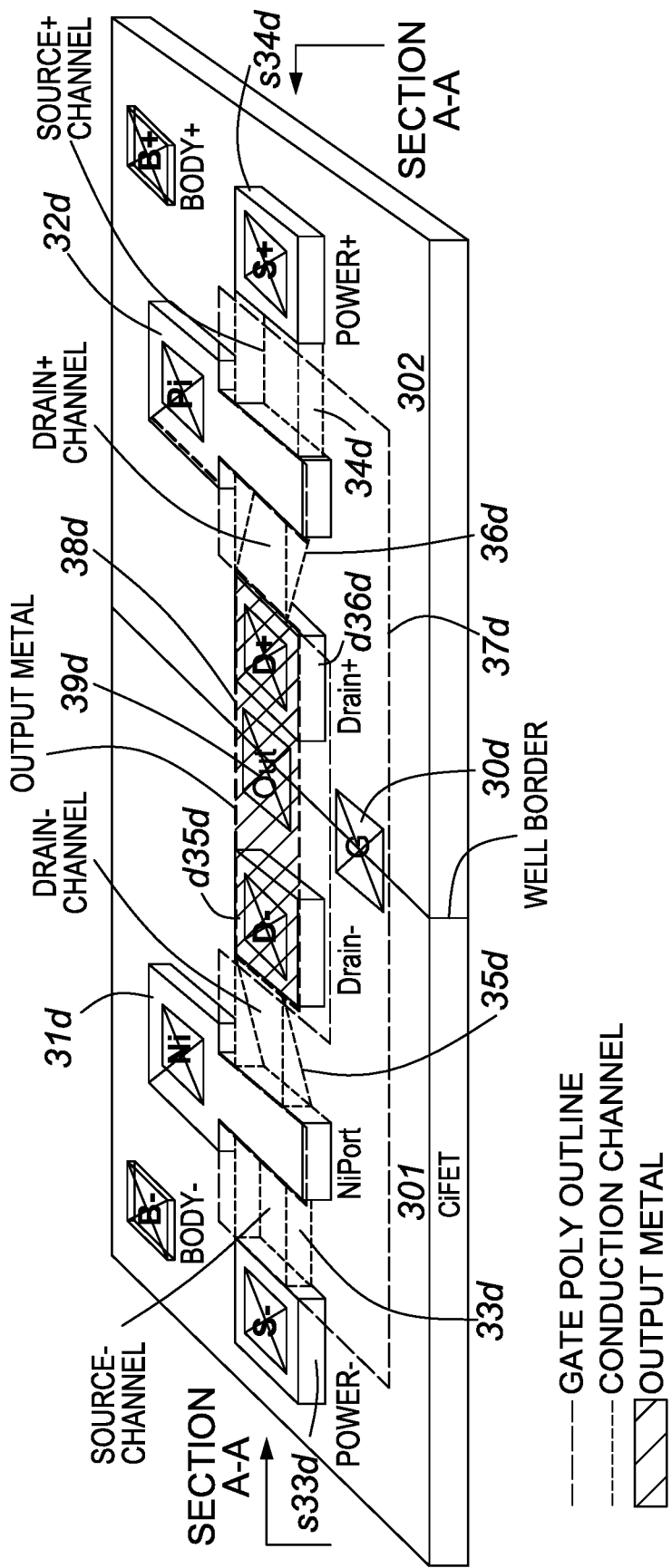
Figure 3E:
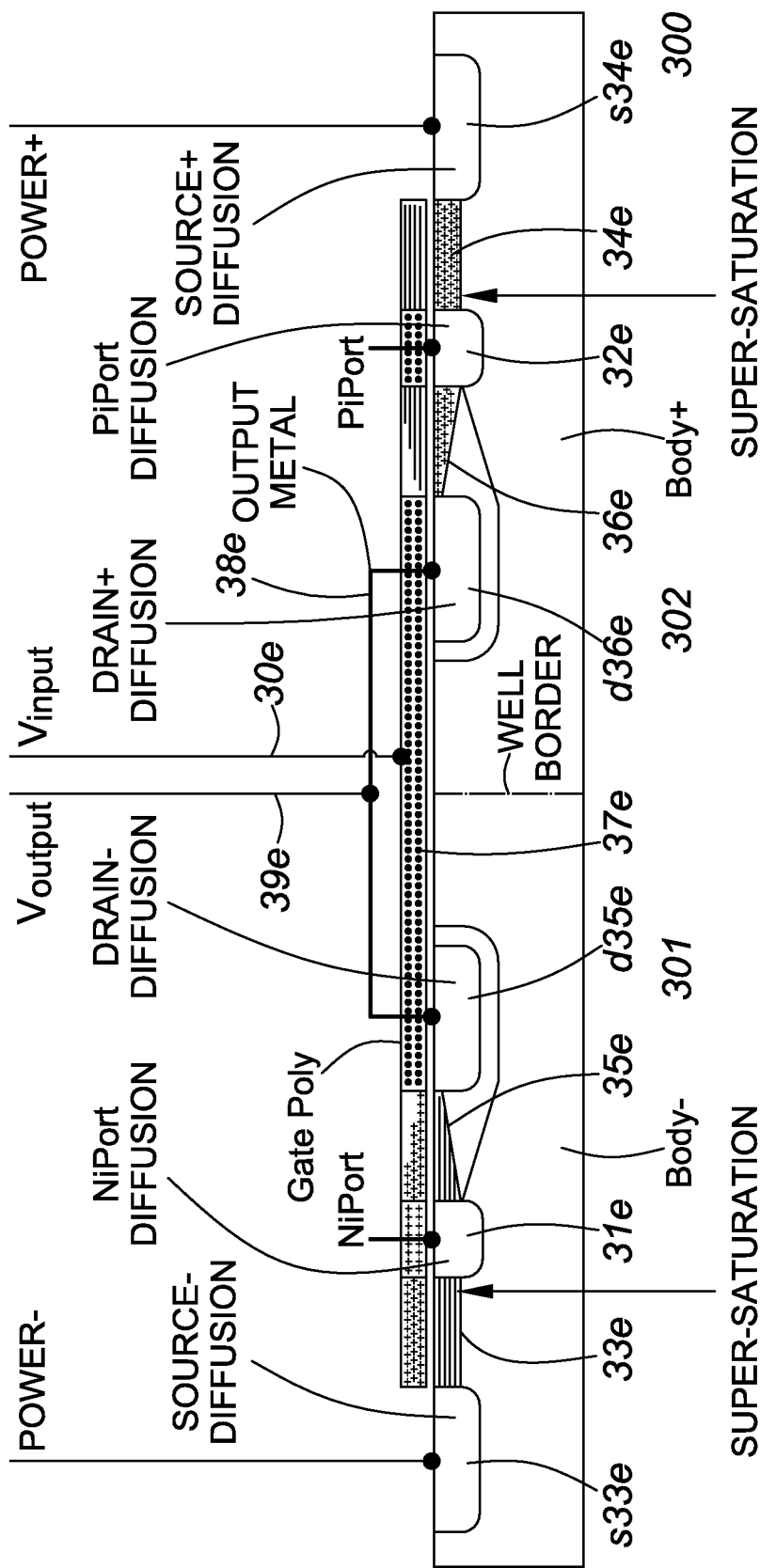
FIG. 3e illustrates cross-sectional view at Section AA of FIG. 3d.
Figure 3F:
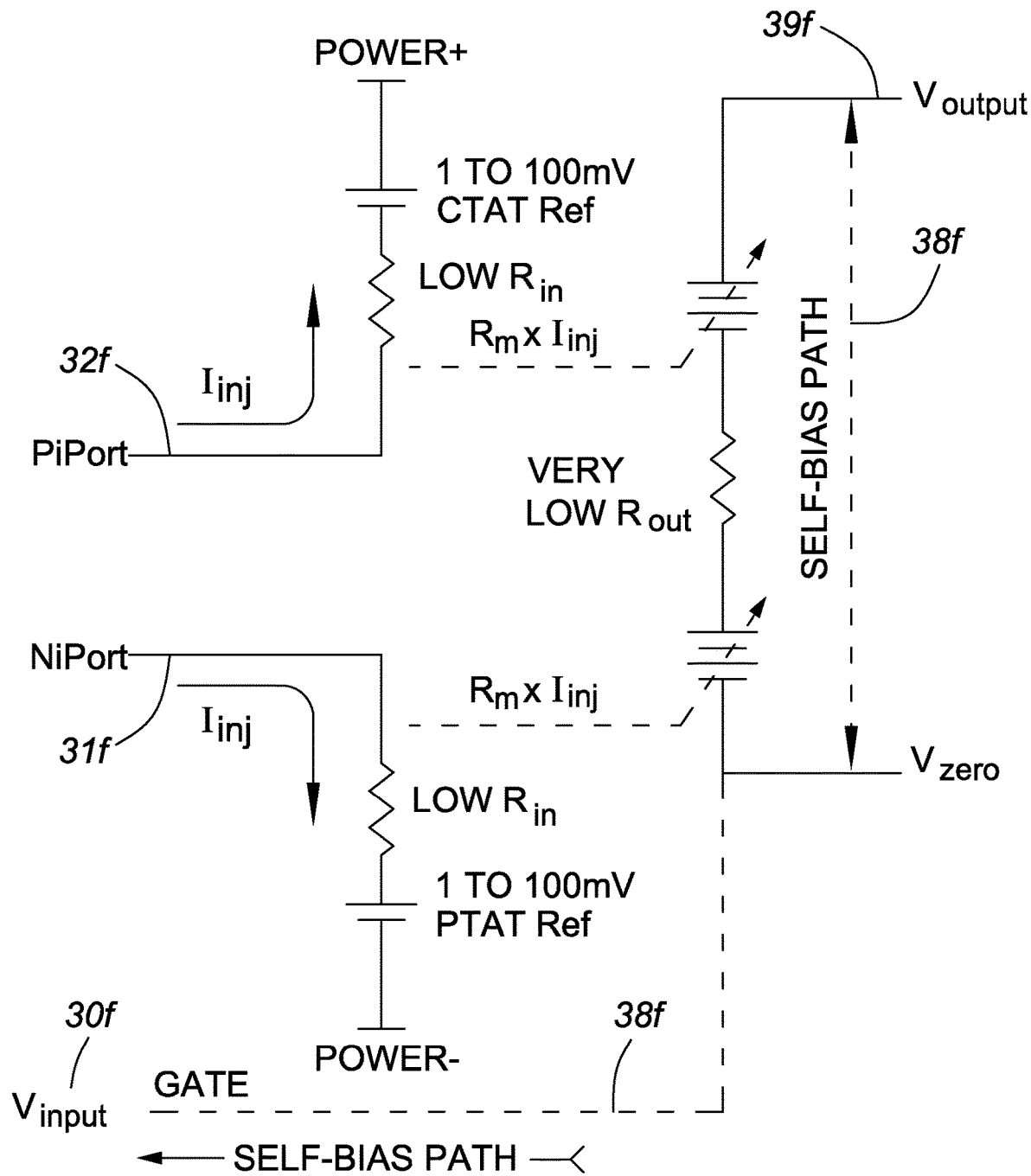
FIGS. 3f and 3g illustrate a CiFET operational modeling and a suggested schematic symbol therefor.
Figure 3G:
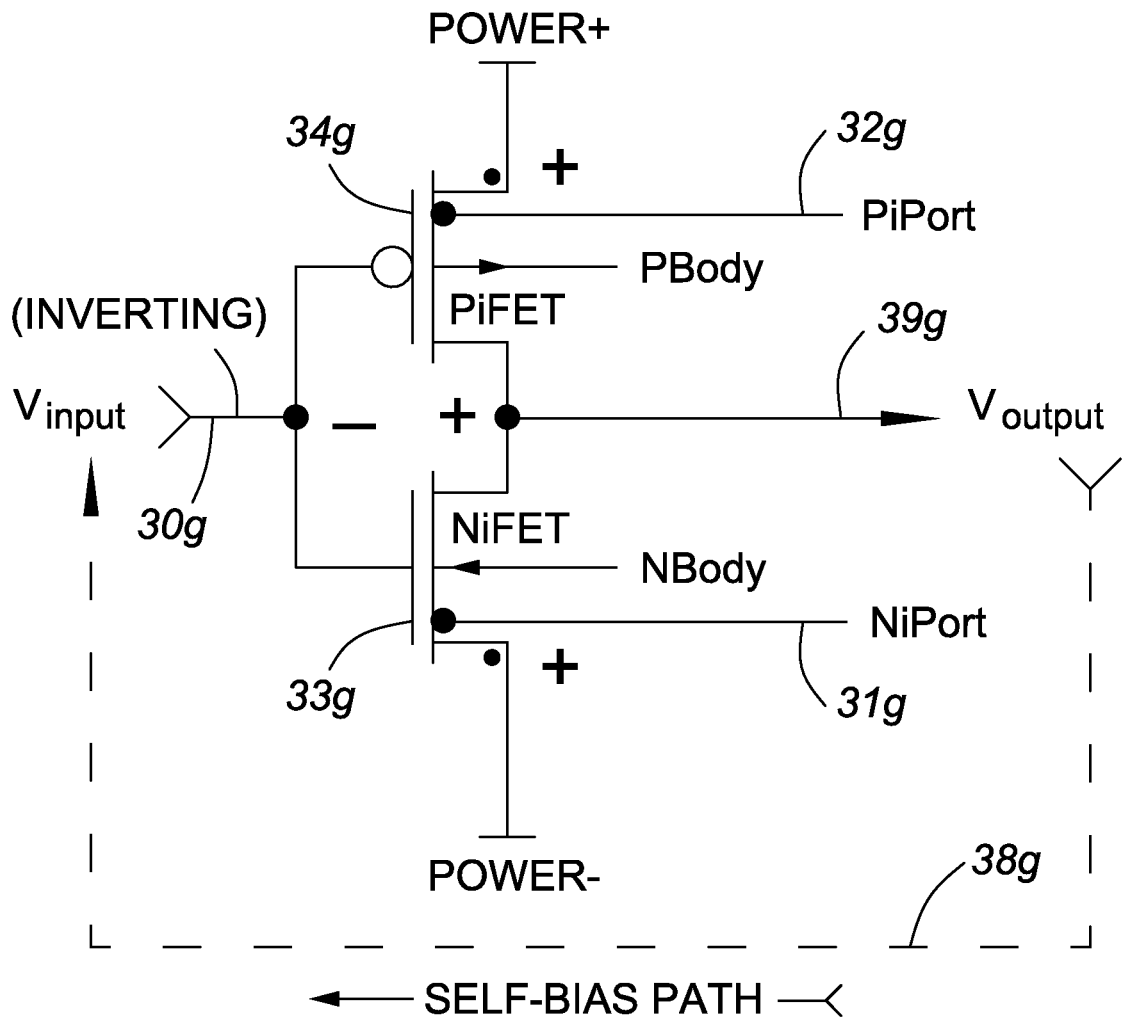
Figure 3G:
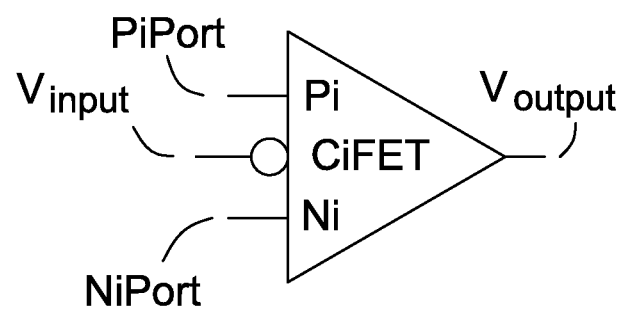
Figure 3I:
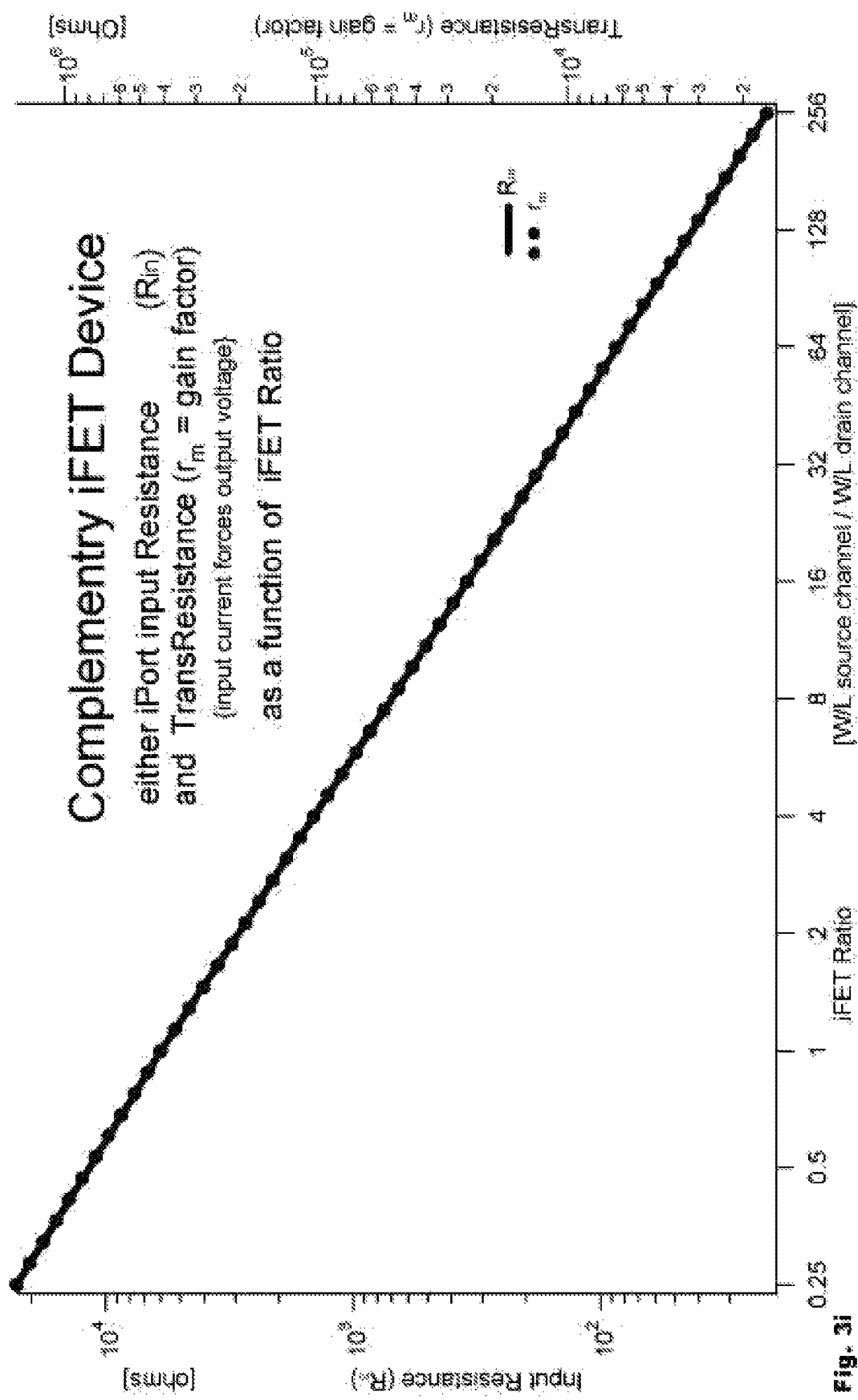
Figure 3I:
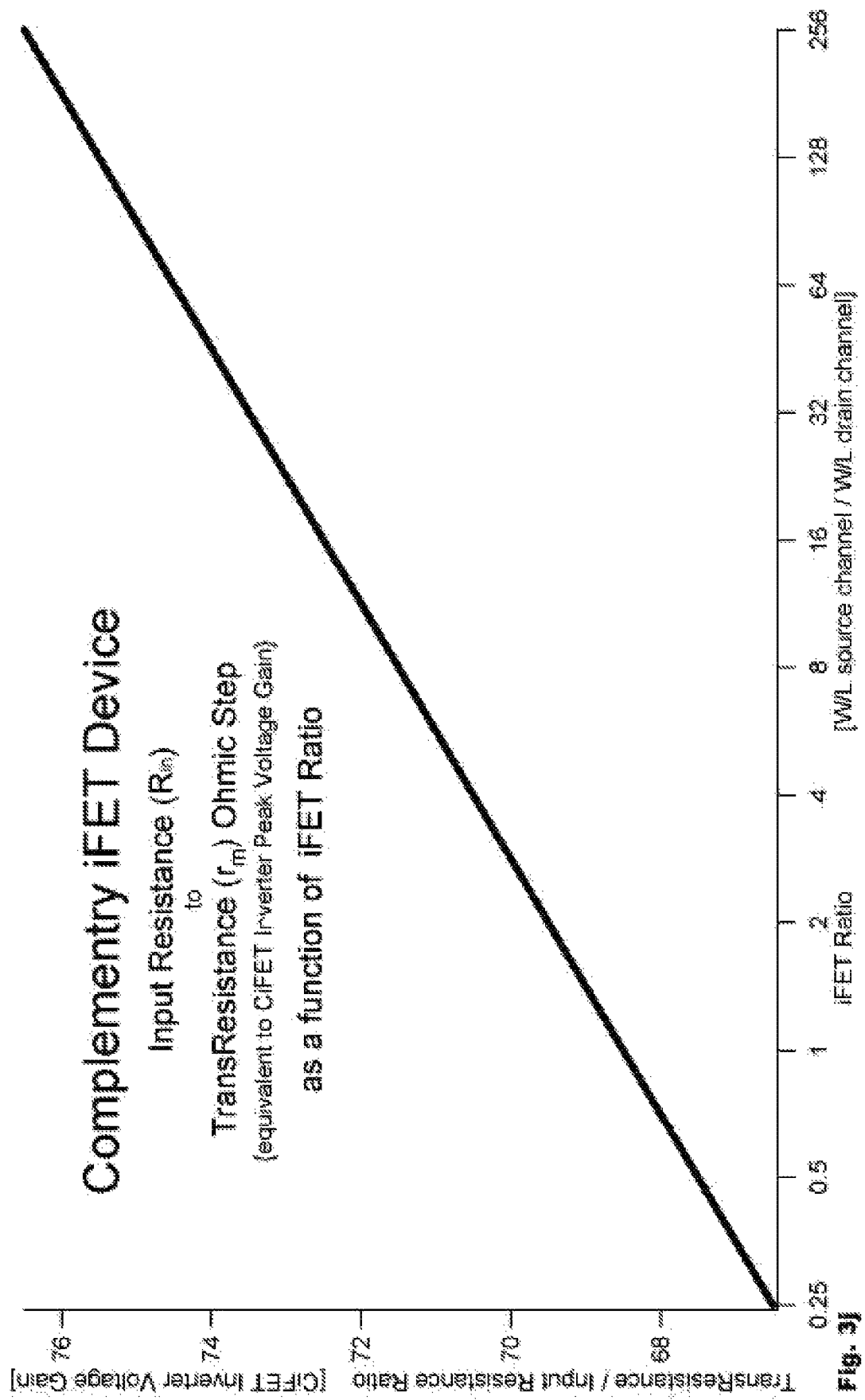
Figure 3K:
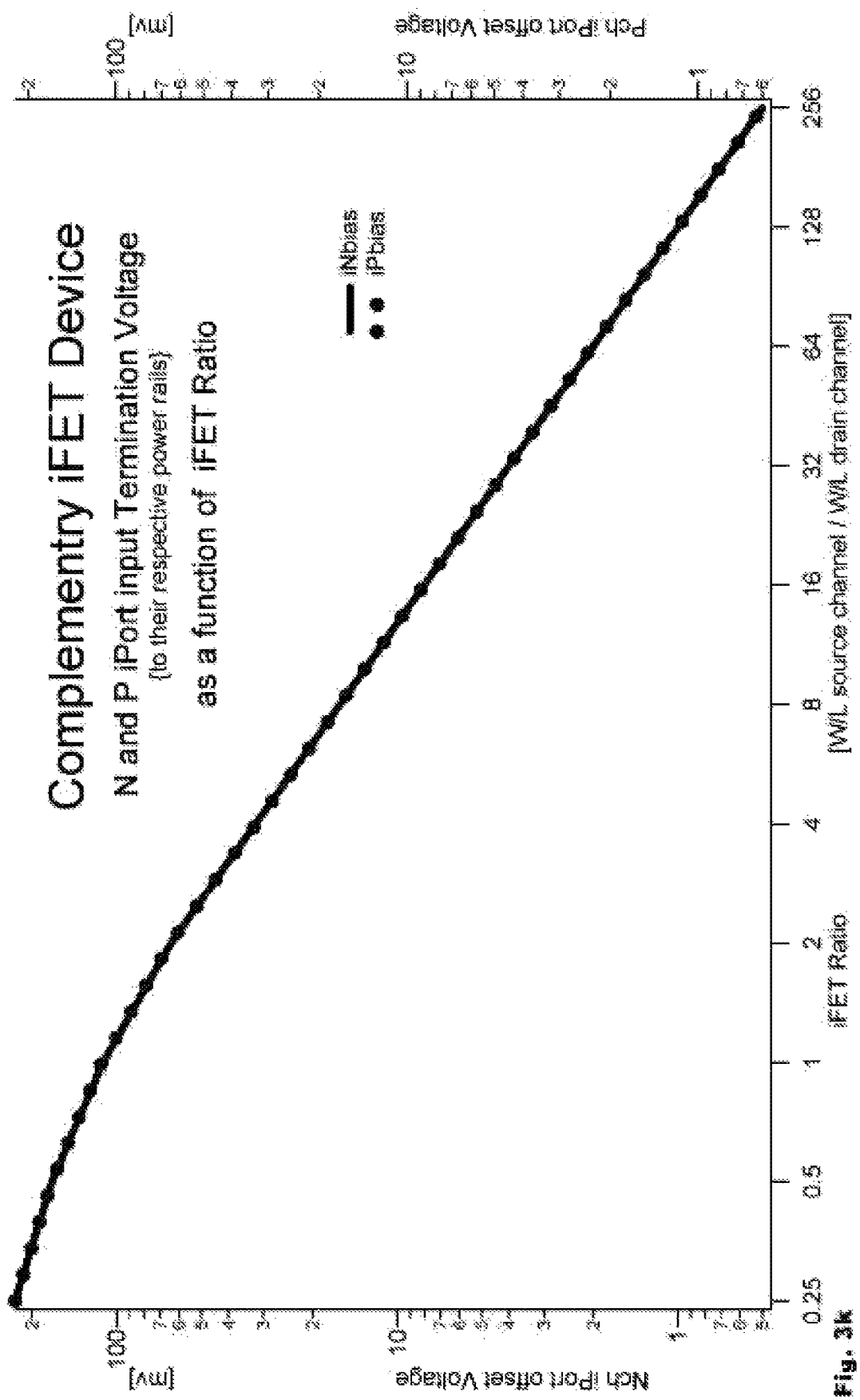

FIG. 3k shows the input termination voltage at iPort control terminal from ½ mv to about 100 mv, depending on the iFET ratio (or input impedance), from its respective power supply rail, allowing a high compliance voltage from the other rail to bias the input such as desirable for transducer or some other input circuit.

The iPort termination voltages are either a PTAT or a CTAT (proportional to absolute temperature or the complementary to absolute temperature) bandgap reference depending on the N or P semiconductor diffusion type respectively.

The output in the complementary CiFET configuration swings around the self-bias midway voltage ("sweet-spot") between the power supply rails, where it is free of power supply induced noise. Power supply induced noise cancels with this "sweet-spot" as the analog-zero reference.

The advantages of operating circuits in "weak-inversion" have long been known but, so also have the problems. The iFET enables circuits to exploit the high gain and wide dynamic range available in "weak-inversion," without sacrificing superior speed performance.

In the "Behavioral Model" FIG. 2j the iPort current is converted to a voltage by a resistance ($r_m$), whose value determines the gain. This "trans-resistance" ($r_m$) is established by the ratio of the "drain channel" to "source channel" conductance, and remains constant throughout the entire operational range. Simulation has shown this resistance ($r_m$) to typically be in the range of 100,000Ω, set by the relative channel sizing. $r_m$ is the dual of $g_m$, but with more control.

a. The output is a low-impedance source follower that can deliver its voltage with all the necessary transient current to drive the next circuit and capacitive load to get there.

b. The input is a constant low resistance termination (related to $r_m$ but much lower) with a constant termination voltage of about 100 mv from the respective power supply rail. This offset voltage is a "bandgap" reference, established by the ratio of the "drain channel" to "source channel" conductance.

Figure 1G:
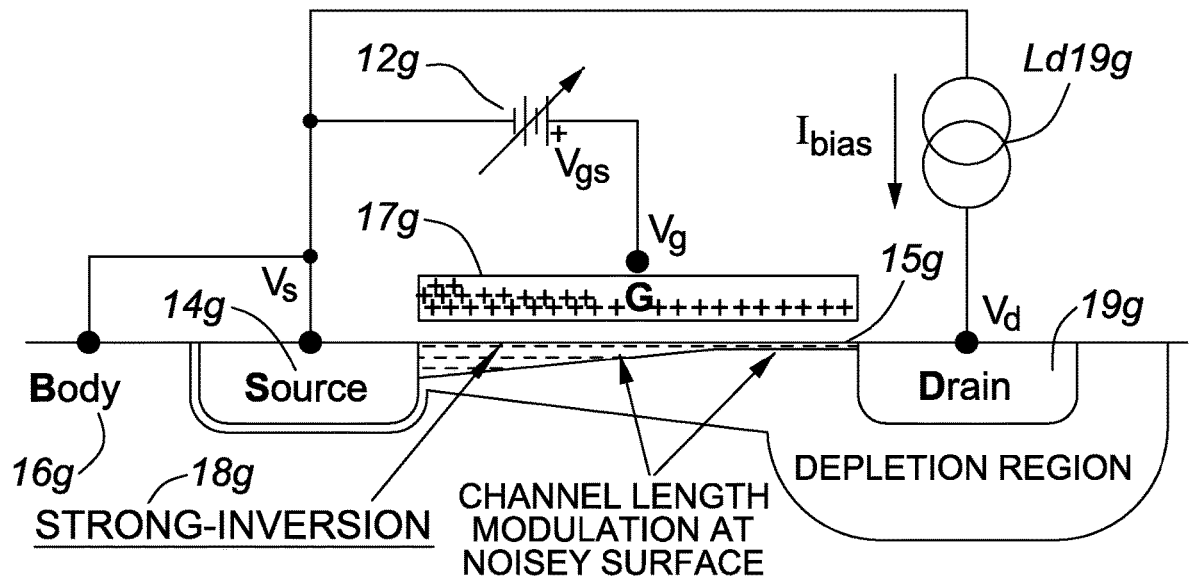
Figure 1H:
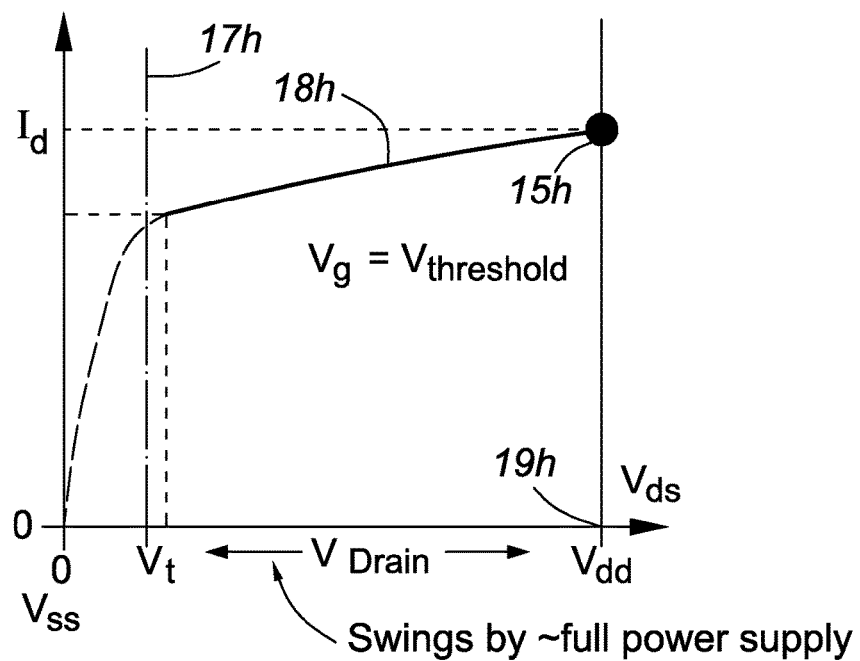
Figure 1I:
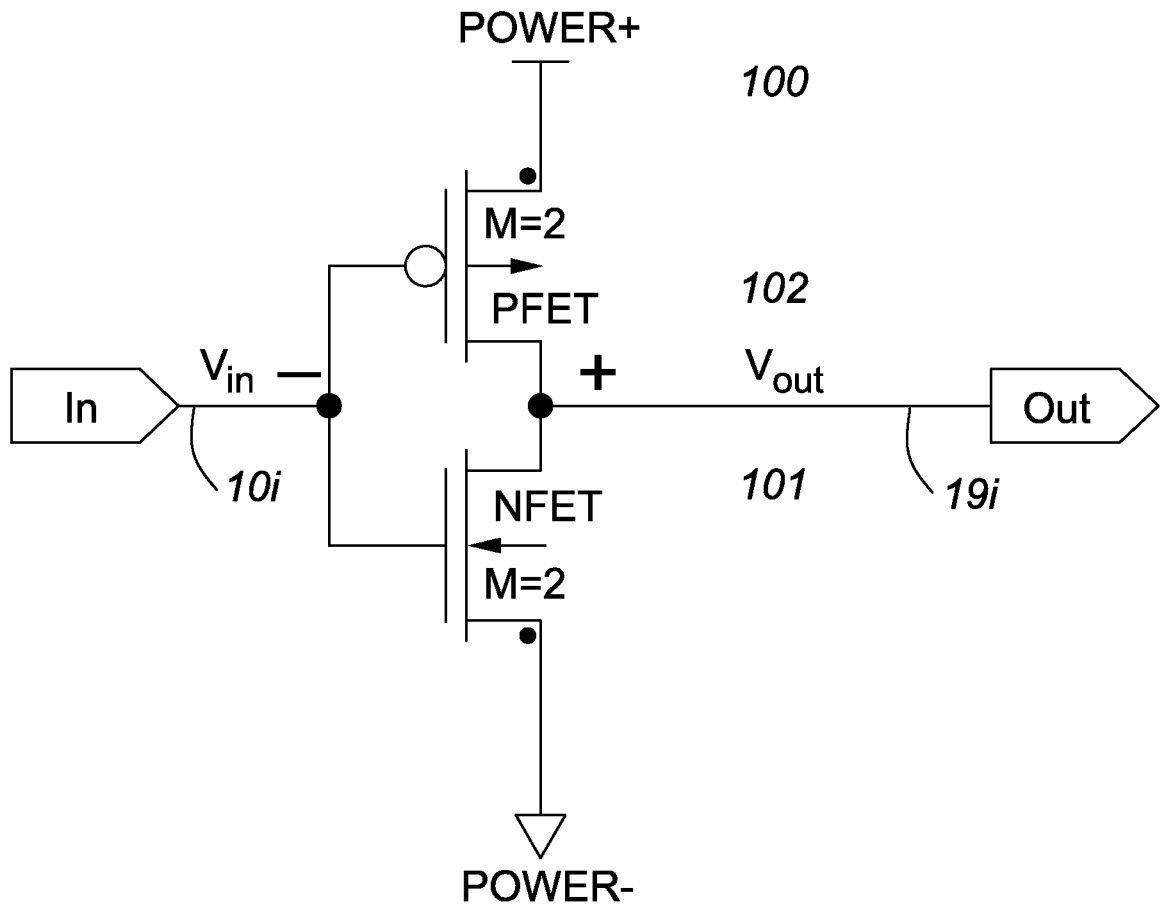
FIG. 1i shows schematic diagram of a prior art 2-finger invertor.
Figure 1J:
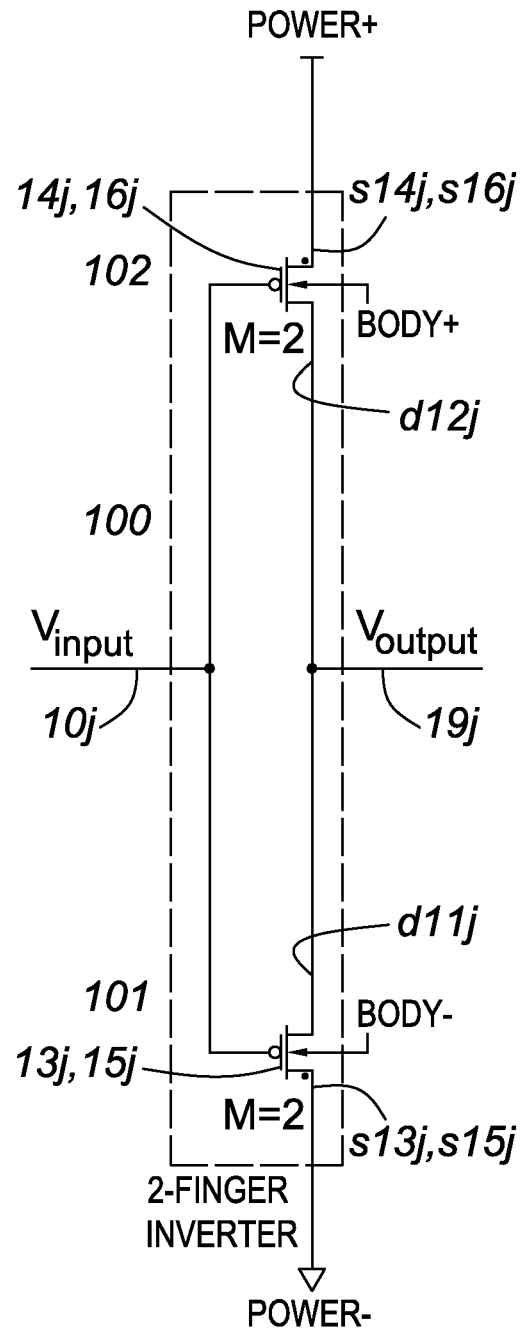
FIGS. 1j and 1k show physical layout abstractions of the 2-finger inverters shown in FIG. 1i.
Figure 1K:
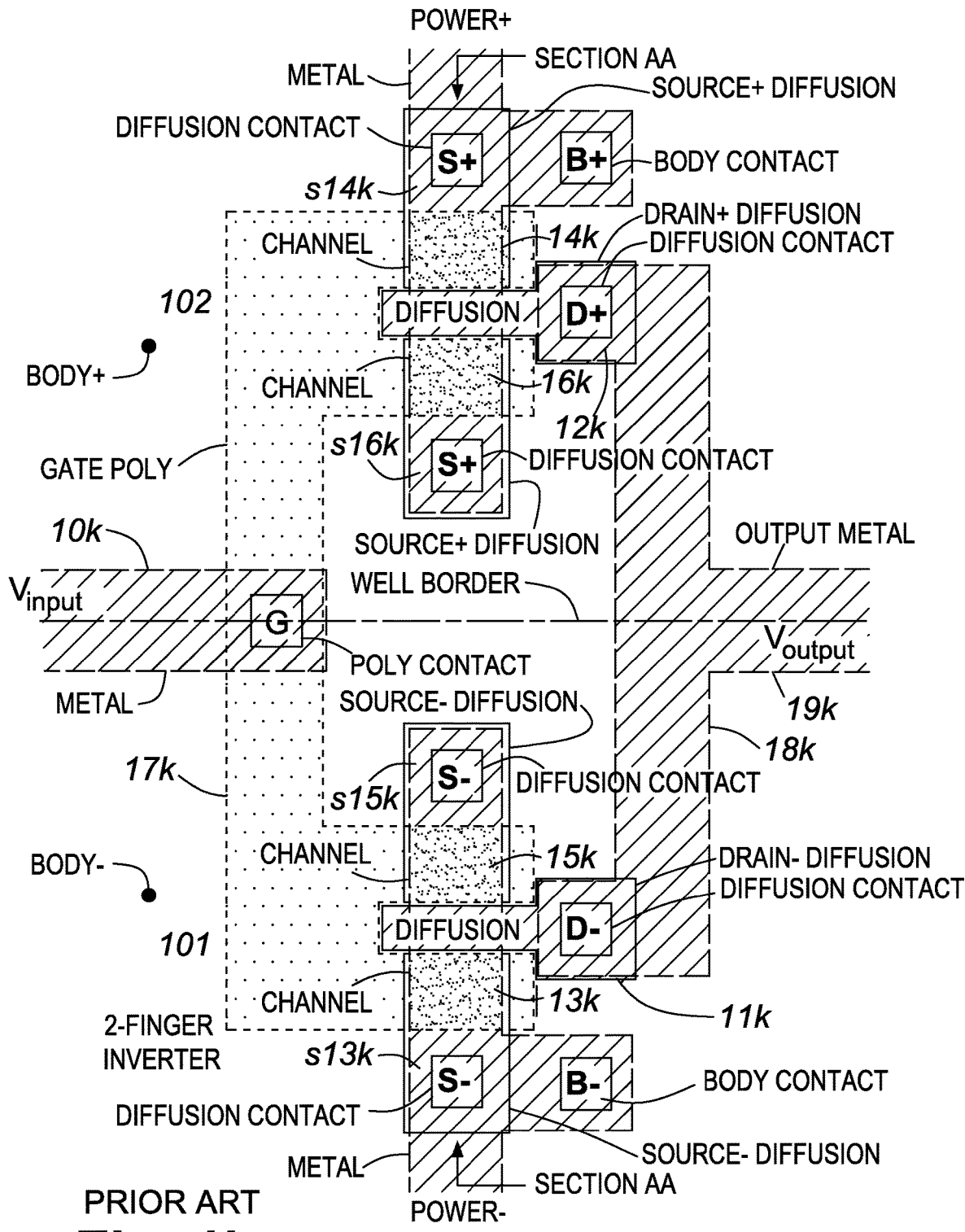
Figure 1L:
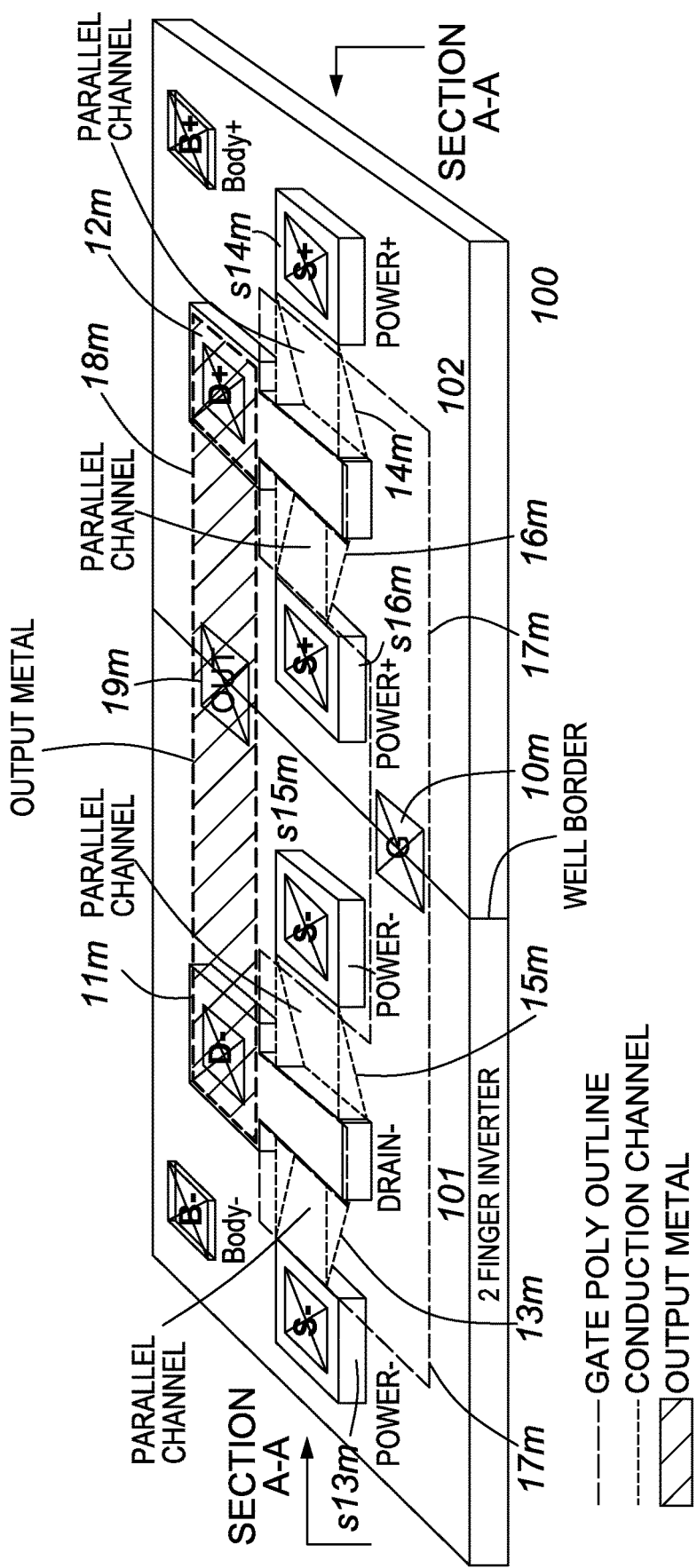
FIG. 1L shows a three (3) dimensional perspective view of the 2-finger inverter of FIG. 1i.

The CiFET Amplifier is the Basic Analog-in-DIGITAL Building Block:

The complementary nature of a CMOS inverter of FIG. 1i is of interest for processing analog signals. If the inverter output is tied back to its input, it self-biases near the midpoint of power supply voltage. Care, of course, must be taken to size the individual transistors weakly enough as to not exceed what the IC process can handle, such as maximum current the contacts are rated for in both their AC and DC ratings. Local temperature rise is also a consideration, but self-biasing combats temperature degradation.

When sized with similar pull-up conductance to pull-down conductance, the self-bias point is nicely centralized between the power supplies where noise from both the positive and negative power supplies tend to cancel. The variation in process parameters will move this midpoint voltage around a bit, but it is always relative the transistor conductance ratios. At this midpoint, the gain is arguably at the maximum available for the pair of transistors used. In addition, the pull-up performance is equal to the pull-down conductance yielding symmetric DC, AC, and transient response in either direction. The effective threshold voltages cancel each other out in that the circuit always works at its best. The AC bandwidth performance of this conventional inverter is extremely wide as compared to any analog circuit configuration as illustrated in the Bode Plot of AC Gain and Phase in FIG. 3t. You get the most bang for the least amount of parasitic loading. For the 180 nm IC process used as a comparison baseline, the 3 db gain is about 1.2 GHz with a phase shift of about 45 degrees from DC. One would be hard pressed to run equivalent low power logic at 1 GHZ in the 180 nm reference technology using a minimum power logic family.

Figure 3L:
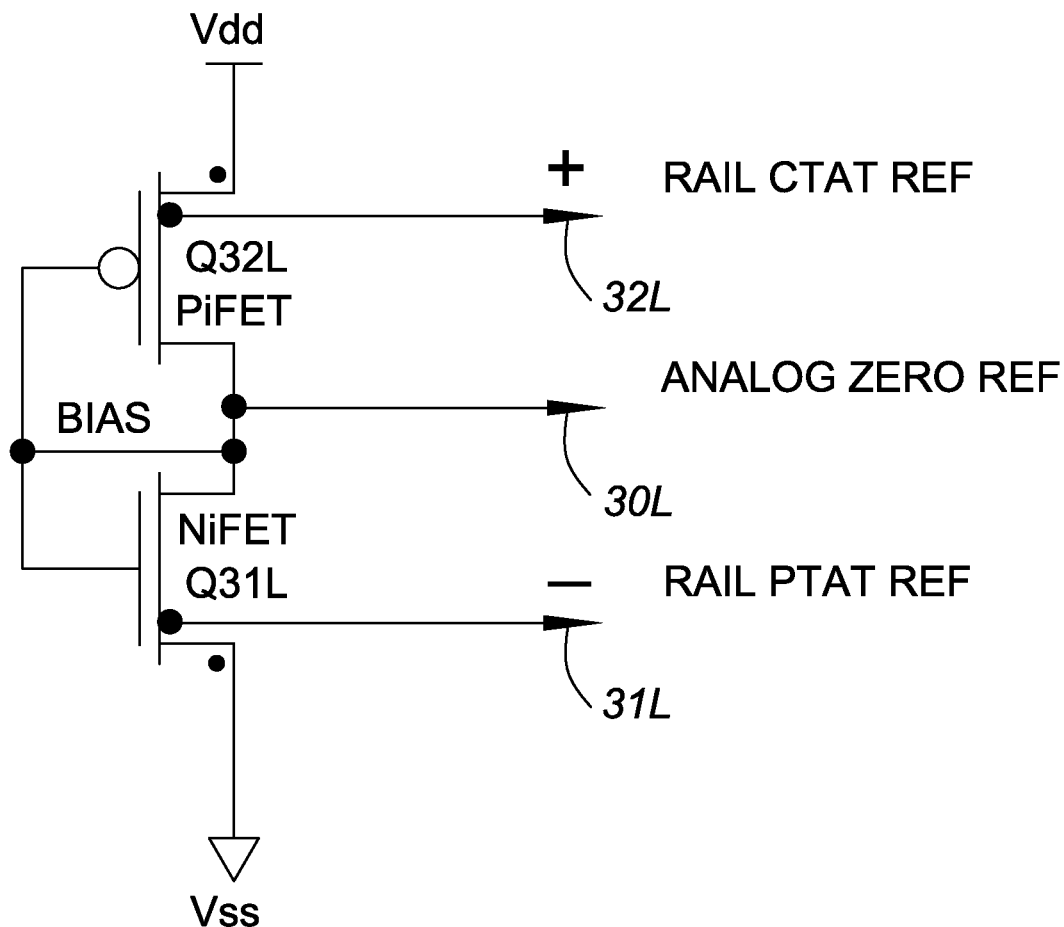
FIG. 3L illustrates the availability of self-biased reference voltage terminals.
Figure 3M:
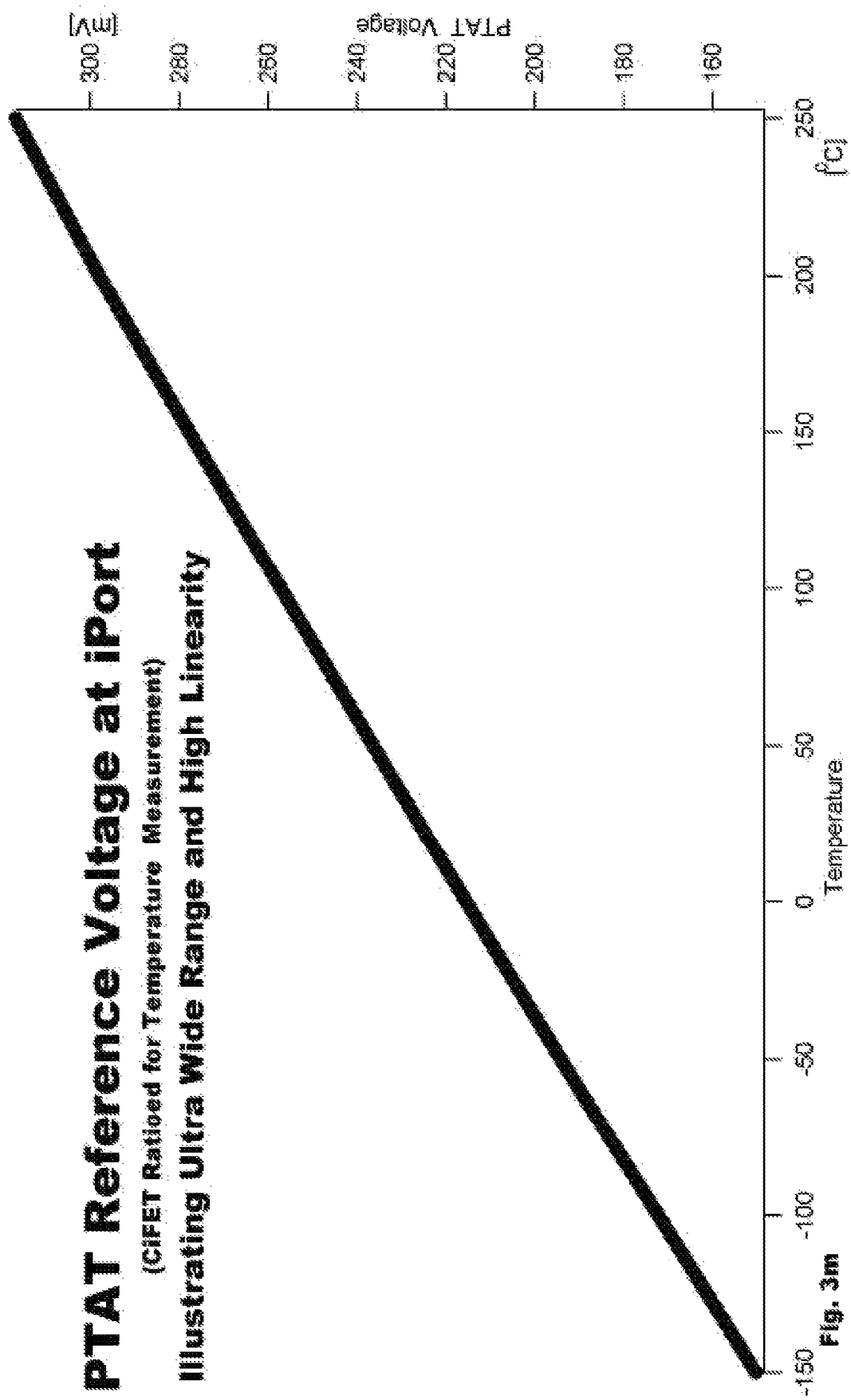
FIG. 3m illustrates the wide range and linearity of the PTAT temperature measurement characteristics of the PTAT self-biased reference terminal of FIG. 3L.
Figure 3N:
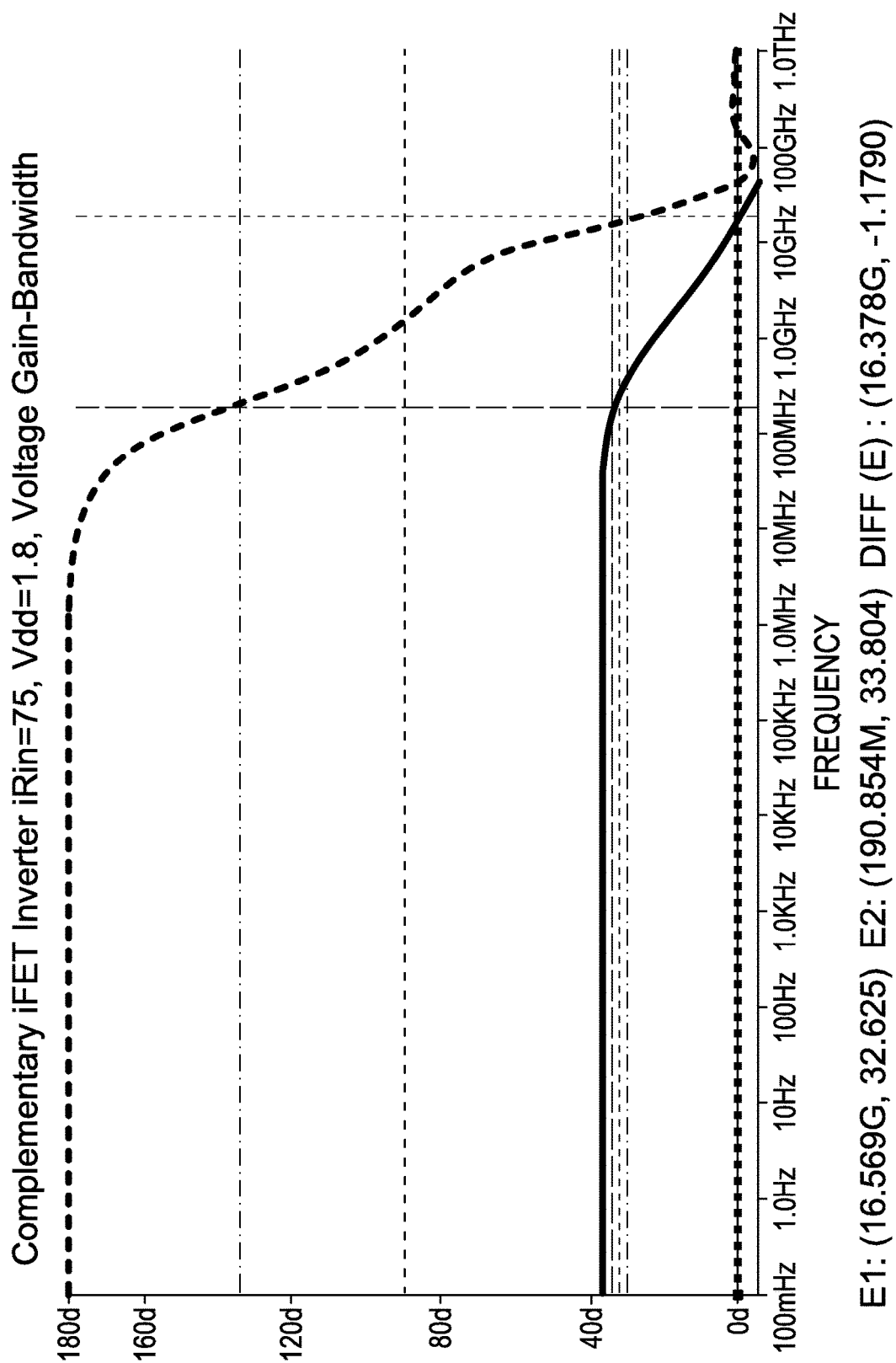
Figure 3P:
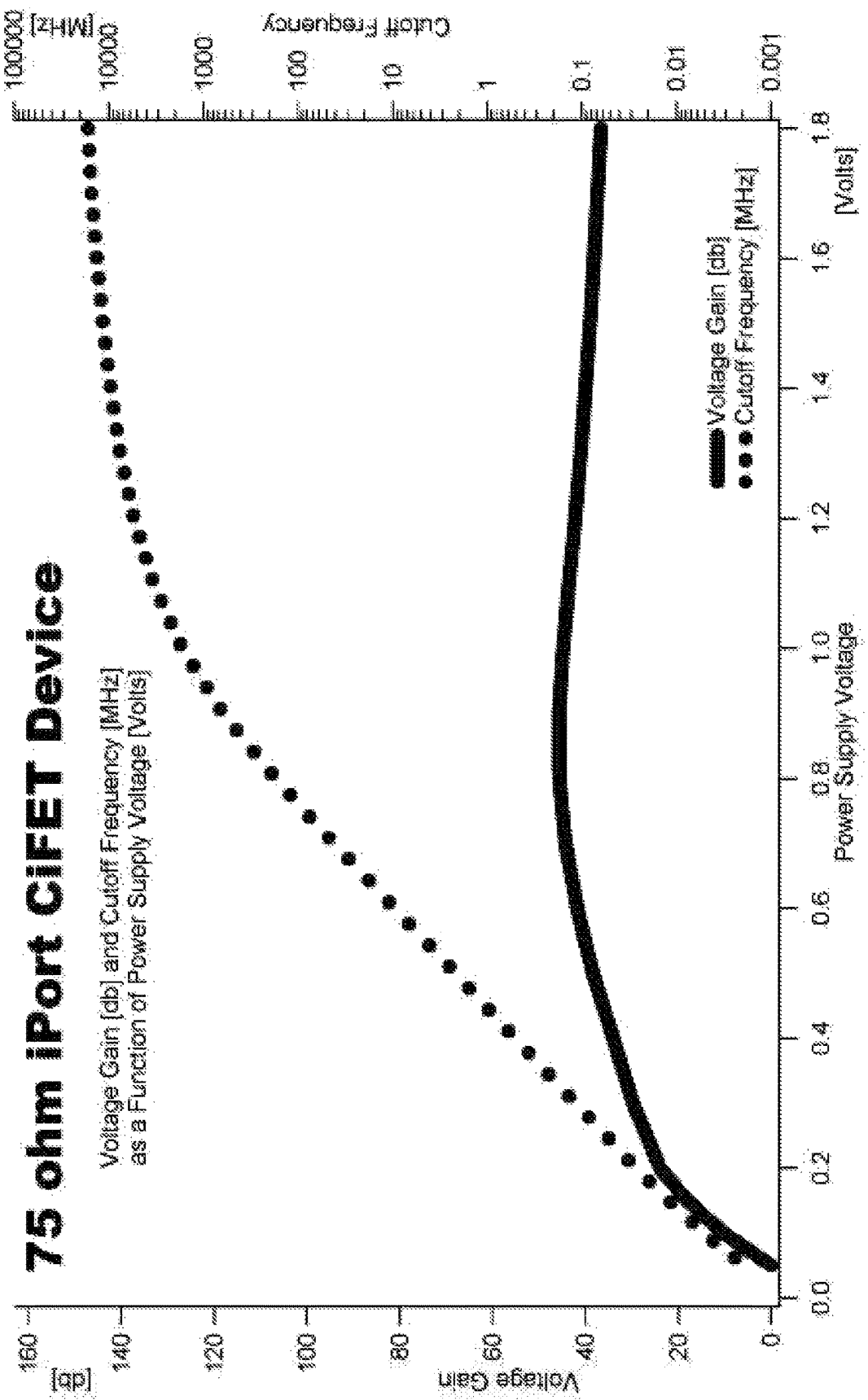
Figure 3Q:
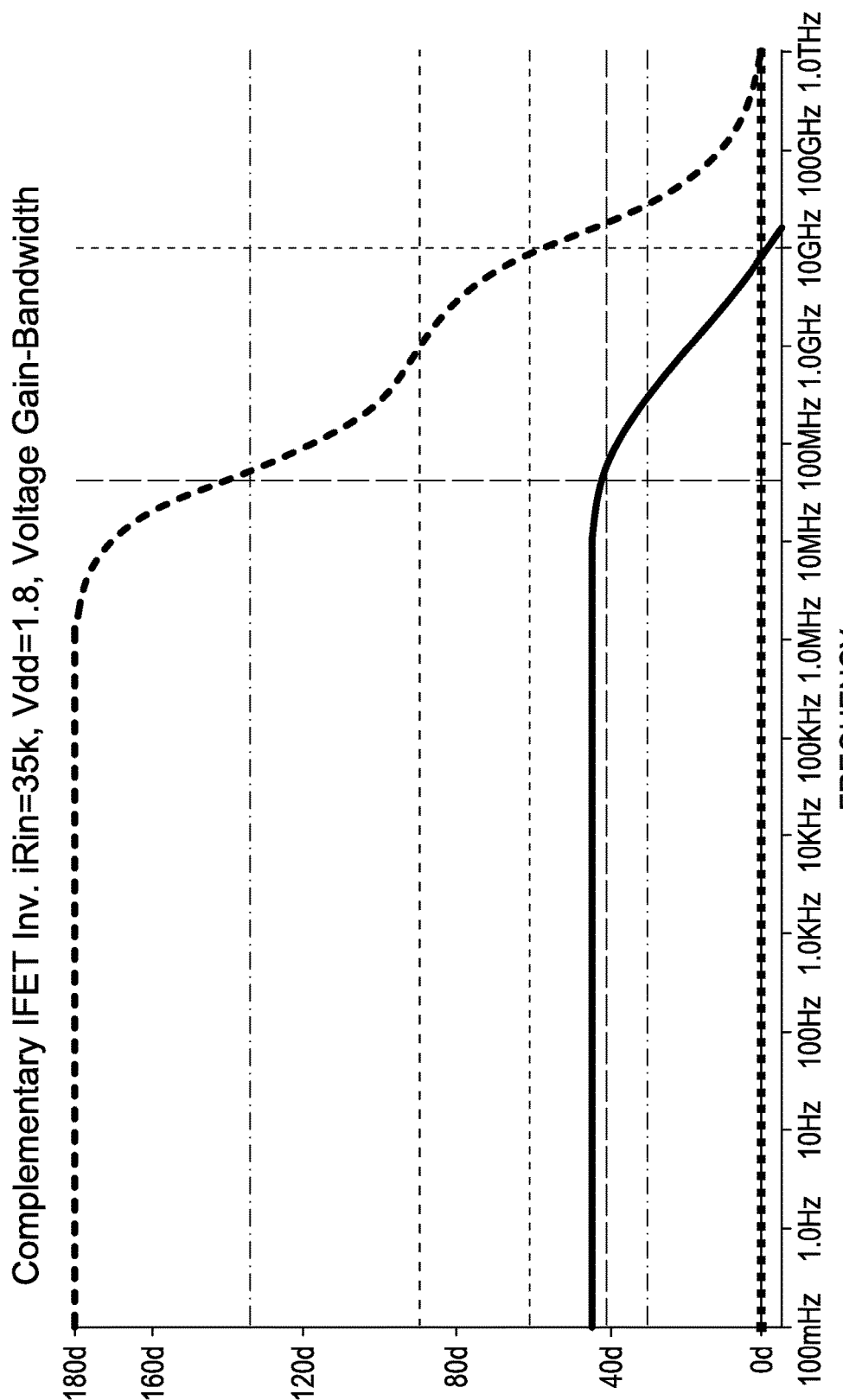
Figure 3R:
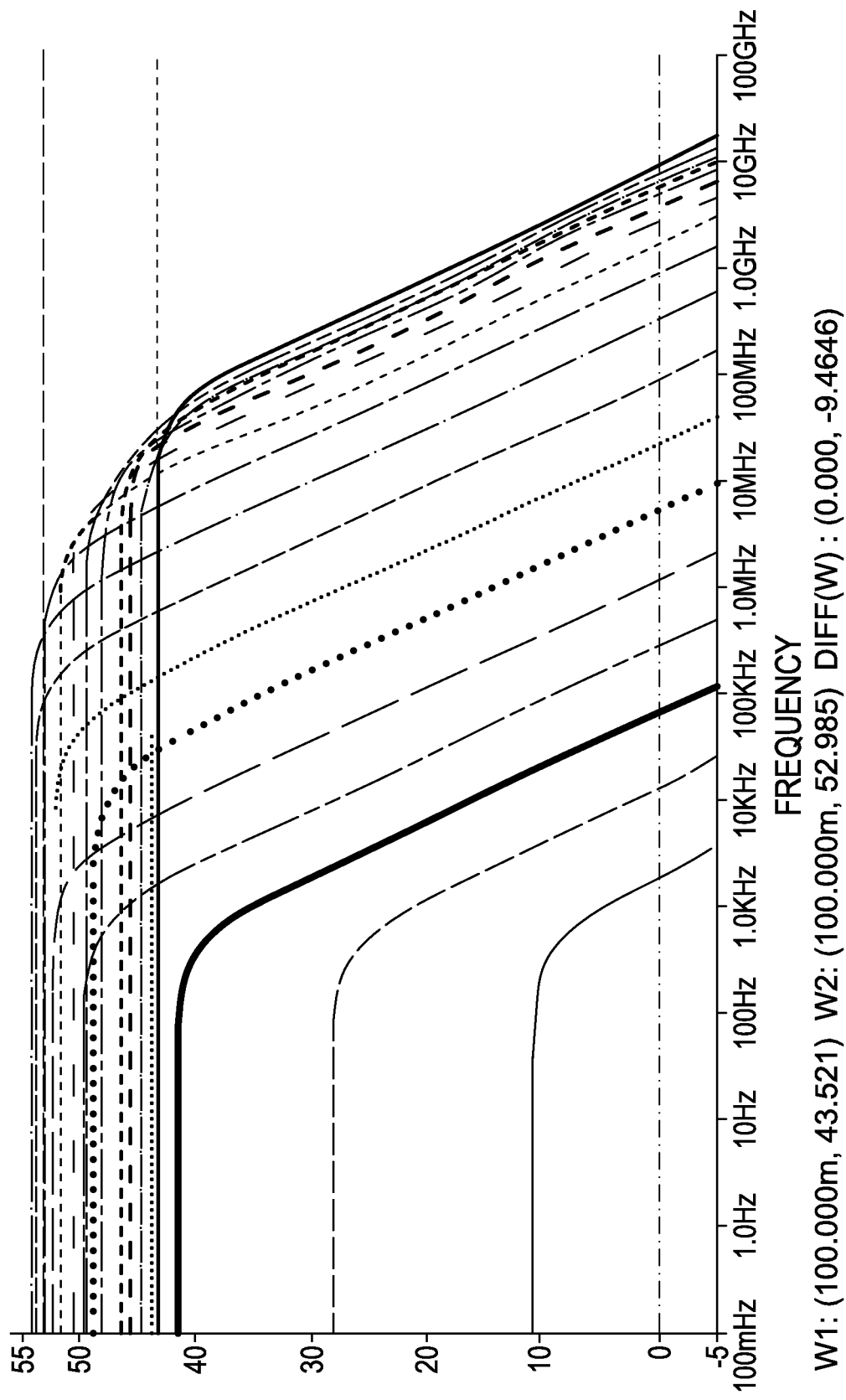
Figure 3S:
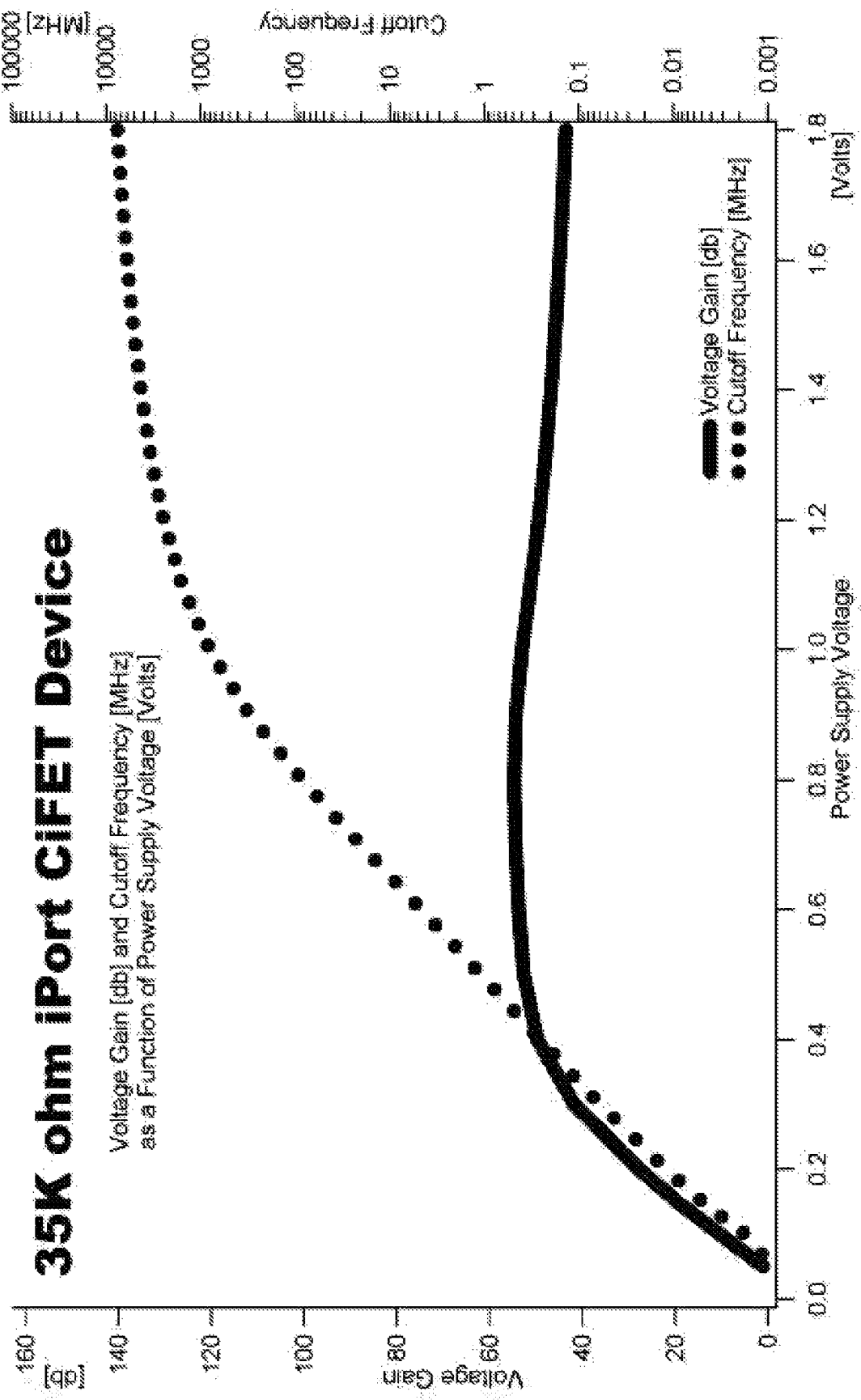
Figure 3T:
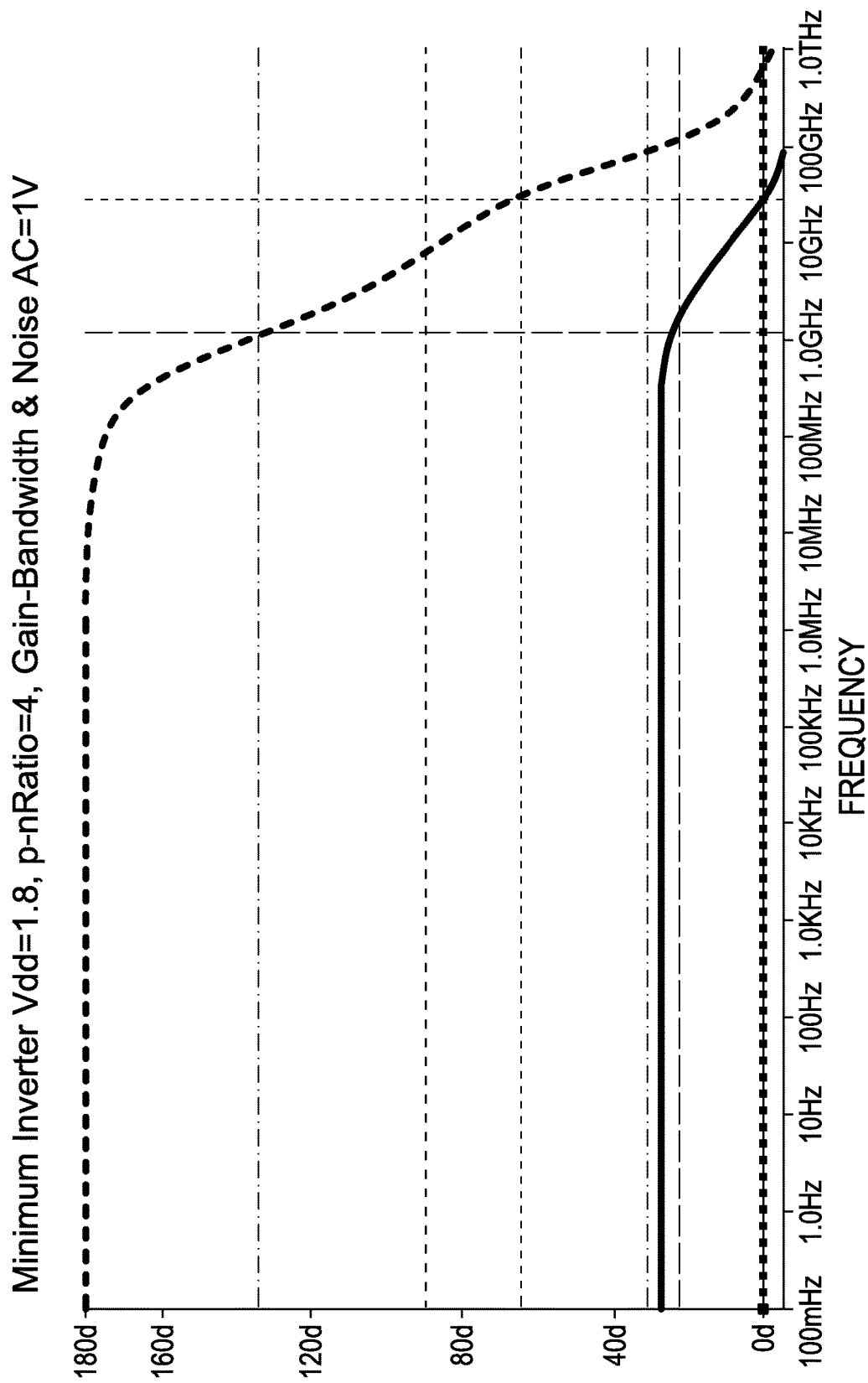

A primary limiting factor to the use of a logic inverter for an analog voltage amplifier is that the logic inverter has only about 25 db or 18× of voltage gain available with a single inverter stage, as illustrated in the standardized Bode gain-phase plot of FIG. 3t. The required minimum analog voltage gain has to be at least 80 db or 10,000×. The voltage gain defines how well the analog output signals reach their desired amplitude.

Closed loop analog voltage amplifiers require inverting gain so that the output feedback can move the input back to a virtual ground input voltage. Without the amplifier being inverting, the positive feedback would result in a latched output, like a flip-flop when the feedback loop is closed. Using a series of say three inverters is virtually impossible to stabilize with any frequency response left over in a closed loop application, which is essential for practical analog amplifiers.

While a single iFET has interesting characteristics on its own, a complementary pair of iFETs prove to be much more beneficial. The resulting device is arguably the highest possible power gain and widest bandwidth use of FETs possible. FIG. 3a is the schematic diagram of such a complementary pair of iFETs herein named CiFET for complementary current input field effect transistors. This is the core of the present invention.

FIGS. 3b and 3c structurally relate the CiFET transistor 300 schematic diagram of FIG. 3b to the adjacent physical layout abstraction of FIG. 3c. The NiPort 31b of the NiFET transistor 301 in FIG. 3b relates to the NiPort 31c in the physical layout abstraction of FIG. 3c. The PiPort 32b of the PiFET transistor 302 relates to PiPort 32c in FIG. 3c. The reference numbers cross relate the transistor schematic to the physical layout. Likewise, these reference numerals also cross reference to the 3-dimensional sketch of FIG. 3d and the cross section AA view of FIG. 3e. This set of CiFET FIGS. 3a through 3e and their cross-reference relationship is a reflection of the prior art 2-finger inverter of FIGS. 1i to 1m.

Figure 1M:
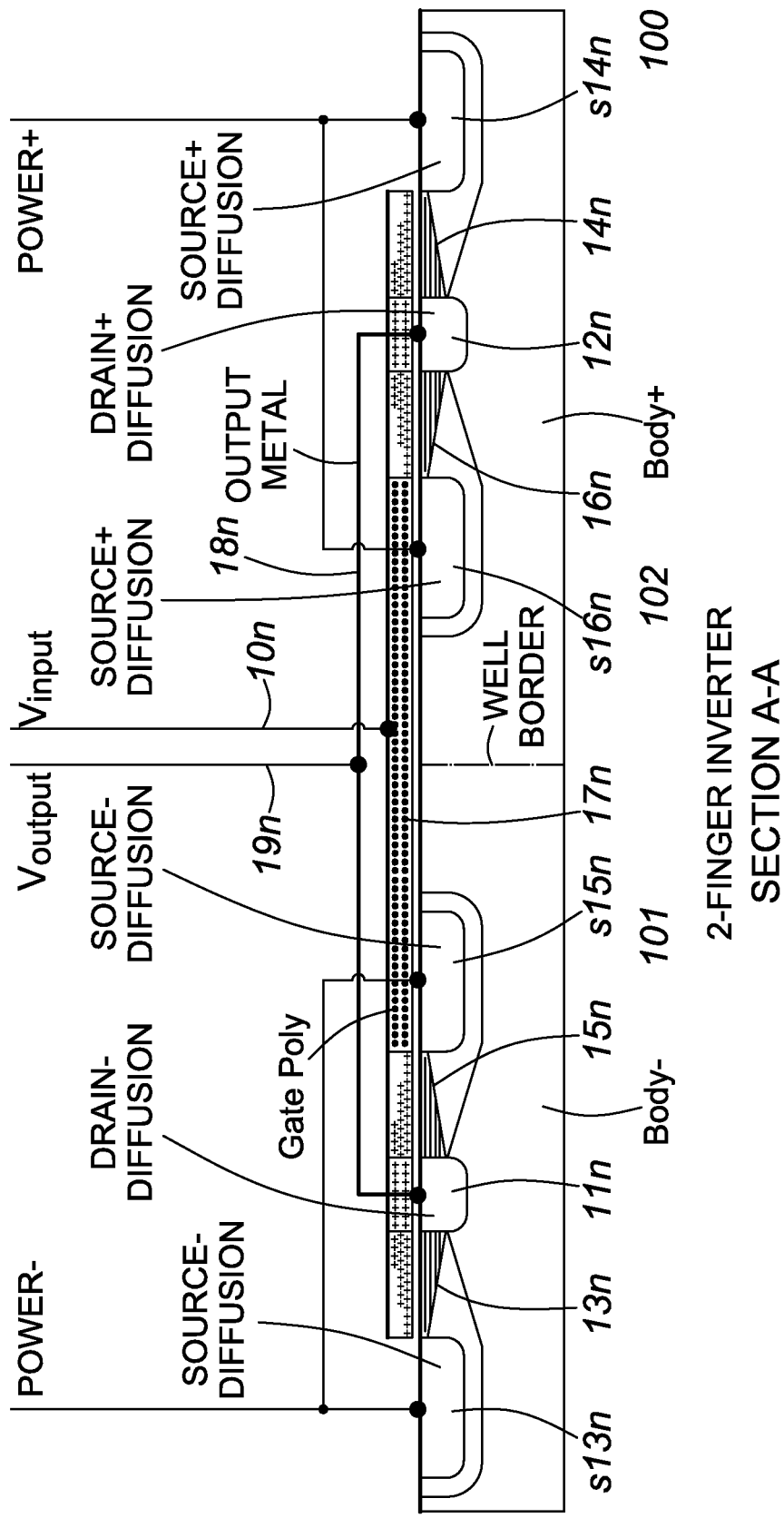
FIG. 1m shows cross-sectional view at Section AA shown in FIG. 1L.
Figure 1N:
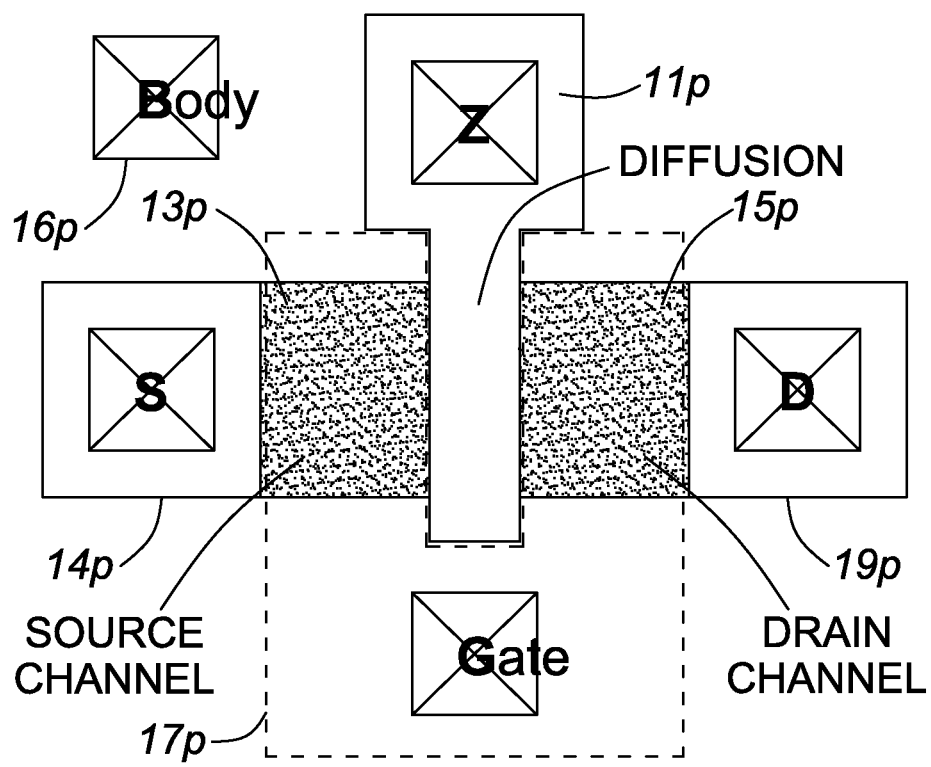
FIG. 1n shows a physical layout of a prior art split channel MOS transistor.
Figure 1O:
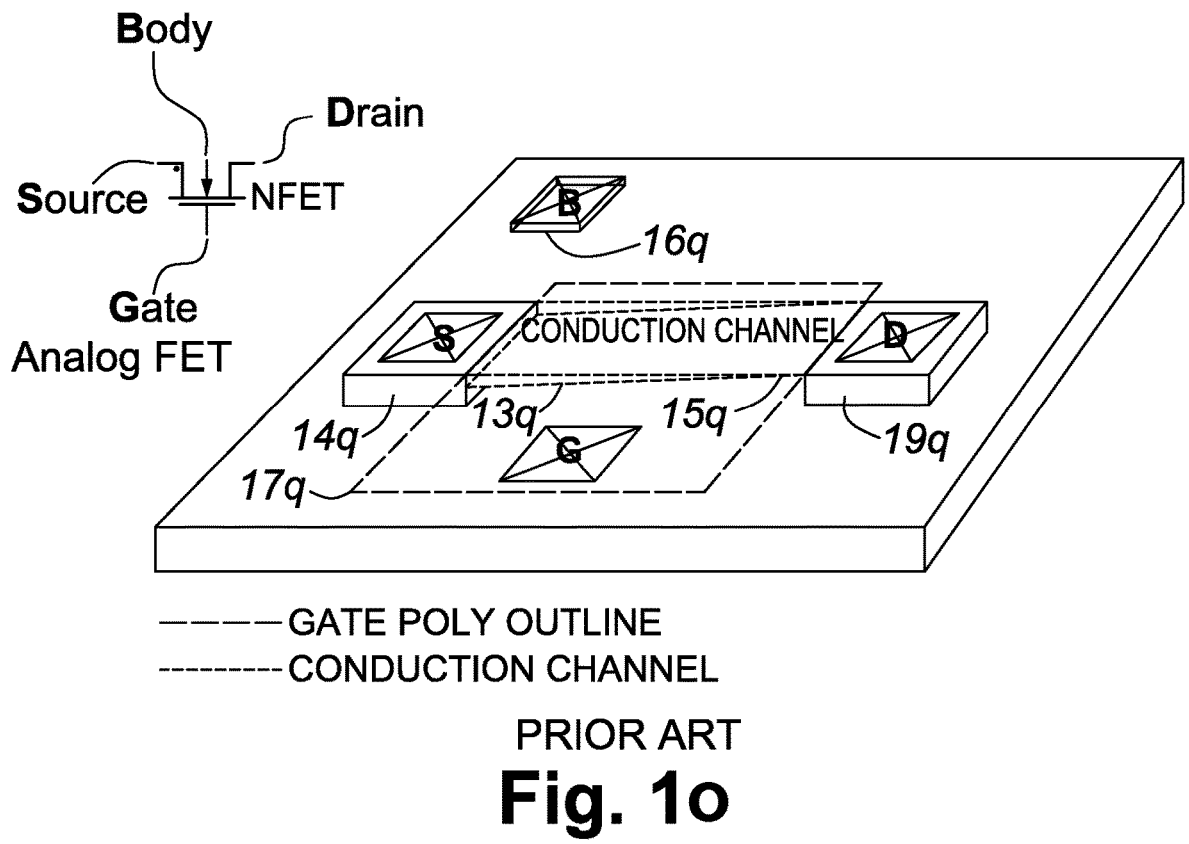
FIG. 1o shows a three (3) dimensional perspective view of a prior art linear MOS field-effect transistor.

Essentially, the two pairs of opposite diffusion type transistors 101 and 102 in the inverter device structure 100 FIG. 1L, and again in FIG. 1m, are each connected in parallel: 13m in parallel with 15m as well as 14m in parallel with 16m for the 2-finger inverter 100. These two pairs of parallel transistors are also connected to the output terminal 19*m* with the cross-hatched metal connection 18*m*, or equivalently shaded portion 18*k* in FIG. 1*k* or 18*n* bold wire in FIG. 1*m*.

These same two pairs of transistors 33*d*, 35*d* (or 33*e*, 35*e*) and 34*d*, 36*d* (34*e*, 36*e*) are connected in series in FIGS. 3*d* and 3*e* in order to form their respective iFET device structures 301 and 302 thus forming the CiFET device structure 300 with their respective iPort control terminals Ni, Pi access using the intermediate diffusions 31*d*, 32*d*. Just a metal mask modification from the connections 18*k*, 18*m*, 18*n* in FIGS. 1*k*, 1L, 1*m* to the connections 38*d*, 38*e* in FIGS. 3*d* and 3*e*, respectively, yields unprecedented analog performance as is presented in the remaining figures of this present invention. Thus CiFET designs are completely compatible, and portable, to any IC process of which all possess their most fundamental logic inverter; while being a radical improvement from the state of the art in high gain, high precision, and small scale primitive analog building blocks. The complementary pairs of iFETs are built entirely from logic components, without analog extensions, while enabling scaling and portability. Both the footprint and the power consumption per gain/bandwidth are drastically reduced from the present state of the art, while retaining superior noise performance.

Referring to FIG. 3*a*, the complementary pair of iFETs (or CiFET) 300 comprises P-type iFET (or PiFET) 302 and N-type iFET (or NiFET) 301, comprising input terminal 30*a* connected to both the gate control terminal of PiFET 302 and the gate control terminal of NiFET 301, function as the common gate terminal 30*a*. CiFET 300 receives power, Power+ (or positive supply voltage) and Power− (or negative supply voltage), where Power− is connected to the source terminal of NiFET 301 and Power+ is connected to the source terminal of PiFET 302. Each of PiFET 302 and NiFET 301 comprises iPort control terminal (31*a* and 32*a*) for receiving injection current. The drain terminal of PiFET 302 and NiFET 301 are combined to provide output 39*a*.

Referring to FIG. 3*d* (or FIGS. 3*c*, 3*e*), the CiFET 300 comprising PiFET 302 and NiFET 301, laid out on the substrate (or body B+ and B− respectively) like a mirror image along well border shown therein. PiFET 302 comprises source terminal S+ s34*d* (or s34*c*, s34*e*), drain terminal D+ d36*d* (or d36*c*, d36*e*), and iPort control terminal Pi, defining source+channel 34*d* (or 34*c*, 34*e*) Between the source terminal S+ and the iPort control terminal Pi diffusion region 32*d* (or 32*c*, 32*e*, or 32*b* in FIG. 3*b*), and drain+channel 36*d* (or 36*c*, 36*e*) between the drain terminal D+ and the iPort control terminal Pi diffusion region 32*d* (or 32*c*, 32*e*, or 32*b* in FIG. 3*b*); NiFET 301 also comprises source terminal S− s33*d* (or s33*c*, s33*e*), drain terminal D− d35*d* (or d35*c*, d35*e*), and iPort control terminal Ni, defining source−channel 33*d* (or 33*c*, 33*e*) between source−terminal S− s33*d* (or s33*c*, s33*e*) and the iPort control terminal Ni diffusion region 31*d* (or 31*c*, 31*e*, or 31*b* in FIG. 3*b*), and drain−channel 35*d* (or 35*c*, 35*e*) between drain−terminal D− d35*d* (or d35*c*, d35*e*) and the iPort control terminal Ni diffusion region 31*d* (or 31*c*, 31*e*, or 31*b* in FIG. 3*b*). CiFET 300 further comprises a common gate terminal 30*d* (or 30*c*, 30*e*, or 30*b* in FIG. 3*b*) over source+channel 34*d* (or 34*c*, 34*e*), drain+channel 36*d* (or 36*c*, 36*e*), source−channel 33*d* (or 33*c*, 33*e*), and drain−channel 35*d* (or 35*c*, 35*e*). Accordingly, the common gate terminal 30*d* (or 30*a*, 30*b*, 30*c*, 30*e*) is electrically coupled to the iPort control terminals Pi and Ni.

In many analog circuits, biasing is a problem. Using iFETs in complementary pairs 301 and 302 as shown in FIG. 3*d* allows them to "self-bias" when the drain output 39*d* (or 39*a*, 39*b*, 39*c*, 39*e*) is connected to the gate input 30*d* (or 30*a*, 30*b*, 30*c*, 30*e*), thus eliminating drift problems and additionally, the amplifier finds the maximum gain point on its operating curve. This self-bias connection is illustrated in FIGS. 3*f* and 3*g* as 38*f*, 38*g* and also in FIG. 3L as "Bias" for an analog zero reference.

In the "Behavioral Model" of CiFET of the present invention as shown in FIG. 3*f*, the currents $I_{inj}$ at the iPort control terminals 31*f* and 32*f* are converted to a voltage by trans-resistance ($r^m$), whose value determines the gain. This "trans-resistance" ($r_m$) is established by the ratio of the "drain channel" to "source channel" conductance, and remains constant throughout the entire operational range. Simulation has shown this resistance ($r_m$) to typically be in the range of 100,000Ω, set by the relative channel sizing. $r_m$ in Ω is the dual of $g_m$ (1/Ω).

The output $V_{output}$ 39*f* is a low-impedance source follower that can deliver its voltage with all the necessary current to drive the next circuit and any capacitive loading in between. The common gate input terminals 30*f*/30*g* represent the common gate input terminals 30*a*/30*b*/30*c*/30*d*/30*e* of their previous related FIGS. 3*a*/3*b*/3*c*/3*d*/3*e*. The CiFET structurally differs only in the output 39*a*/39*b*/39*c*/39*d*/39*e* metal connection 38*c*/38*d*/38*e* from that of the two finger inverter of FIGS. 1*i*/1*j*/1*k*/1L/1*m* output 19*i*/19*j*/19*k*/19*m*/19*n* metal hookup 18*k*/18*m*/18*n*. The CiFET is only a metal connection difference from the two-finger inverter, and can be further optimized by adjusting the individual transistor conductance for the intended CiFET purpose. Only a couple of optimizations are required for most purposes.

The input is a constant low resistance termination (related to $r_m$ but much lower) with a constant offset voltage of about 100 mv from the respective power supply rail. This offset voltage is a PTAT/CTAT "bandgap" reference, established by the ratio of the "drain channel" to "source channel" conductance.

A standard CiFET compound device cell can be physically constructed and used like a logic cell for designing analog. Normally this is the only active circuit component needed for analog circuits. Like a transistor, but the CiFET cell does everything needed for an active component.

Now, referring to FIG. 3*g*, $V_{input}$ 30*g* is connected to the gate terminals of NiFET and PiFET. Positive power voltage (Power+) is connected the source terminal of PiFET, while negative power voltage (Power−) is connected to the source terminal of NiFET. NiFET provides the channel 33*g* and PiFET provides the channel 34*g*. NiFET further comprises NiPort 31*g*; while PiFET comprises PiPort 32*g*. Drain terminals of NiFET and PiFET are connected together to form $V_{output}$ 39*g*. Self-Bias path 38*g* is provided from $V_{output}$ 39*g* to $V_{input}$ 30*g* for repeatability.

How then is the proper bias voltage produced? The simplest way of generating the bias voltage is to use iFETs in complementary pairs 301 and 302, creating an inverting device 300 as shown in FIGS. 3*d* and 3L, and then using the output 39*d* to provide negative feedback "Bias" connection in FIG. 3L to the input 30*d*. The CiFET as a compound device will "self-bias" at a point approximately midway between the power supplies, where the gain is maximized and the speed or slew rate is symmetrically poised for its most rapid changes. At this self-bias voltage point, the current through all of the complementary iFET channels 33*d*, 35*d*, 36*d*, 34*d* is exactly the same current, thus equal. There is no other DC current path for the PiFET 302 drain d36*d* to go through except into the NiFET 301 drain d35*d*, and thus a specific set of gate to channel voltages within the CiFET conduction channels are established for this equality of currents (or conductivity). Also since both iFETs 301 and 302 have the same current, the pull-up ability is exactly equal to the pull-down ability, which defines the maximum slew rate bias point.

Since the complementary pair 300 of iFETs 301 and 302 is self-biased, any parametric factors are auto-compensated for changes in operating environment. Because of inherent matching between adjacent parts on an IC, the bias generator can be used to bias other iFETs nearby. The real-time self-biasing circuit corrects for parametric changes (in various forms).

Each of the transistors in an inverter of the present invention acts as a "dynamic" load for its complement, allowing the gate voltage to be significantly higher than the traditional bias point of an analog circuit gate. With the complementary iFET compound device's higher than normal gate voltage, the source and drain conduction channels are deep, yielding lower noise.

The dominant noise source in a traditional analog circuit is primarily related to the "pinch-off" region near the drain 19g of the conduction channel 15g illustrated in FIG. 1g. The length of this pinch-off region is effected by the magnitude of the drain to source voltage. Biasing the Drain 19g, 29b FIGS. 1g, 2b (or output) at the same voltage as the gate 17g, 27b (zero differential) causes the drain conduction channel to avoid the channel pinch-off (shallow channel) phenomena usually encountered in analog circuits. Another way of stating this is: a transistor gets noisier as the drain approaches its design maximum voltage, the self-biased inverter operates its transistors at half the design maximum voltage and the gate is at the same voltage as the drain (zero differential), therefore the self-biased inverter is much quieter. With lower drain voltage, the ionized conduction channel carriers diffused down away from the surface carrier traps which are just below their gate.

The operation of the CiFET amplifier differs from the operation of a conventional analog amplifier, with its current mirror loads, in that:

The "Source" channel, as illustrated in the individual iFET FIG. 2b, has an extremely small (~100 mv) voltage from source terminal 24b to iPort control terminal 21b while the gate terminal 27b is at ~½ Vsupply when complementary diffusion type iFETS 301, 302 are combined into a single CiFET device structure 300 FIG. 3d. This puts the iFET Source channel 23b, 33d, 34d into "Super-Saturation" 28b, a condition similar to weak-inversion 18e FIG. 1e but with high gate overdrive. Gate overdrive results in an unusually thick conduction layer 23b and along with a low source 24b to iPort 21b voltage resulting in that conduction layer 23b remaining thick and deep all the way along the channel. Notice the differences in the thickness between the weak-inversion 18e conduction channel 13e in FIG. 1e and the super-saturated 28b conduction channel 23b in FIG. 2b. This thick channel difference is why the iFET operates so well. It takes the desired exponential property of the conduction channel found in weak-inversion 18e and fixes its high resistance limitation to a very low resistance conduction channel, with the same exponential properties—a long wished for FET transistor performance metric.

The "Drain" channel 25b operates with its' Drain terminal 29b at ~½ Vmax, greatly reducing the pinch-off (and DIBBL) effect. This reduced pinch-off condition is further enhanced by the fact that the "Gate terminal" 27b is operated at ~½ Vsupply (same as ½ Vmax), meaning no potential difference between the Drain 29b and the Gate 27b. Notice the difference in the thickness between the drain conduction channel 15g in FIG. 1g and that of 25b in FIG. 2b.

Another important aspect of the iFET and CiFET compound device is its constant voltage low impedance current input 20b FIG. 2b that frees it from the speed robing effects of parasitic capacitance. With current input, the input voltage remains nearly constant, thus parasitic capacitance has little effect on input signal level changes.

This subtle but significant difference is one of the enabling features that makes weak-inversion like exponential response work and gives the complementary iFET amplifier its linear response, superior low noise, wider dynamic range, and speed advantages.

MOSFETs do not make particularly good amplifiers compared to equivalent bipolar circuits. They have limited gain, they are noisy, and their high impedance makes them slow. Process parameters are also soft, so that matching a differential input is difficult, unlike bipolar. Bipolar Diff-Amps are developed to the point where the input offset is pretty good, but the move to CMOS never really delivered as good a solution.

It has long been known that superior gain and wide dynamic range performance can be obtained from CMOS operated in weak-inversion. But complications arising from high impedance, due to impractically low currents and high output resistance, preclude taking advantage of the superior gain (equivalent to that of bipolar transistors), dynamic range (exceeding that of bipolar transistors), and logarithmic performance (allowing numerous decades of amplification) that are characteristic of weak-inversion. However, the CiFET conduction channels circumvent these high-impedance limitations of weak-inversion due to the CiFET's deep conduction channels 33d, 36d, 33e, 36e FIGS. 3d, 3e respectively. The CiFET is a low-impedance device that also incorporates the noise benefits of majority carriers in a deep channel found in junction-FETs to the MOSFET. Improved signal to noise ratios are essential for analog system operation with sub 1 volt power supplies of ultra-deep sub-μm IC systems. When signals are reduced, the noise must at least be proportionally reduced to maintain the signal to ratio. System performance is all about s/n ratio in the end.

While a MOSFET in weak-inversion, working into a current source load, delivers a logarithmic transfer function, the same MOSFET working into an anti-log load cancels the logarithmic nonlinearity, yielding a precisely linear transfer function. The CiFET amplifier is such a circuit, i.e.: log input, antilog load, yielding perfectly linear, wide dynamic range, low noise, and high speed performance. The low noise is a consequence of the biasing, where the source channel gate potential is unusually high and the potential across the source channel itself is maintained at near zero volts while the voltage across the drain channel is minimized. The drain channel is a level shifter, maintaining a very low voltage on the source channel while delivering high amplitude signal swings at the output with all the output drive to charge any capacitive load. The CiFET is a trans-impedance amplifier FIGS. 2g through 2j and 3f, which is a low-impedance device. The prior art trans-conductance amplifiers FIG. 2f are high-impedance devices. Low-impedance devices generally have low noise, while high-impedance devices have high noise.

A 3-stage CiFET voltage amplifier delivers an open loop voltage gain of >1 million or $10^6$ which is 120 db and equivalent to 20 bits of digital accuracy, while still maintaining unity gain closed loop stability over its multi-GHz bandwidth. At power supply voltages below 1 volt gains can easily be around 100 million or $10^8$ which is 160 db and equivalent to 27 bits of digital accuracy, while still maintaining unity gain closed-loop stability over its GHz bandwidth, which is obviously limited by the noise floor. It is all about signal to noise. Gain increases as power supply voltage is dropped well below a volt. At a power supply voltage of only 10 millivolts, CiFET current input amplifiers operate with 10 db gain and closed-loop bandwidth over 1 KHz, and can operate at power supply voltages as low as 1.0 millivolt with reasonable performance. Clearly, the CiFET amplifiers are not slaved to the threshold voltage stacking that prior art amplifiers are.

Taking Advantage of the Doping Profile and Ratioing:

Traditionally engineers have avoided using digital logic in an analog configuration because it was believed to be unacceptably nonlinear and was difficult to bias and impossible to stabilize. Digital logic also sacrifices drive symmetry for compactness. Restoring the symmetry through proper device ratioing (~3:1 p:n width to ~4:1 on smaller IC processes) improves linearity, increases noise immunity, and maximizes dynamic range. Self-biasing solves the bias problem.

Noise figures can be particularly optimized on front end amplifiers through proper ratioing. The iFET's electrical characteristics can be enhanced by modifying the combined and relative conductance of the source and drain channels, without modifying the available IC process (without analog extensions). When all the transistors must be the same size as in the newest IC processes, multiple transistors can be wired together to achieve the desired iFET rationing, as course resolution works fine. There are several approaches to realizing this optimization (adjusting length, width, and threshold among others).

Nearly any source and drain channel size will make a functional iFET, but varying the individual iFET channel size, both relative and cumulative, increases the iFET performance depending on the objective.

Fundamentally:
Lower iPort input impedance is obtained via a lower source channel current density (wider source channel) as compared to the drain channel.

Higher output voltage gain is obtained via higher source channel current density (narrower source channel) as compared to the drain channel.

Proportionally sizing the CiFET channel interrelationships optimizes various performance metrics. Gain and symmetry are maximized when the P-channel iFET conductance to N-channel iFET conductance is equalized, thus balancing the CiFET complementary conductance. Equalizing conductance adjusts the self-bias voltage near the midpoint of the power supply voltage. This provides a symmetrical dynamic analog signal range and serves a convenient analog ground or zero reference, permitting "four quadrant" mathematical operations. Experience with deep sub-μm IC processes place the P-channel iFET to be around 3 to 4 times wider than N-channel iFET, as fixed by length or width ratios of the iFET channels.

The CiFET performance is minimally affected by ambient and IC process parameter variation because of self-biasing to an optimum mid-point, regardless of conditions.

The power verses speed tradeoff is controlled by the cumulative sum of all of the channel conductances used to set the idle current through the complementary iFET amplifier. This establishes the output slew rate (or output drive capability).

Care must be exercised so as to not exceed both DC and transient current limitations of the biased CiFET structure. Current rating for the contacts and metal widths must be considered in determining the self-bias current and physical layout care must be considered so as to not be prone to premature failure. Local heating should also be considered.

Since any logic inverter would work, it is not necessary to even make this optimization, but it is a performance booster.

To be clear, the conductance of the iFET channels are a function of the individual channel width and lengths, as well as their thresholds and doping profiles. Each of the iFET channels can have individually selected sizes and/or threshold relationships to the other related channels.

While iFET amplifiers can be constructed with minimum sized devices which do provide ample current at the output for very fast response and high accuracy, as stated above, care must be exercised so that the complementary iFET amplifier does not pass too much current, subjecting it to mechanical failure. The physical layout requires enough contacts and metal for the required DC and transient currents.

Performance Description:

FIGS. 3h to 3s exemplify performance of the CiFET device structure.

FIG. 3h is a transfer function plot of the CiFET device over an extreme range of ±1 pico-amp to ±5 micro-amps of input current into either iPort, yielding a ±100 nano-volt to ±500 milli-volt output on the vertical scale. In order to cover the range, both axis are log scale.

The CiFET is ratioed to provide a $r_m$ gain of 100K;
Gain remains constant over the entire range;
Transfer function is precisely linear;
Plus and minus precisely overlay each other;
Either iPort input/output precisely overlays the other;
Input current can be zero;
Output voltage swings around the midscale AC zero reference voltage, FIG. 3i shows how the iFET channel conductance ratio defines the trans-resistance (also known as trans-impedance indicating the same AC relationship) $r_m$ to set the CiFET device gain in which input current producing an output voltage. The iFET Ratio is along the horizontal axis as the ratio of width/length of the source channel divided by the width/length of the drain channel. The gain factor or trans-resistance is the right vertical axis in the units of Ωs using a log scale to cover the 3 decade range of values from about 1 KΩ to 1 megΩ.

Also note that the iPort input resistance on the left vertical scale of the graph shown in FIG. 3i provides a precisely overlaying plot with a reduced set of values by the ratio shown on the following FIG. 3j, which is related to the peak voltage gain of the CiFET device. In other words, $R_{in}$ times the CiFET voltage gain yields the trans-resistance $r_m$.

The following FIG. 3k of this CiFET property set plots the iPort termination voltage over the same iFET ratio on the horizontal scale. Again, the complementary iPorts overlay each other. The scales are aligned with a match of the CiFET ratios. In reality, the N channel iPort termination voltage is a PTAT bandgap reference which has its voltage set by the iFET channel ratio relationship. The p Channel iPort is a precise complement CTAT bandgap voltage reference. When these two voltage references are added the temperature effect of the PTAT cancels the temperature dependence of the CTAT yielding temperature independent reference. Their slope offsets can be matched by the matching if the CiFET ratios and also be fine-tuned with a trim current injected into either iPort input.

FIG. 3L is the transistor schematic of the CiFET used to generate these PTAT and CTAT bandgap references. The NiFET Q31L provides the PTAT reference on its iPort 31L and the PiFET Q32L provides the CTAT reference on its iPort 32L. This CiFET device also provides the analog zero bias reference on its output 30L.

The precise linearity of the temperature relationship over an extremely wide temperature range of −150 to +250 degrees Centigrade is plotted in FIG. 3m. Note the total linearity. The negative or CTAT output on the PiPort overlays the CTAT when the sign is inverted. This graph suggests the usefulness in measuring temperature over extended temperature limits. The temperature sensitivity is set by the iFET ratio selection shown in FIG. 3k. A CiFET device can be tethered on a 3 wire line to sense temperature in hostile environments. This works well because the impedance of the CiFET tethered on the line would be low to minimize noise pickup.

Figure 3U:
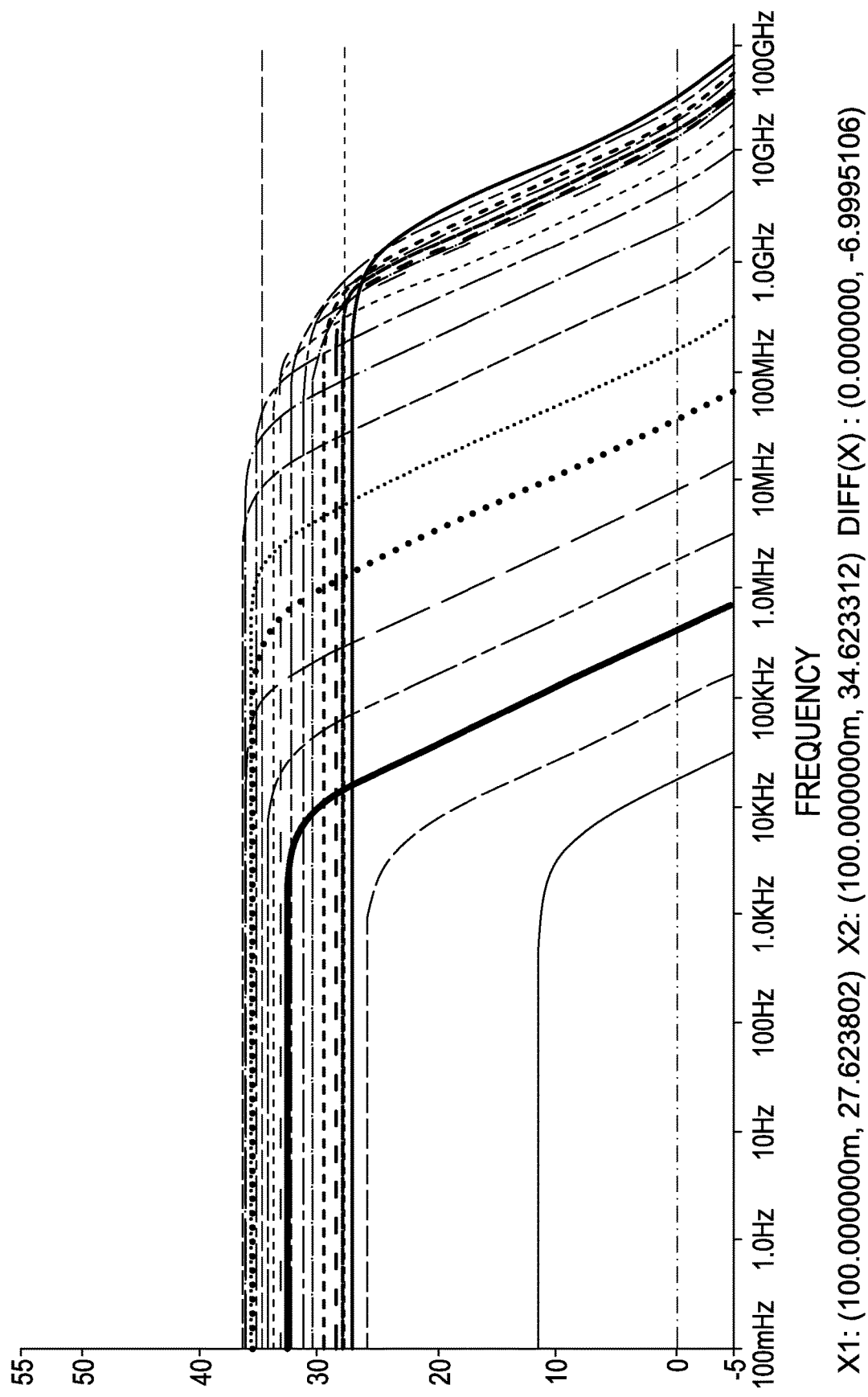
Figure 3V:
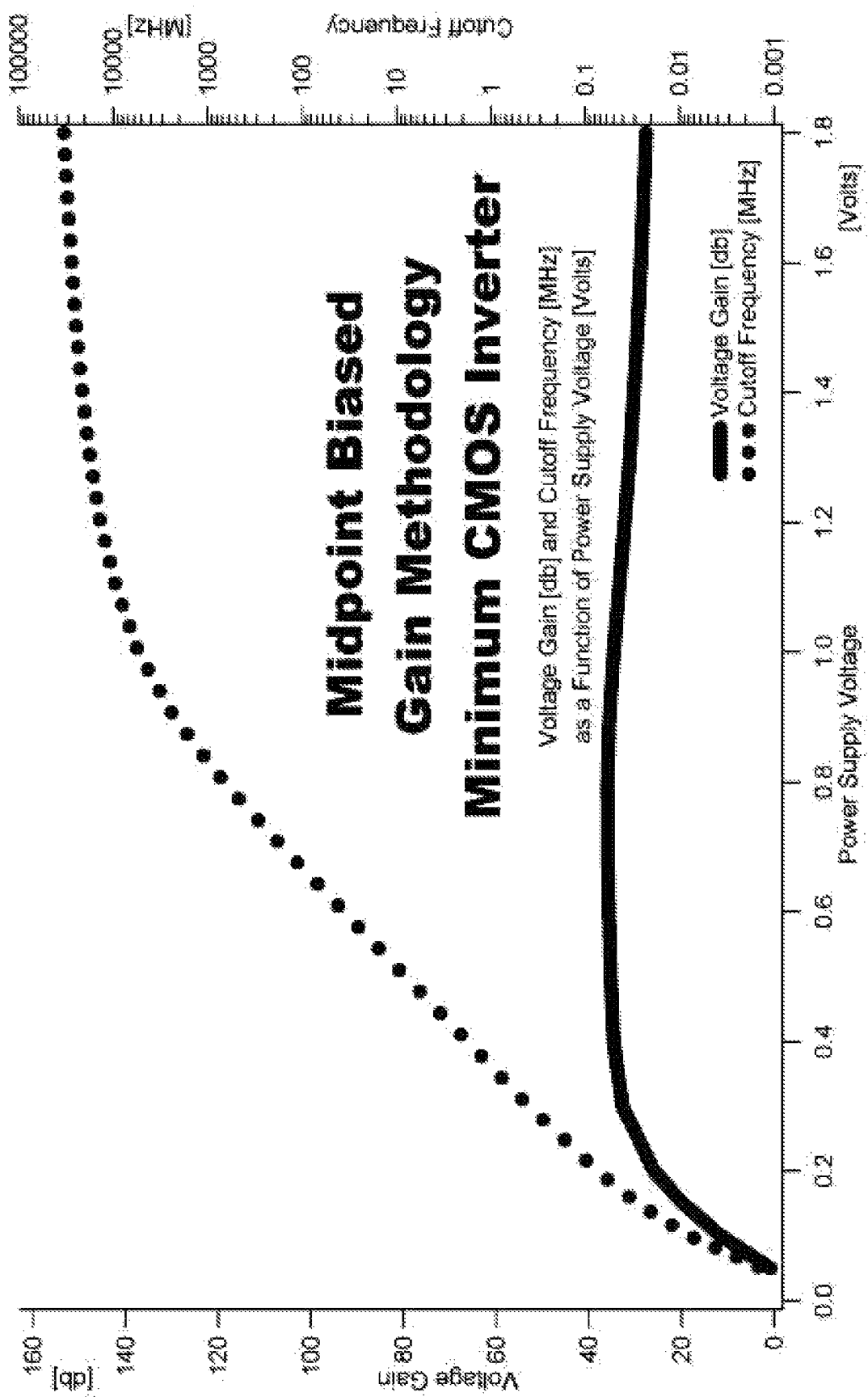

The AC gain and phase performance of the CiFET device is illustrated by a standardized Bode plot in FIG. 3n for a 75Ω iPort input resistance CiFET device, and in FIG. 3q for a 35KΩ CiFET device, with the Bode plot for a minimum sized CMOS 2-finger inverter of FIG. 1i in FIG. 3u and the reference CMOS amplifier of FIG. 1a Bode plot in FIG. 1b for comparison of all device AC properties. All Bode plot scales are the same, frequency from 0.1 Hz to 1.0 THz is the horizontal frequency axis using a log scale, gain is in dB on the vertical scale along with phase in degrees. Both gain and phase scales were set to the same set of numbers of 0 d to 180 d. The gain is the thick black line with dashed crosshairs at the 3 db roll-off point and dotted cross-hairs at the gain cutoff frequency to provide the phase-margin on the phase trace shown as large grey square dots. There are several horizontal lines to identify gain and phase shifts. The upper dot-dash horizontal line is for a 45 degree phase shift form DC which is used to target the 3 db gain roll-off point with the dashed cross-hairs. The next grey dashed reference level is at 90 degrees followed by the dot-dot-dash line at 30 degrees to indicate a minimum acceptable phase-margin. The lower reference line is indicated by small square dots overlaying a thinner solid line to indicate the zero crossover of both gain and phase. This helps compare these three Bode plots to each other.

Following these three Bode plots are three plots FIGS. 3o, 3r, 3u of the change in voltage gain over power supply voltage so that this property can be compared to the CMOS amplifier of FIG. 1a with its comparison plot in FIG. 1c. These four plots show the voltage gain as the power supply voltage is decreased in −100 milli-volt steps. The full power supply voltage for the standardized 180 nm CMOS process is 1.8 volts and is shown as a solid thick black line which is the widest bandwidth in all example plots. Form this thick black trace, the power supply steps down by a tenth of a volt in the next 7 various dot-dash combination grey traces to the thick dashed plot at a power supply of 1.0 volts. The next solid grey traces are steps from 0.9 to 0.6 volts on the power supply, followed by thin dotted traces going from 0.5 volts to 0.1 volts on the power supply. These plots show that the gain for these circuits actually goes up as power supply is reduced, with the exception of the prior art CMOS amplifier of FIGS. 1a, 1c which falls off the cliff as power supply voltage is reduced. The thin dotted cross-hair lines are on the gain at full power supply voltage and the dashed cross-hair lines is for the 1.0 volt power supply voltage.

To make this set of plots easier to comprehend, additional graphs follow each plot in FIGS. 1d, 2q, 3s, 3v. These graphs relate gain and cutoff frequency to the power supply reduction. All plots have the same scales and axis variables. It can be clearly seen that the gain increases as power supply voltage is reduced. The speed or bandwidth penalty can be easily visualized with these plots. Typically bandwidth holds acceptably down to about 0.8 volts of power while gain significantly increases steadily as the power voltage is dropped down to below to about a half a volt. This is because the channels use a higher percentage of weak-inversion like diffusion current as power supply voltage is forced down. It should also be noted that the inverter also increases gain as power is reduced, for the same forced exponential mode operation point of the channels.

FIG. 3p shows voltage gain and cutoff frequency as a function of power supply voltage for 75 ohm iPort CiFET device.

It has been observed in FIG. 2b that the source channel 23b operates in a "Super-Saturated" mode 28b which possess exponential properties similar to weak-inversion or bipolar Beta. This mode of operation is not limited through the conventional FET threshold voltage, but rather functions with higher gain as the voltages are forced well below the conventional threshold voltage. This is because the channels are being pushed well down into their diffusion mode of operation. Here a charge injection provides additional carriers in the channel which enables an increase in current flow through the channel. This bodes well with FET transistors because field effect transistors are fundamentally charge controlled devices.

This increase in gain with diminishing power supply voltage boosts weak-inversion like operation, where the charge-transport mechanism produces a higher exponential-class of gain. This is also demonstrated with the conventional CMOS inverter of FIG. 1i as shown by the standard AC performance plots of FIGS. 3t to 3v. Thus there is a methodology of obtaining higher gain with lower power supplies that, when recognized, is an alternative to analog circuits being threshold voltage limited. This completely solves the reduced voltage problem that prior art analog circuits battle in the newer IC processes.

Noise Advantages:

In the end, it comes down to signal-to-noise ratio. Low power supply voltage requirements in ultra-deep-sub-μm IC processes limit the maximum signal swing to a much smaller number than most analog designers are used to. So with a smaller signal, the noise must be equally small in order to maintain the desired signal to noise ratio. It is imperative that noise issues be reduced. This iFET amplifier technology not only reduces noise by an amount as would be necessary, but performs far beyond expectations, delivering ultra-quiet front ends.

1/f noise in the source channel is reduced because the self-bias scheme provides a high field strength on the source channel's gate, forcing carriers in the channel to operate below the surface where there is a smoother path (fewer obstructions) than along the surface where crystal lattice defects interfere.

1/f noise in the drain channel is also low. Unlike conventional analog designs, the gate is self-biased at the half-way point between the power supply rails as is the drain, while the iPort is within ~100 millivolts of the power rail. With the high electric field along the drain channel, and the gate voltage equal to the drain terminal voltage, the carriers are constrained to flow mostly below the channel surface. This keeps the drain channel out of pinched off conditions, where unwanted 1/f noise would be generated.

Resistance noise is minimized because the self-bias configuration puts the complementary pair at its lowest channel resistance operating point. Resistance noise is caused by collisions, between carriers and the surrounding atoms in the conductor. The lower the resistance is, the fewer the collisions.

Wide band noise (white-noise) would always be an issue in high gain for high frequency circuits. While conventional designs adjust the gate voltage to establish suitable operating point(s), the designs of the present invention establish the gate voltage at the optimum point (the "sweet-spot") and then adjust the load to establish the desired operating point. This approach establishes a higher quiescent current where (for reasons explained above) higher current density circuits have lower wide band noise.

High common mode power supply rejection is inherent in the complementary iFET device structure of the present invention. Signals are with respect to the mid-point instead of being with respect to one of the power supply rails, similar to an op-amp with its "virtual" ground. Power supply noise is from one rail to the other, equal and opposite in phase with respect to each other; thus canceling around the mid-point.

Ground-Loop noise is diminished because the circuit ground is "virtual" (just like in many op-amp circuits), rather than ground being one or the other power supply connections where ground or power noise is conducted into the analog signal path. . . . In the closed-loop case, "Flying Capacitors" are often employed. With "flying capacitors" there is no direct electrical connection between stages, so there is no common ground; virtual or otherwise. The use of "differential decoupling" (flying capacitors) offers transformer like isolation between stages, with the compactness of integrated circuit elements.

Coupled noise from "parasitic induced crosstalk" increases by the square of the signal amplitude. Unintended capacitive coupling into a 1 volt signal causes a lot more trouble than with a 100 mV signal, by a factor of 100:1 (square law effect). The small low impedance charge or voltage signals employed in the analog sections, reduce this capacitive coupled interference substantially. Nearby Digital signals will, by definition, be high amplitude (rail-to-rail). Good layout practices are still the best defense against this digital source of noise.

Additional Advantages:

There are a number of additional advantages. For example, bi-directional control on the iPort means that current can flow in-to as well as out of this connection; both directions having a significant and symmetrical control effect on overall channel current. Also, a zero current imposed in the iPort is a valid zero input signal, thus the iPort signals are truly bidirectional about zero. The iPort has about five (5) orders of magnitude more dynamic control range than the gate.

When the low impedance iPort is used to measure an analog Signal, the input impedance may diminish the input voltage, but the energy transfer into the iPort amplifier is high, especially for low impedance sources such as matching an antenna, transmission line, or many biological signal sources.

When a high-impedance analog amplifier is necessary, the gate is sued for the input and the amplifier can contain multiple stages for high voltage gain, while the CiFET can stabilize such an amplifier.

In the CiFET device there are two iPort input signals that precisely sum, thus this structure is an analog adder and can combine the two inputs at RF frequencies to form a RF mixer using a single CiFET device.

The iFET of the present invention yields an analog structure that is significantly faster than logic using the same MOS devices. This speed improvement is due to the fact that the complementary structure expresses its maximum gain (and highest quiescent current) at its natural self-bias point, midway between the power supplies.

Since the iPort voltage does not significantly change, it is immune to the R/C time constant effects of the surrounding parasitics, thus the iPort (current) input responds faster than the gate (voltage) input.

When used as a data bus sense amplifier on a RAM, the iPort's low impedance rapidly senses minute charge transfer without moving the data bus voltage significantly. Since the iPort input impedance is low, and the iPort is terminated with a fixed low voltage, this sense amplifier approach eliminates the need for pre-charging in the memory readout cycle. Since the iFET operates at better than logic speed, IFET for sensing charge would decrease the readout time impressively.

Since, in most applications of the CiFET compound device structure of the present invention, the output voltage (drain connection point) does not vary greatly, and thus making the output immune to the R/C time constant effects of the surrounding parasitics. A logic signal is slower than analog here because logic signals have to swing from rail to rail.

Drain-induced barrier lowering or (DIBL) threshold reduction is avoided in the CiFET compound device operating in the analog mode. When gain and threshold voltage is important, the drains are operating around half of the power supply voltage, thus eliminating the higher drain voltages where DIBL effects are prevalent.

Definitions of Terms iFET: A 4 terminal (plus body) device similar to a Field Effect Transistor but with an additional control connection that causes the device to respond to current input stimulus.

source channel: A semiconductor region between iPort diffusion and the Source diffusion. Conduction in this region is enabled by an appropriate voltage on the Gate.

drain channel: A semiconductor region between Drain diffusion and the iPort diffusion. Conduction in this region is enabled by an appropriate voltage on the Gate.

CiInv: A single stage, complementary iFET compound device shown in FIG. 3a.

super-saturation: an exponential conduction condition similar to weak-inversion, but with high Gate overdrive and forced low voltage along the conduction channel. FIG. 2d #20.

feed-forward: A technique to present a signal on an output, early on, in anticipation of the ultimate value.

self-biased: Unlike fixed-bias circuits, self-biased circuits adjust to local conditions to establish an optimum operating point.

dual: (of a theorem, expression, etc.) related to another by the interchange of pairs of variables, such as current and voltage as in "trans-conductance" to "trans-resistance."

trans-resistance: infrequently referred to as mutual resistance, is the dual of trans-conductance. The term is a contraction of transfer resistance. It refers to the ratio between a change of the voltage at two output points and a related change of current through two input points, and is notated as $r_m$:

$$r_m = \frac{\Delta V_{out}}{\Delta I_{in}}$$

The SI unit for trans-resistance is simply the ohm, as in resistance.

For small signal alternating current, the definition is simpler:

trans-conductance is a property of certain electronic components. Conductance is the reciprocal of resistance; trans-conductance is the ratio of the current variation at the output to the voltage variation at the input. It is written as $g_m$. For direct current, trans-conductance is defined as follows:

$$g_m = \frac{\Delta I_{out}}{\Delta V_{in}}$$

For small signal alternating current, the definition is simpler:

$$g_m = \frac{i_{out}}{v_{in}}$$

Trans-conductance is a contraction of transfer conductance. The old unit of conductance, the mho (ohm spelled backwards), was replaced by the SI unit, the siemens, with the symbol S (1 siemens=1 ampere per volt).

translinear circuit: translinear circuit is a circuit that carries out its function using the translinear principle. These are current-mode circuits that can be made using transistors that obey an exponential current-voltage characteristic—this includes BITS and CMOS transistors in weak-inversion.

Sub-threshold conduction or sub-threshold leakage or sub-threshold drain current is the current between the source and drain of a MOSFET when the transistor is in sub-threshold region, or weak-inversion region, that is, for gate-to-source voltages below the threshold voltage. The terminology for various degrees of inversion is described in Tsividis. (Yannis Tsividis (1999). *Operation and Modeling of the MOS Transistor* (Second Edition ed.). New York: McGraw-Hill. p. 99. ISBN 0-07-065523-5.)

Sub-threshold slope: In the sub-threshold region the drain current behavior—though being controlled by the gate terminal—is similar to the exponentially increasing current of a forward biased diode. Therefore a plot of logarithmic drain current versus gate voltage with drain. source, and bulk voltages fixed will exhibit approximately log linear behavior in this MOSFET operating regime. Its slope is the sub-threshold slope.

Diffusion current: Diffusion current is a current in a semiconductor caused by the diffusion of charge carriers (holes and/or electrons). Diffusion current can be in the same or opposite direction of a drift current that is formed due to the electric field in the semiconductor. At equilibrium in a p-n junction, the forward diffusion current in the depletion region is balanced with a reverse drift current, so that the net current is zero. The diffusion current and drift current together are described by the drift-diffusion equation.

Drain-induced barrier lowering: Drain-induced barrier lowering or DIBL is a short-channel effect in MOSFETs referring originally to a reduction of threshold voltage of the transistor at higher drain voltages.

As channel length decreases, the barrier $\varphi_B$ to be surmounted by an electron from the source on its way to the drain reduces.

As channel length is reduced, the effects of DIBL in the sub-threshold region (weak-inversion) show up initially as a simple translation of the sub-threshold current vs. gate bias curve with change in drain-voltage, which can be modeled as a simple change in threshold voltage with drain bias. However, at shorter lengths the slope of the current vs. gate bias curve is reduced, that is, it requires a larger change in gate bias to effect the same change in drain current. At extremely short lengths, the gate entirely fails to turn the device off. These effects cannot be modeled as a threshold adjustment.

DIBL also affects the current vs. drain bias curve in the active mode, causing the current to increase with drain bias, lowering the MOSFET output resistance. This increase is additional to the normal channel length modulation effect on output resistance, and cannot always be modeled as a threshold adjustment (Drain-induced barrier lowering—https://en.wikipedia.org/wiki/Drain-induced_barrier_lowering).

Analogue Electronics
http://en.wikipedia.org/wiki/Analogue_electronics

What is claimed is:

1. A method for processing analog signals using a complementary current-injection field effect transistor (CiFET) as a voltage gain structure for converting voltage-in to voltage-out, comprising:
   a. providing the CiFET that comprises a complimentary pair of source-to-drain paths, a common gate port, a common drain port and first and second diffusion ports (iPorts), wherein each of the first and second iPorts separates the corresponding one of the source-to-drain paths into two channels in series, wherein the common gate port is connected to a gate for each of the pair of source-to-drain paths, and each of the gates is capacitively coupled to the two channels of the corresponding one of the pair of source-to-drain paths, and the common drain port is connected to the drains of the pair of source-to-drain paths;
   b. applying an input voltage to the common gate port;
   c. utilizing the voltage at the common drain port as the CiFET output.

2. The method as recited in claim 1 further comprising the step of applying an input current to one or both of the first and second iPorts.

3. A method for processing analog signals using a current-injection field effect transistor (iFET) as a current gain structure for converting current-in to current-out, comprising:
   a. providing the iFET that comprises a source-to-drain path, a gate port, a drain port and a diffusion port (iPort), wherein the iPort separates the source-to-drain path into two channels in series, wherein the gate port is connected to a gate for the source-to-drain path, and the gate is capacitively coupled to the two channels of the source-to-drain path, and the drain port is connected to the drain of the source-to-drain path;
   b. applying an input current to the iPort;
   c. utilizing the current flow at the drain port as the iFET output.

4. A method for processing analog signals using a current-injection field effect transistor (iFET) as a trans-conductance gain structure for converting voltage-in to current-out, comprising:
  a. providing the iFET that comprises a source-to-drain path, a gate port, a drain port and a diffusion port (iPort), wherein the iPort separates the source-to-drain path into two channels in series, wherein the gate port is connected to a gate for the source-to-drain path, and the gate is capacitively coupled to the two channels of the source-to-drain path, and the drain port is connected to the drain of the source-to-drain path;
  b. applying an input voltage to the gate port;
  c. utilizing the current flow at the drain port as the iFET output.

5. A method for processing analog signals using a complementary current-injection field effect transistor (CiFET) as a trans-resistance gain structure for converting current-in to voltage-out, comprising:
  a. providing the CiFET that comprises a complimentary pair of source-to-drain paths, a common gate port, a common drain port and first and second diffusion ports (iPorts), wherein each of the first and second iPorts separates the corresponding one of the source-to-drain paths into two channels in series, wherein the common gate port is connected to a gate for each of the pair of source-to-drain paths, and each of the gates is capacitively coupled to the two channels of the corresponding one of the pair of source-to-drain paths, and the common drain port is connected to the drains of the pair of source-to-drain paths;
  b. applying an input current to one or both of the first and second iPorts;
  c. utilizing the voltage at the common drain port as the CiFET output.

* * * * *